US007425749B2

(12) United States Patent
Hartzell et al.

(10) Patent No.: US 7,425,749 B2
(45) Date of Patent: Sep. 16, 2008

(54) MEMS PIXEL SENSOR

(75) Inventors: John Walter Hartzell, Camas, WA (US); Changqing Zhan, Vancouver, WA (US); Michael Barrett Wolfson, Somerville, MA (US)

(73) Assignee: Sharp Laboratories of America, Inc., Camas, WA (US)

( * ) Notice: Subject to any disclaimer, the term of this patent is extended or adjusted under 35 U.S.C. 154(b) by 150 days.

(21) Appl. No.: 11/516,473

(22) Filed: Sep. 6, 2006

(65) Prior Publication Data

US 2007/0023851 A1  Feb. 1, 2007

Related U.S. Application Data

(63) Continuation-in-part of application No. 11/058,501, filed on Feb. 14, 2005, now Pat. No. 7,230,306, which is a continuation of application No. 10/131,057, filed on Apr. 23, 2002, now Pat. No. 6,860,939, said application No. 11/516,473 is a continuation-in-part of application No. 11/031,320, filed on Jan. 5, 2005, now Pat. No. 7,253,488, and a continuation-in-part of application No. 10/131,318, filed on Apr. 23, 2002, now Pat. No. 7,125,451, and a continuation-in-part of application No. 10/131,006, filed on Apr. 23, 2002, now Pat. No. 7,128,783, and a continuation-in-part of application No. 10/131,549, filed on Apr. 23, 2002, now Pat. No. 7,156,916, and a continuation-in-part of application No. 10/131,808, filed on Apr. 23, 2002, now Pat. No. 7,135,070, and a continuation-in-part of application No. 10/131,551, filed on Apr. 23, 2002, now abandoned.

(60) Provisional application No. 60/720,223, filed on Sep. 23, 2005.

(51) Int. Cl.
*H01L 29/66* (2006.01)
*G01N 27/00* (2006.01)

(52) U.S. Cl. .................. 257/414; 257/415; 257/417; 257/418; 257/419; 257/E27.006; 349/199

(58) Field of Classification Search .............. 257/414, 257/528, 190, 415, 431, 369, 618, 417–419, 257/E27.006; 385/52, 49, 35, 88, 74, 92; 73/514.18, 24.01, 24.06; 422/88; 349/199
See application file for complete search history.

(56) References Cited

U.S. PATENT DOCUMENTS 5,143,854 A    9/1992  Pirrung et al. .............. 436/518
5,445,008 A *  8/1995  Wachter et al. ............ 73/24.06

(Continued)

OTHER PUBLICATIONS

Joao Gaspar, Haohua Li, Paulo Peieiro Freitas, "Integrated Magnetic Sensing of Electro-statically Actuated Thin-Film Microbridges", Journal of MicroElectroMechanical Systems, vol. 12, No. 5, Oct. 2003, p. 550-556.

*Primary Examiner*—Minh-Loan Tran
*Assistant Examiner*—William Harriston
(74) *Attorney, Agent, or Firm*—Law Office of Gerald Maliszewski; Gerald Maliszewski

(57) ABSTRACT

A MEMS pixel sensor is provided with a thin-film mechanical device having a mechanical body, with a mechanical state responsive to a proximate environment. A thin-film electronic device converts the mechanical state into electrical signals. A pixel interface supplies power to the electronic device and transceives electrical signals. The sensor is able to operate dynamically, in real-time. For example, if the mechanical device undergoes a sequence of mechanical states at a corresponding plurality of times, the electronic device is able to supply a sequence of electrical signals to the pixel interface that are responsive to the sequence of mechanical states, at the plurality of times. Each MEMS pixel sensor may include a number of mechanical devices, and corresponding electronic devices, to provide redundancy or to measure a broadband response range.

25 Claims, 28 Drawing Sheets

U.S. PATENT DOCUMENTS

| | | | |
|---|---|---|---|
| 5,659,195 A * | 8/1997 | Kaiser et al. ................. 257/415 |
| 5,693,237 A | 12/1997 | Bodensohn |
| 5,719,324 A * | 2/1998 | Thundat et al. ............ 73/24.01 |
| 6,477,303 B1 * | 11/2002 | Witherspoon ................ 385/52 |
| 6,763,705 B1 | 7/2004 | Thundat et al. ............ 73/64.53 |
| 2003/0015768 A1 * | 1/2003 | Bosco et al. ................ 257/528 |
| 2004/0007942 A1 | 1/2004 | Nishida et al. |
| 2004/0212576 A1 | 10/2004 | Schloeman et al. |

* cited by examiner

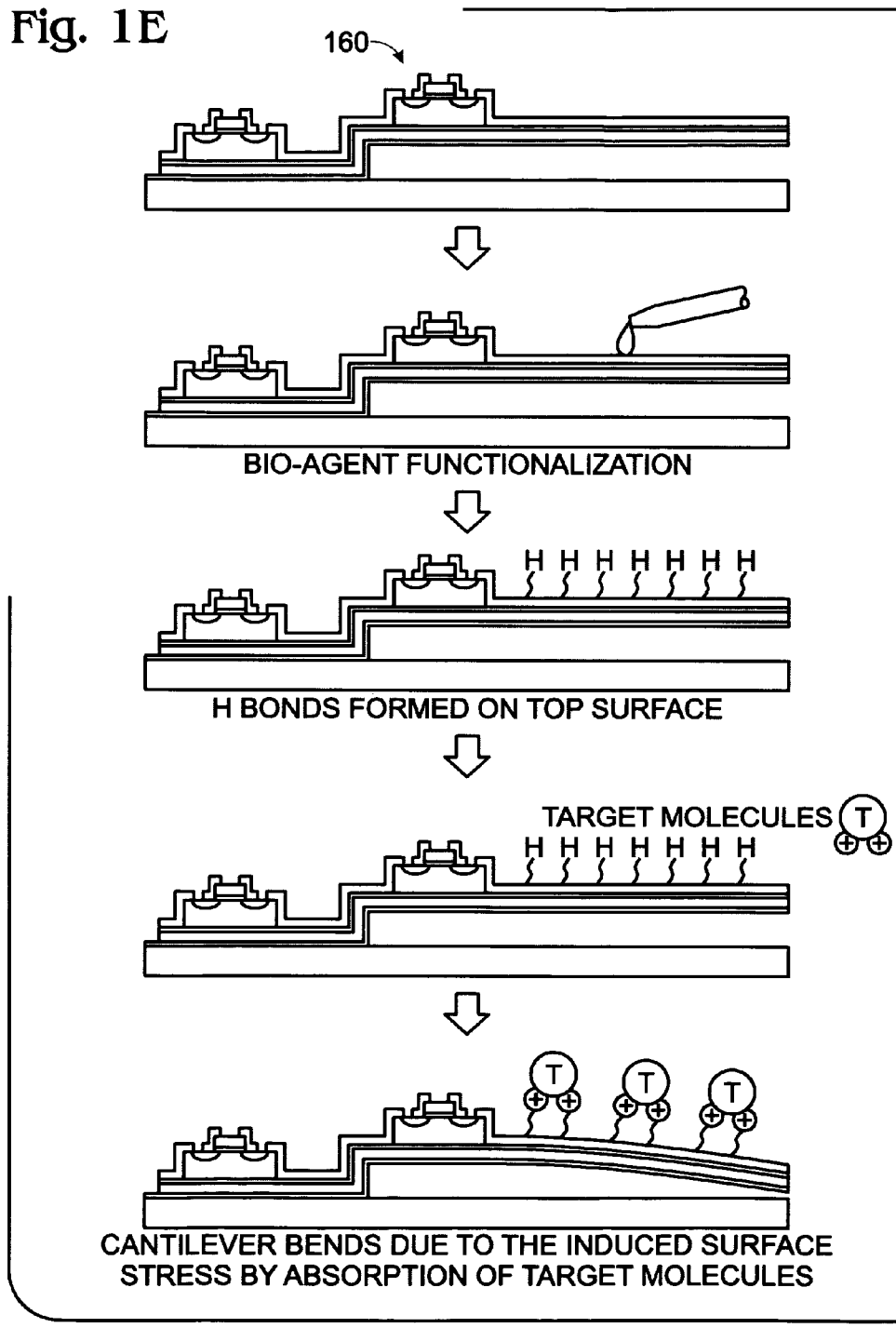

BONDING PADS  4 X 4 SENSOR CANTILEVER ARRAY

REFERENCE CANTILEVER

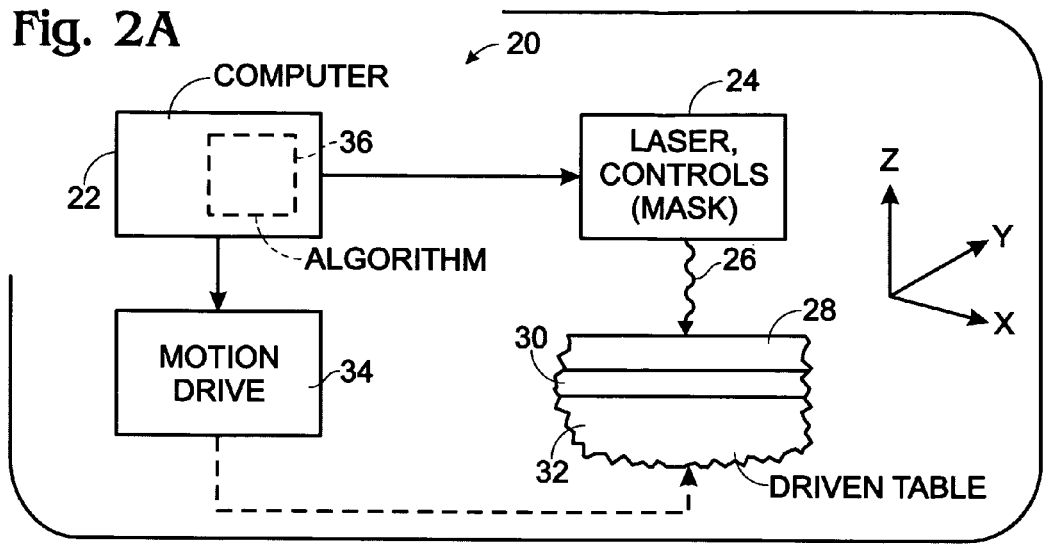
Fig. 2A
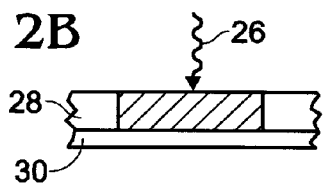
Fig. 2B
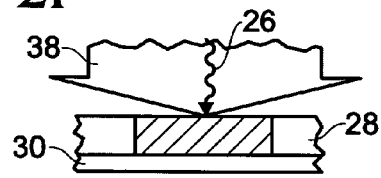
Fig. 2F
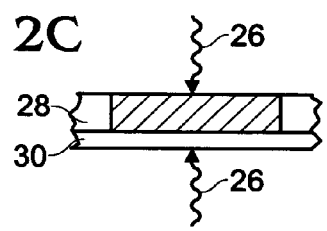
Fig. 2C
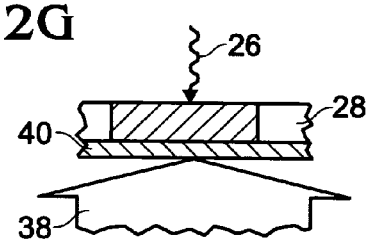
Fig. 2G
Fig. 2D
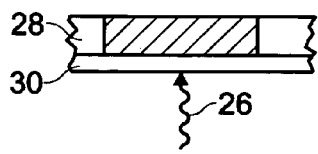
Fig. 2H
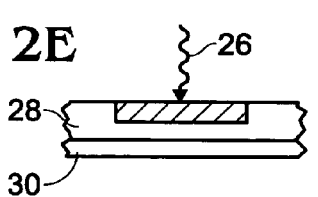
Fig. 2E

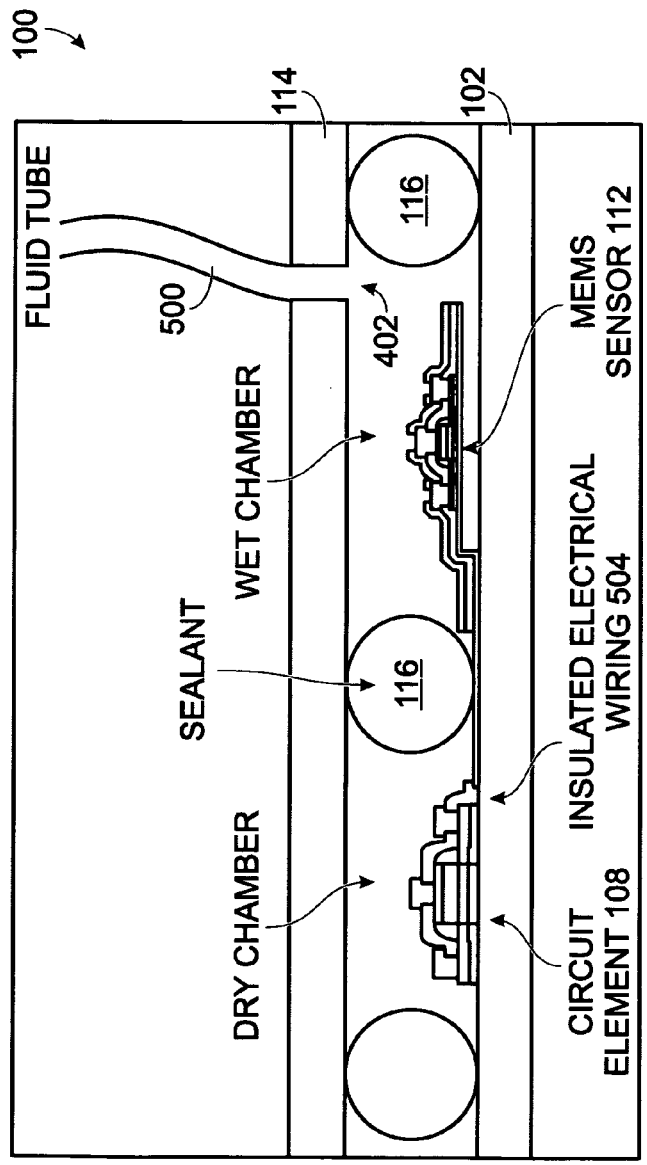
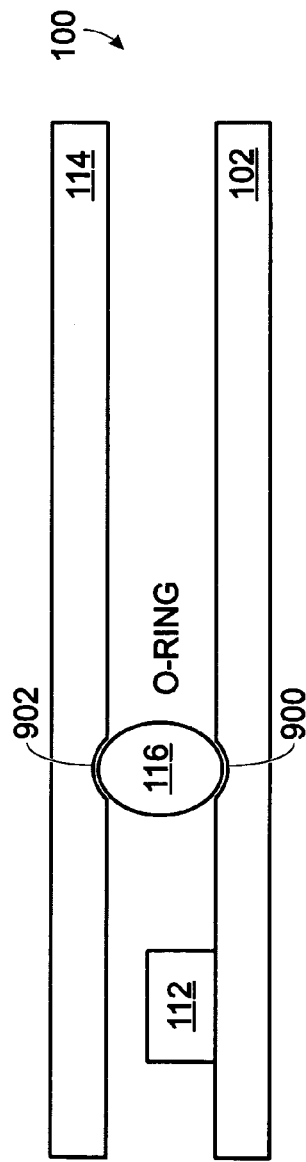
Fig. 3E
Fig. 3K

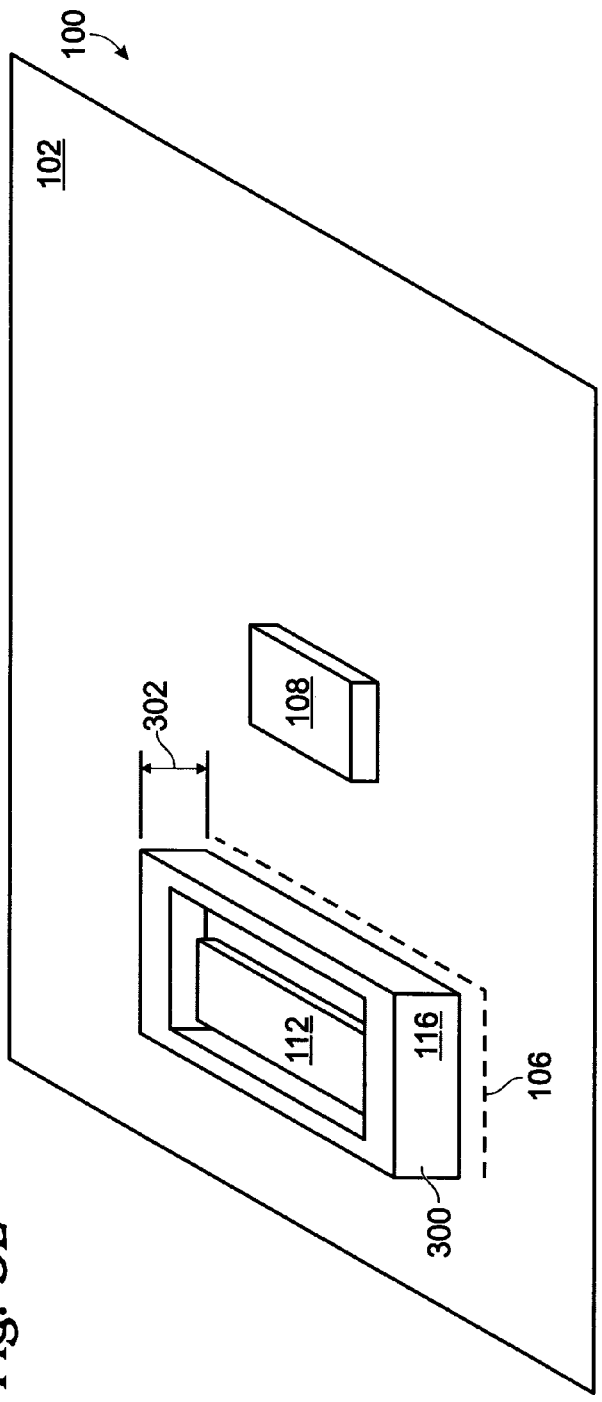
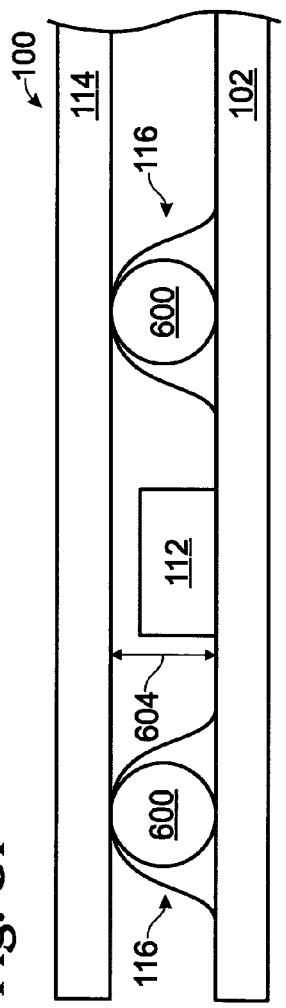
Fig. 3L
Fig. 3F

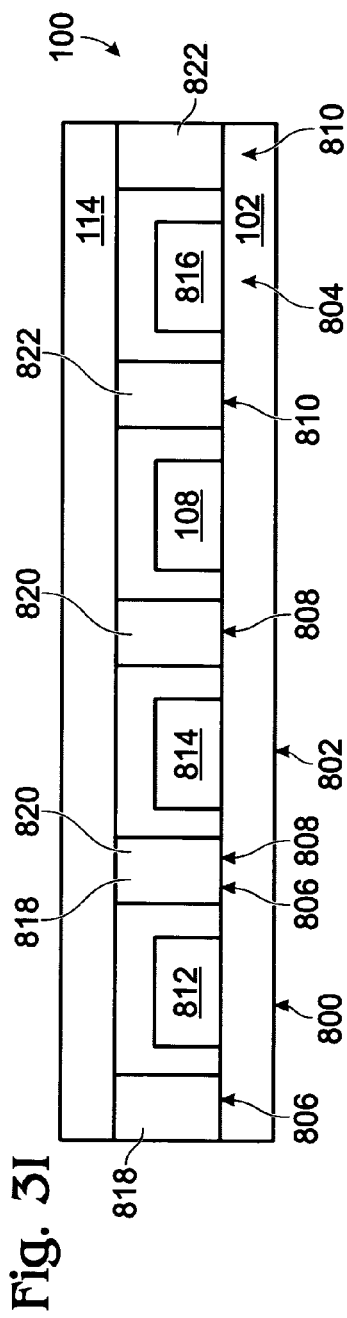
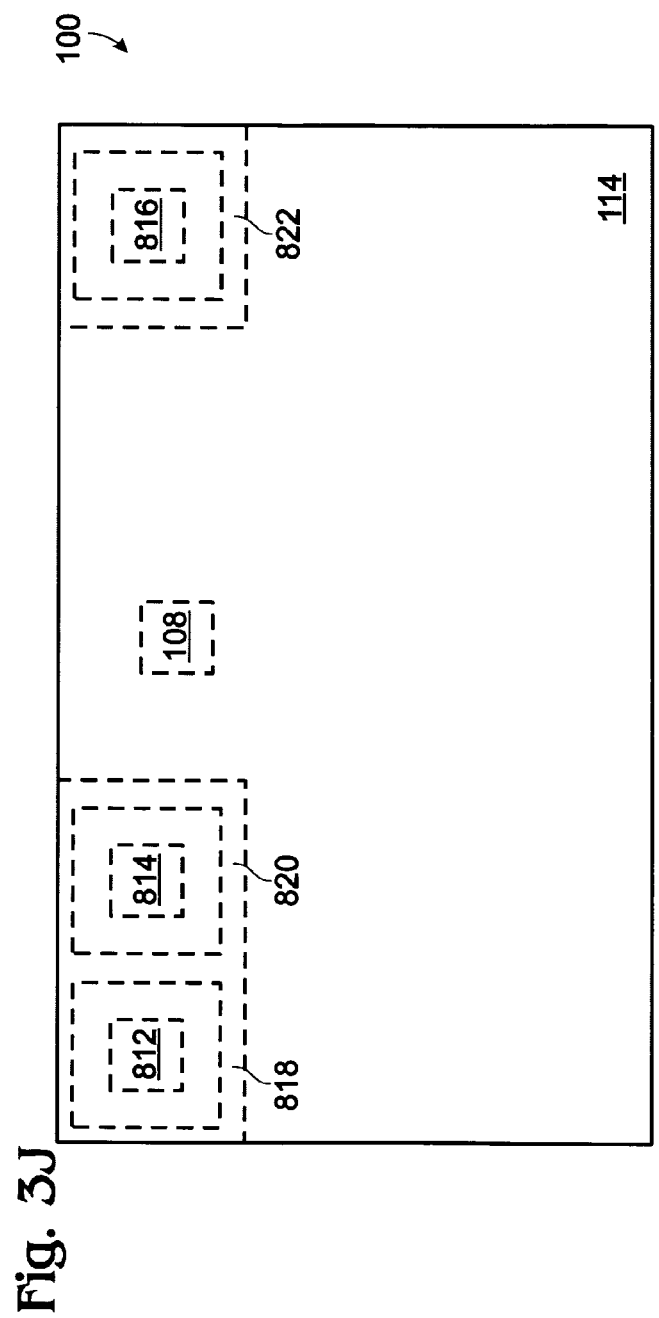
Fig. 3I
Fig. 3J

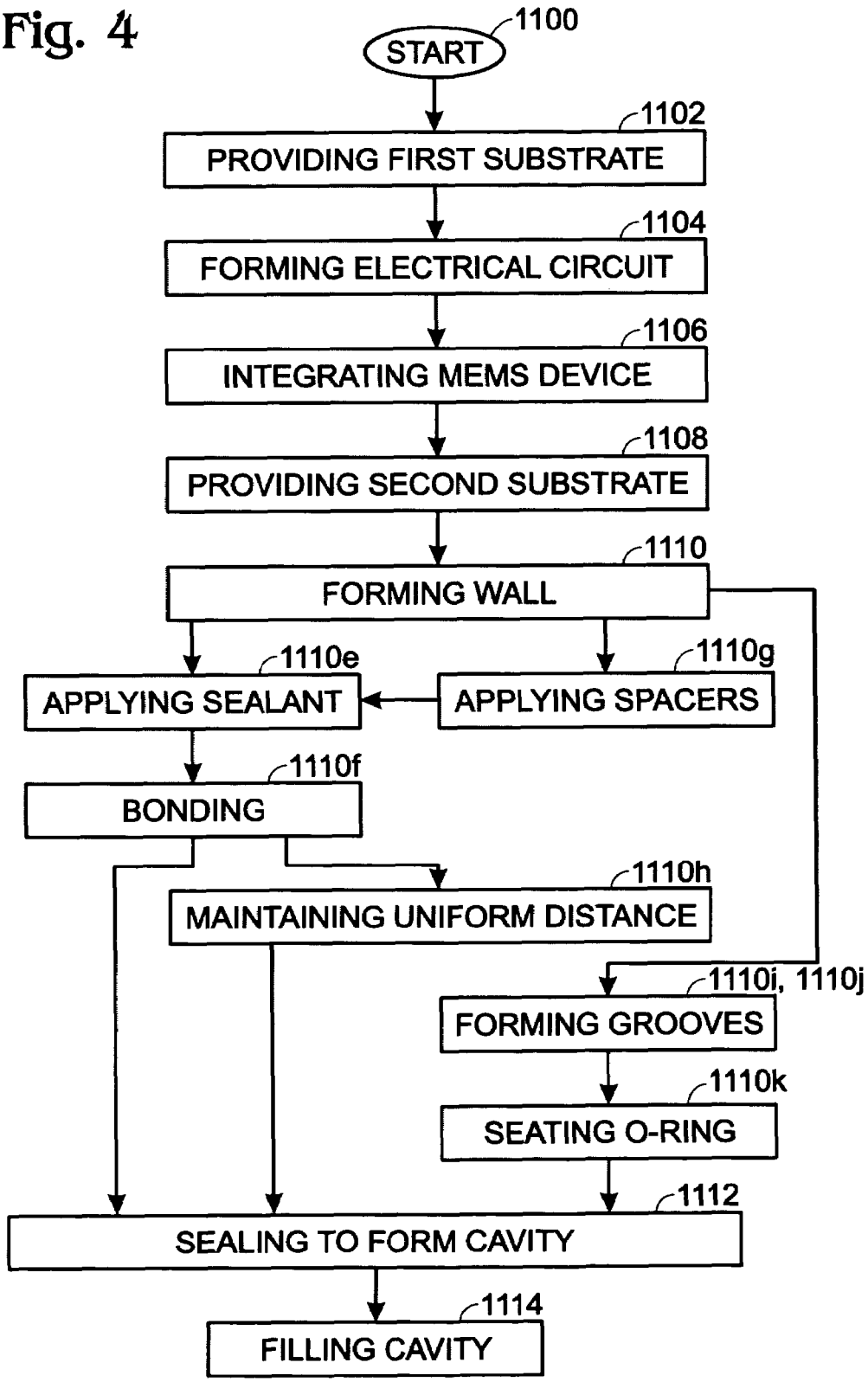

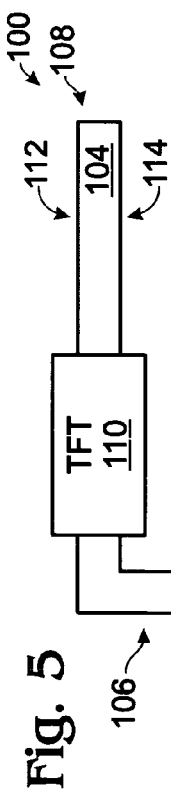
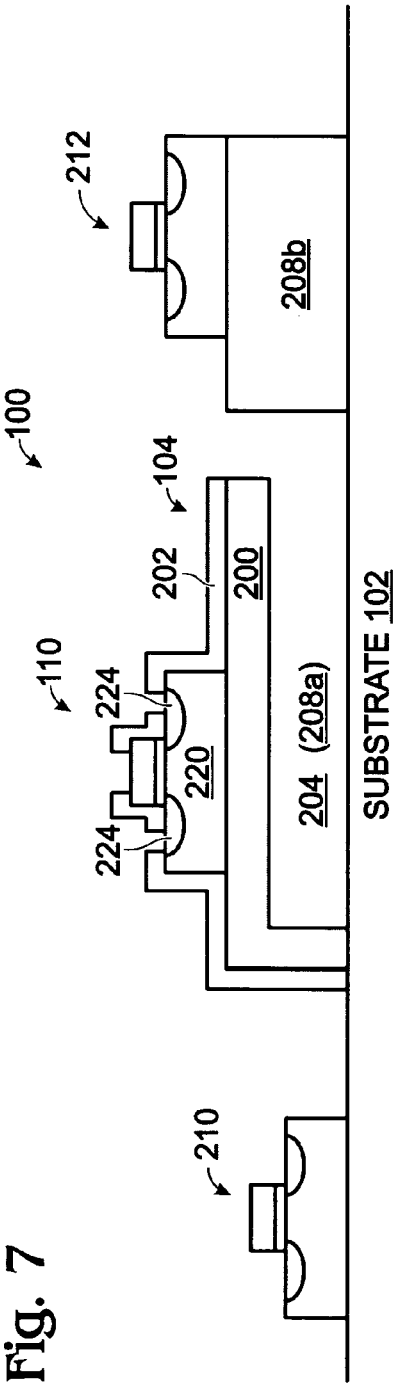
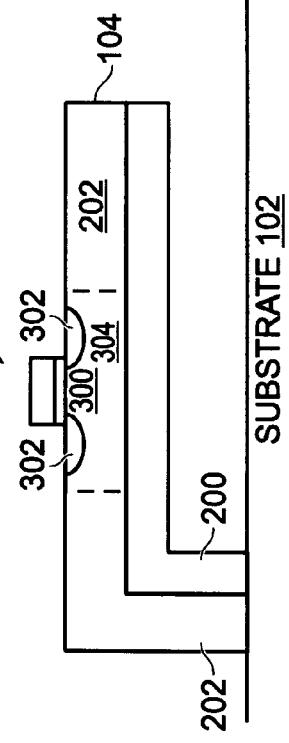

STRESS MOMENT $$f_0 = \frac{K_1}{2\pi}\sqrt{\frac{E_Y \cdot g \cdot t^3}{12(1-V) \cdot a^4 p_{ac}}}$$

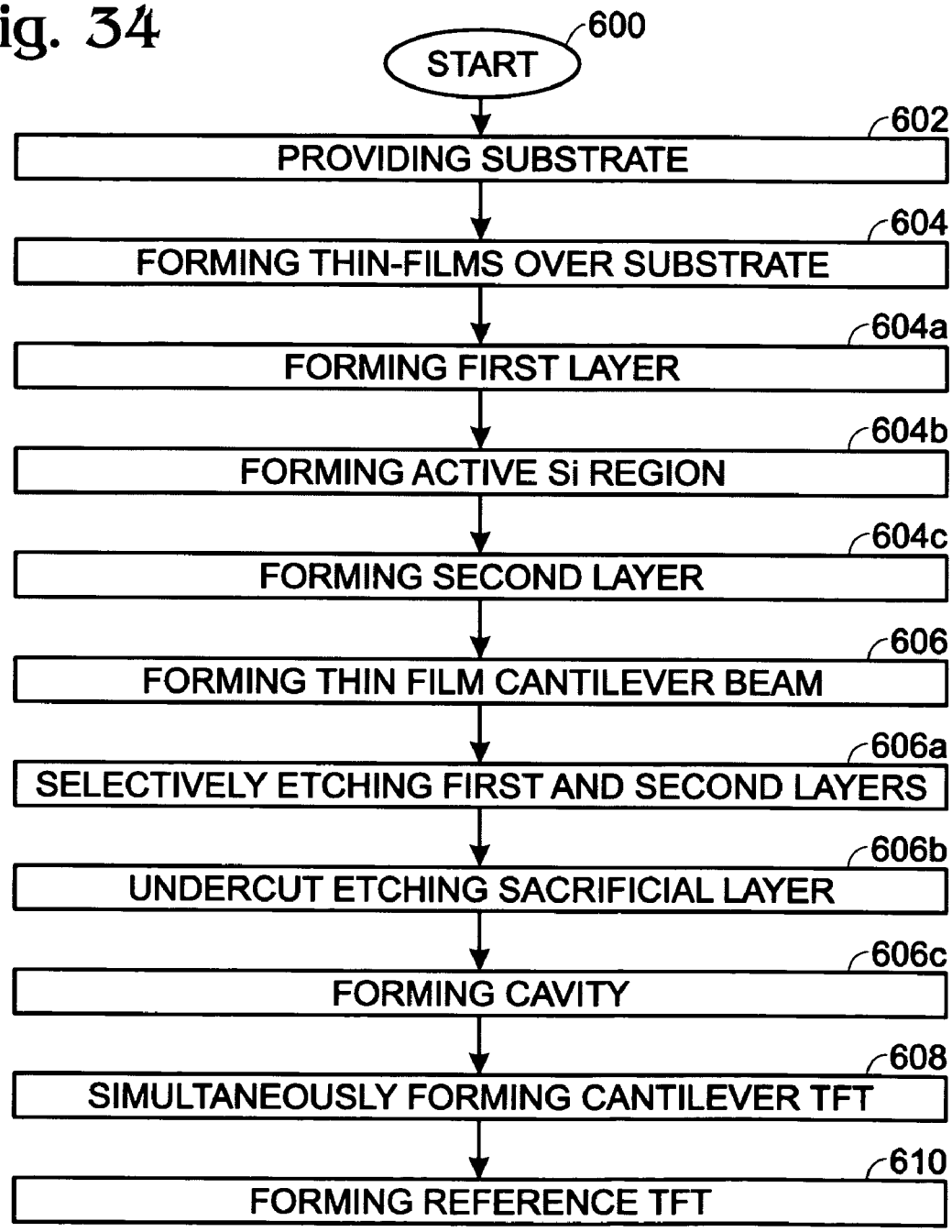

MEMS PIXEL SENSOR

RELATED APPLICATIONS

This application claims priority, under 35 U.S.C. 119, to Provisional Application No. 60/720,223, entitled BIO-CHEMICAL MEMS SENSOR, filed Sep. 23, 2005, and assigned to the assignee hereof.

This application is a continuation-in-part of a patent application entitled, MICROELECTROMECHANICAL THIN-FILM DEVICE, invented by John Hartzell, Ser. No. 11/058,501, filed Feb. 14, 2005, now U.S. Pat. No. 7,230,306, which is a continuation of Ser. No. 10/131,057, filed Apr. 23, 2002, issued as U.S. Pat. No. 6,860,939.

This application is a continuation-in-part of a patent application entitled, PIEZO-TFT CANTILEVER MEMS, invented by Zhan et al., Ser. No. 11/031,320, filed Jan. 5, 2005, now U.S. Pat. No. 7,253,488.

This application is a continuation-in-part of a patent application entitled, CRYSTAL-STRUCTURE-PROCESSED MECHANICAL DEVICES AND METHODS AND SYSTEMS FOR MAKING, invented by John Hartzell, Ser. No. 10/131,318, filed Apr. 23, 2002, now U.S. Pat. No. 7,125,451.

This application is a continuation-in-part of a patent application entitled, THIN-FILM CRYSTAL-STRUCTURE-PROCESSED DEVICES AND METHODS AND SYSTEMS FOR MAKING, invented by John Hartzell, Ser. No. 10/131,006, filed Apr. 23, 2002, now U.S. Pat. No. 7,128,783.

This application is a continuation-in-part of a patent application entitled, MONOLITHIC INTEGRATED CRYSTAL-STRUCTURE-PROCESSED MECHANICAL, AND COMBINED MECHANICAL AND ELECTRICAL DEVICES, AND METHODS AND SYSTEMS FOR MAKING, invented by John Hartzell, Ser. No. 10/131,549, filed Apr. 23, 2002, now U.S. Pat. No. 7,156,916.

This application is a continuation-in-part of a patent application entitled, MONOLITHIC STACKED/LAYERED CRYSTAL-STRUCTURE-PROCESSED MECHANICAL, AND COMBINED MECHANICAL AND ELECTRICAL DEVICES, AND METHODS AND SYSTEMS FOR MAKING, invented by John Hartzell, Ser. No. 10/131,808, filed Apr. 23, 2002, now U.S. Pat. No. 7,135,070.

This application is a continuation-in-part of a patent application entitled, FORMATION OF CRYSTAL-STRUCTURE-PROCESSED MECHANICAL, AND COMBINED MECHANICAL AND ELECTRICAL DEVICES ON LOW-TEMPERATURE SUBSTRATES, invented by John Hartzell, Ser. No. 10/131,551, filed Apr. 23, 2002, now abandoned.

All of the above-mentioned applications are incorporated herein by reference.

BACKGROUND OF THE INVENTION

1. Field of the Invention

This invention generally relates to integrated circuit (IC) fabrication and, more particularly, to a microelectromechanical (MEMS) sensor array technology that can be applied to many types of detection, including DNA, protein, antibody interactions, environmental contaminants, VCO's, toxins, and explosives.

2. Description of the Related Art

The present invention arises from a new area of recognition and development focused on the technology of low-temperature, crystalline-structure-processed devices, and in particular mechanical, mechanical and electrical, so-called MEMS (microelectromechanical), layered and stacked devices, and devices organized into monolithic arrays in layers, that opens up a broad new field of potential devices and applications not heretofore so inexpensively and conveniently made practical and practicable. This new field of possible devices, from which a number of inventions, one of which is specifically addressed in this disclosure, springs effectively from the recognition that internal crystalline-structure processing performed within the bodies of a wide variety of different materials, is capable of enabling fabrication of small (perhaps even down to devices formed from small molecular clusters), versatile, widely controllable and producible, accurate, mechanical, electromechanical and MEMS devices that can be formed very inexpensively, and, with respect to laser processing, in uncontrolled and room-temperature environments not requiring vacuum chambers, etc.

Especially, the invention offers significant opportunities for the building, relatively cheaply and very reliable, of very tiny semiconductor mechanical devices that can be deployed in dense two-dimensional and three-dimensional complex arrays and stacked arrangements. These devices can take on a large range of different configurations, such as individuated, single-device configurations, monolithic single-layer array arrangements of like devices, similar monolithic arrays of combined electrical and mechanical devices, and in vertically integrated and assembled stacks and layers of complex devices, simply not achievable through conventional prior art processes and techniques. By enabling room-temperature fabrication, otherwise easily damaged and destroyed layer-supporting substrates, including fabricated-device under-layers, can readily be employed.

The field of discovery and recognition which underpins the invention disclosed herein, can be practiced with a very wide range of semiconductor materials in arrays that can be deployed on rigid substrates of various characters, and on a wide range of flexible materials, such as traditional flex-circuit materials (polymers and plastics), metallic foil materials, and even fabric materials. Additionally, the field of development from which the present invention emerges can be employed with large-dimension bulk materials, as well as with various thin-film materials. The present invention is described in this broader-ranging setting. With regard to the latter category of materials, the process of this invention can take advantage of traditional thin-film semiconductor processing techniques to shape and organize unique devices, which are otherwise prepared in accordance with the internal crystalline-structure-processing proposed by the present invention, thus to achieve and offer mechanical properties in a broad arena of new opportunities.

In this setting, the invention disclosed in this document is specifically related to crystal-structure-processed semiconductor mechanical devices, either as individuated, single devices, or in arrays of devices organized into monolithic, layer-type arrangements, as well as to methodology and system organizations especially suited to the preparation and fabrication of such devices. The invention proposed a unique way, employing, for example, different types of lasers and other illumination sources, effectively to "reach into" the internal crystalline structures different semiconductor materials for the purpose of controllably modifying those structure to produce advantageous mechanical properties in devices, and at sizes very difficult and sometimes not even possible to create via prior art techniques.

From the drawings and the descriptions which now follow, it will become readily apparent how the present invention lends itself to the economic, versatile, multi-material fabrication and use of a large variety of devices, ranging from relatively large devices to extremely small device (as mentioned earlier), and including various forms of MEMS devices, without the fabrication of these devices, insofar as laser processing involved, necessitating the use of special controlled processing environments, or surrounding processing temperatures above typical room temperature.

With this in mind, the significant improvements and special contributions made to the art of device-fabrication according to the invention will become more fully apparent as the invention description which now follows is read in conjunction with the accompanying drawings.

MEMS devices are typically made on silicon wafers; using one of two well established techniques: bulk micro-machining or surface micro-machining. In both of these methods, the MEMS device is fabricated on a silicon wafer using standard IC-type fabrication equipment. Once the wafer is processed, the wafer is diced to form individual die. These MEMS die may or may not be integrated with electronic components (on CMOS). Once the die is cingulated, it must then be packaged in some form of package, similar to an IC package. This package is eventually inserted into a socket or bonded to a Printed Circuit Board (PCB) as part of an overall system, i.e., a cell phone. These packages can be quite elaborate, depending on the MEMS style and application, including vacuum package requirements. In addition, because many MEMS devices are required to move during operation, the package must provide a cavity that allows for this movement.

One problem with this type of MEMS packaging methodology is that the package is a very large proportion of the total MEMS device cost; on the order of 30- 70% of the overall cost. This packaging cost can, therefore, have a significant impact on the capability of such MEMS devices to penetrate cost-sensitive markets, such as the cell phone market.

Another problem with existing MEMS packaging is the noise inherent with the electrical connections between the MEMS package and the rest of the system. The bonding, wiring, and electrical interconnections associated with interfacing a MEMS device embedded in a package, to a circuit, necessarily adds impedance mismatches that result in noisy or low amplitude signals.

However, there is mounting evidence that MEMS technology can add value to systems, such as cell phones, in a market that is ripe for new technology, if only the packaging issue could be addressed. Continuing with the cell phone example, it is certain that the camera-on-cell phone has made a great impact on the market. The search is on for the next added functionality that can drive new expansion of the cell phone market.

MEMS are being considered for the following cell phone functions:

1) Motion capture (Accelerometer and gyroscope);
2) Microphones;
3) RF devices and RF modules;
4) Image capture;
5) Low power solutions;
6) Identification (biometrics);
7) Enhanced display functionality; and,
8) Personal health and safety monitoring.

The issues preventing MEMS penetration into the cell phone market are cost and performance. As mentioned above, packaging is 30-70% of the MEMS device cost. This cost issue is preventing the integration of MEMS into cell phones, display systems, and many other types of electronic devices.

MEMS devices are a logical derivative of semiconductor IC processes that may be used to develop micrometer scale structural devices such as transducers or actuators, and they are typically fabricated on silicon substrates. MEMS devices typically interface physical variables and electronic signal circuits. The integration of MEMS into larger scale systems has been expensive to fabricate due to the process difficulties and the cost associated with integrating the MEMS standard IC technologies, such as CMOS. The processes used to fabricate MEMS on glass offer the advantage that the integration of electrical and mechanical functions is easily done. In this way, system level integration is possible and cost effective.

TFTs are formed through deposition processes that create thin films of silicon (Si) and insulator material. While the resulting TFTs may not have the switching speed and drive capability of transistors formed on single-crystal substrates, the transistors can be fabricated cheaply with a relatively few number of process steps. Further, thin-film deposition processes permit TFT devices to be formed on alternate substrate materials, such as transparent glass substrates, for use in liquid crystal displays (LCDs). More specifically, the TFTs include a deposited amorphous Si (a-Si) layer. To improve the performance of the TFT, the a-Si may be crystallized to form poly-silicon, at the cost of some extra processing. The crystallization procedures are also limited by the temperature sensitivity of the substrate material. For example, glass substrates are known to degrade at temperatures over 650 degrees C. Large scaled devices, integrated circuits, and panel displays are conventionally made using thin-film deposition processes.

MEMS devices are a logical derivative of semiconductor IC processes that may be used to develop micrometer scale structural devices such as transducers or actuators. MEMS devices interface physical variables and electronic signal circuits. MEMS structures are varied and, therefore, more difficult to standardize, as compared to the above-mentioned thin film processes. On the other hand, it may be possible to develop MEMS devices by engineering modifications to well-developed silicon IC processes. Many of the MEMS devices that have been fabricated to date have more theoretical than practical application, as the devices are often difficult and expensive to make. For the same reason, larger scale systems using MEMS components, have been expensive to fabricate due to the process difficulties and the cost associated with integrating the MEMS and IC technologies. For example, transistors and associated MEMS structures have been fabricated on bulk Si substrates, However, the etching processes needed to form a bulk silicon MEMS -are more difficult to control, dramatically limit available process steps, and require long etch times. These limitations make these devices unsuitable for low-cost integrated systems. Alternately, MEMS structures made using high temperature LPCVD thin films have been built with conventional sensing schemes such as capacitive and/or piezoresistive bridges, generating reasonable output signals. However, these sensing schemes cannot be applied to low temperature TFT process, because the changes in electrical characteristics induced as a result of stress change are too small to be practically measured.

Sensor array technology has been very successfully applied to gene expression studies (among other applications). Current microarray technology is based primarily on optical detection methods. Two main types of DNA microarrays are THE synthesized ogleotide type, such as those manufactured by Affymetrix, and "spotted core" arrays that are made by applying materials of interest to glass slides using automated arrayers or ink jet technology. Several problems plaque current microarray technology:

1) High cost: current microarray technology is very expensive with the most expensive being the Affymetrix-type. The "genechip" is a single use device that costs on the order of $300 to $500 per chip. In addition, several pieces of additional process equipment are required: among them a washing station and scanner. The process requires the scanning of the "genechip" (with the material of interest applied to the chip) with a laser, florescent material on the chip is activated and a light imager records the image of the florescent pattern. Then, the result must be interpreted using templates to analyze the image.

2) Low throughput: While current microarray technology has produced a very high volume of data for genetic research, the process is still relatively slow. For example, a DNA hybridization experimental process takes a minimum of several hours and more likely overnight to complete.

3) Inaccuracies: The current DNA microarray technology produces results with inaccuracies such as false positives.

4) Bulky system: The current microarray technology requires an assortment of process equipment. In addition to the equipment required to prepare the array, a laser scanner and image detection system are required to read the result. Thus, this technology cannot produce a portable solution for microarray applications.

It would be advantageous if active devices could be formed in a MEMS mechanical structure using the same, shared process steps.

It would be advantageous if MEMS devices could be packaged as part of the overall process of fabricating electronic (active) devices on a circuit board or display.

It would be advantageous if a TFT could be integrated with a MEMS mechanical structure using the same, shared thin-film deposition and annealing processes.

It would be advantageous if a stress change sensing scheme could be formed in a MEMS mechanical structure using the same, shared process steps as TFT fabrication.

SUMMARY OF THE INVENTION

The present invention is a MEMS pixel sensor, which may also be used for a variety of applications. For example, the MEMS pixel sensors may be used in biochemical applications. In one aspect, the sensors are fabricated using piezo-thin-film transistor (TFT) technology.

Accordingly, a MEMS pixel sensor is provided with a thin-film mechanical device having a mechanical body, with a mechanical state responsive to a proximate environment. A thin-film electronic device converts the mechanical state into electrical signals. A pixel interface supplies power to the electronic device and transceives electrical signals. The sensor is able to operate dynamically, in real-time. For example, if the mechanical device undergoes a sequence of mechanical states at a corresponding plurality of times, then the electronic device is able to supply a sequence of electrical signals to the pixel interface that are responsive to the sequence of mechanical states, at the plurality of times.

In one aspect, the MEMS pixel sensor includes a memory having an interface connected to the electronic device for storing electrical signals. The memory is connected to the pixel interface for supplying stored electrical signals. The stored electrical signal may represent a sensor calibration state. For example, the mechanical device may have a calibration mechanical state response to a controlled proximate environment, and the electronic device supplies a calibration electrical signal responsive to the calibration mechanical state. The memory stores the calibration electrical signal, and supplies the calibration electrical signal to the pixel interface in response to a calibration state signal received at the pixel interface.

Each MEMS pixel sensor may include a number of mechanical devices, and corresponding electronic devices, to provide redundancy or to measure a broadband response range. To measure a broadband range each mechanical devices on the pixel may have a unique mechanical state, responsive to a common proximate environment. For example, the mechanical devices may be cantilevers of different thicknesses or lengths.

Some examples of mechanical devices include a microphone, fluidic sensor, acoustic speaker, radio frequency (RF) filter, RF antenna, accelerometer, gyroscope, chemical sensor, temperature sensor, humidity sensor, pressure sensor, light sensor, actuator, DNA sensor, biological sensor, and gyroscope.

Additional details of the above-described MEMS pixel sensor, an array of MEMS pixel sensors, and a display backplane with an integrated MEMS pixel sensor are provided below.

BRIEF DESCRIPTION OF THE DRAWINGS

FIGS. 1A through 1H depict various aspects of a MEMS pixel sensor and associated array.

FIG. 4 is a flowchart illustrating a method for packaging a MEMS device.

FIG. 5 is a partial cross-sectional view of a piezo thin-film transistor (piezo-TFT) cantilever microelectromechanical system (MEMS).

FIG. 6 is a partial cross-sectional view of a variation of the piezo-TFT cantilever of FIG. 7.

FIG. 7 is a partial cross-sectional view of the piezo-TFT cantilever of FIG. 5, with the cantilever TFT located on the cantilever top surface.

FIG. 34 is a flowchart illustrating a method for fabricating a piezo-TFT cantilever MEMS.

DETAILED DESCRIPTION

FIGS. 1A through 1H depict various aspects of a MEMS pixel sensor and associated array. The present invention MEMS pixel sensor provides a fabrication process, device design, and an integrated sensor array system that displays improvements in the area of cost, speed, compactness, and accuracy with respect to conventional technology. In the following discussion a piezo-TFT cantilever is often presented as an example of a MEMS pixel sensor. In other aspects, the MEMS pixel sensor is described more concisely as a transducer, MEMS, MEMS sensor, pixel, process pixel, or MEMS pixel.

Figure 1A:
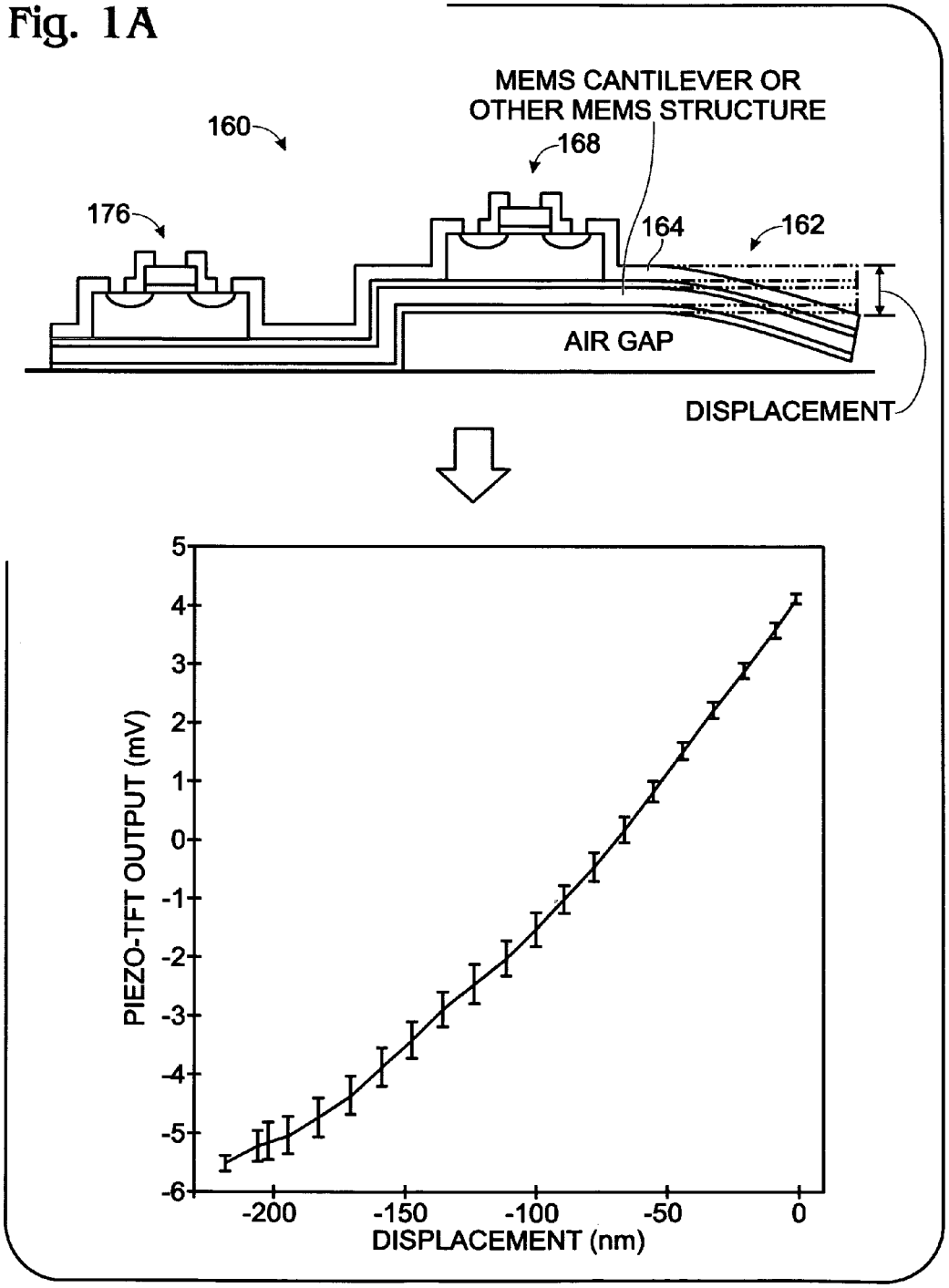
Figure 1B:
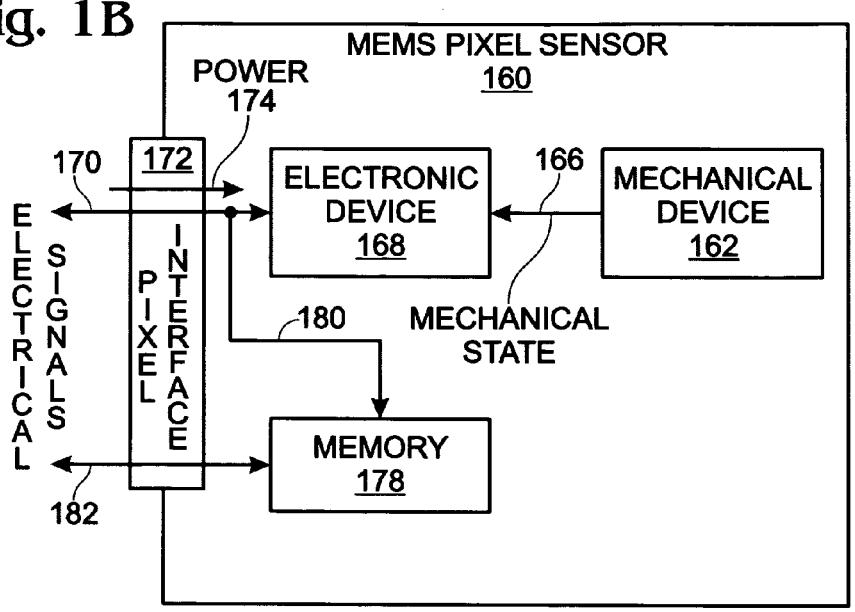
Figure 1C:
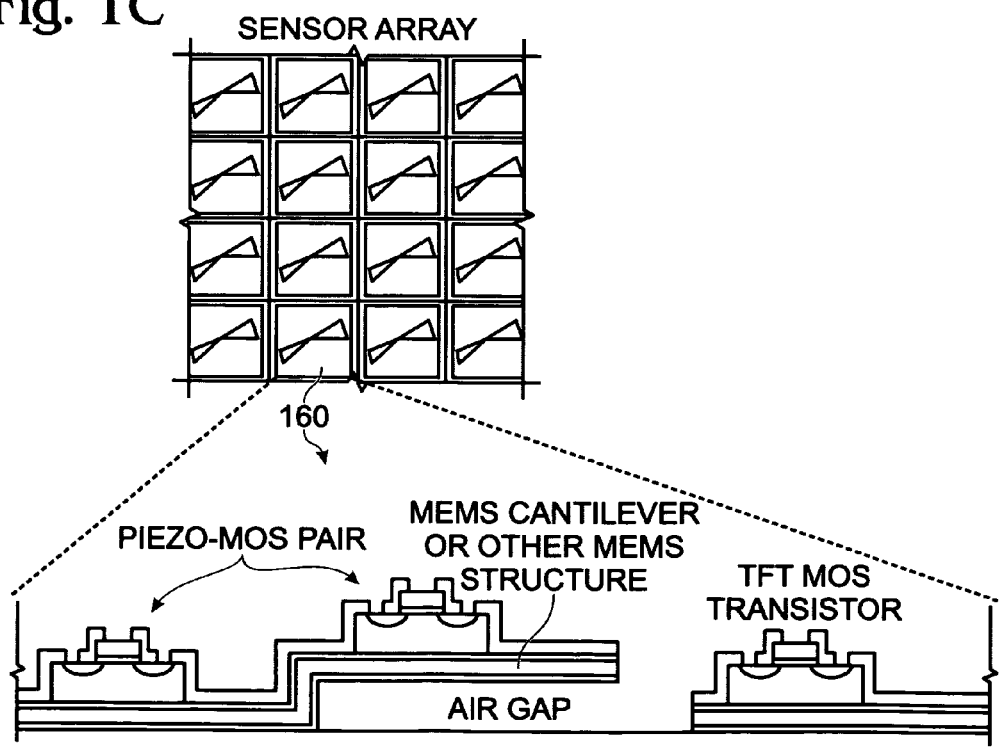
Figure 1D:
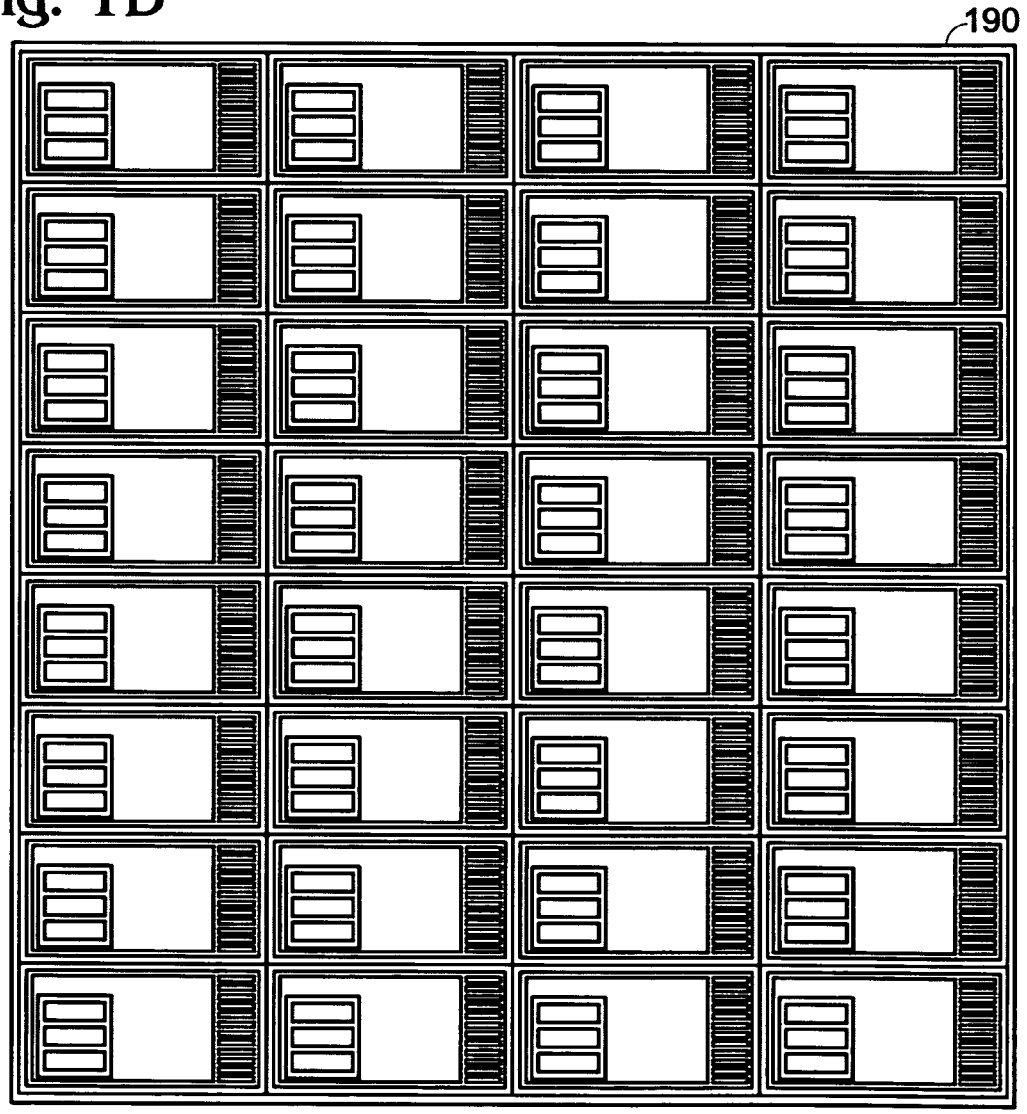

FIG. 1A is a cross-sectional view of a MEMS pixel sensor (MPS). FIG. 1B is schematic block diagram view of the MEMS pixel sensor of FIG. 1A. FIGS. 1C and 1D show the MPS of FIG. 1A as part of a sensor array.

1) Fabrication process: Low temp poly processing including laser anneal enables the monolithic fabrication of a single transducer that includes both electrical and mechanical elements that can be used in combination for sensing some event or condition.

2) Device design: Design of an integrated electromechanical device provides a transducer with high sensitivity, reproducibility, reliability, and rapid response.

3) Integrated array system: The monolithic fabrication approach taught herein enables a number of integrated system features that, when combined, provide unique solutions for sensor arrays. Examples are:

a) Integrated memory per pixel to store transducer results and allow for the initial calibration of the transducer before use.

b) Integrated sensor amplification circuitry c) Broadband sensor output through simultaneous fabrication of a variety of different mechanical elements; such as cantilevers with different lengths, thicknesses or material properties.

One aspect of this transducer is the employment of processes and methods, based on polysilicon thin film transistor (TFT) technology, uniquely in such a way that electrical and mechanical devices can be simultaneously fabricated in a process flow compatible with "low temperature" substrate materials (i.e., glass and plastic).

Returning to FIG. 1A, the MEMS pixel sensor 160 comprises a thin-film mechanical device 162 having a mechanical body 164. In this example, the mechanical body is a cantilever. The mechanical body 164 has a mechanical state responsive to the proximate environment. The mechanical state is represented schematically in FIG. 1B as reference designator 166. In the example of FIG. 1A, stress to a proximate environment is used as a mechanical state, e.g., the atmosphere surrounding the cantilever is the proximate environment. A thin-film electronic device 168 converts the mechanical state into electrical signals on line 170 (see FIG. 1B). In this example, the thin-film electronic device 168 is a TFT, and the electrical signal on line 170 is a TFT drain current. Generally, the mechanical body 164 may be a structure such as a cantilever, bridge, or membrane, and the electronic device may include one or more thin-film diode and TFT components. Note, the electronic device 168 may be comprised of more than one active device, and combinations of active devices and passive devices, such as resistors and capacitors. As shown in FIG. 1A, the electronic device 168 can be formed within the mechanical body 164. However, the electronic device need not be integrated into the mechanical body 164. As shown, the mechanical body 164 and TFT 168 are made from common layers of thin-film material. The common layers may, or may not have the same crystalline structure.

As explained in more detail below, some examples of MEMS pixel sensor mechanical devices include a microphone, fluidic sensor, acoustic speaker, radio frequency (RF) filter, RF antenna, accelerometer, gyroscope, chemical sensor, temperature sensor, humidity sensor, pressure sensor, light sensor, actuator, DNA sensor, biological sensor, and gyroscope.

A pixel interface 172 supplies power on line 174 to the electronic device 168 and transceives electrical signals on line 170. In one aspect, the pixel interface 172 is the column and row connections on a substrate (not shown) that enable the electronic device 168. This method of pixel enablement is widely used in memory cell and optical element arrays, and is well understood in the art. For example, the pixel 160 may be enabled using a row line to supply a voltage to the TFT gate, and a column line to supply voltage to the TFT source, while the output electrical signal on line 170 is supplied by the TFT drain on a separate line. In other aspects, changes in resistance or current in the enabling lines can be interpreted as the electrical signal. Alternately, the pixel interface includes other electronic devices (not shown) that indirectly enable, drive, or condition signals to the electronic device 168 in response to enablement signals received on line 174. Stated in another manner, the pixel 160 may include convention current source, voltage amplifiers, or the like to aid in enabling the electronic device 168. As seen in FIG. 1A, additional active devices, such as TFT 176, may be part of the electronic device 168 associated with the pixel 160, and used for amplification, signal conditioning, or enablement.

This invention enables sensor array technology that can be usefully integrated into the healthcare system and provide a variety of healthcare solutions in the area of diagnostics, drug discovery, and clinical applications. The potential of this invention is far reaching and can provide solutions to lower ever-increasing healthcare costs.

Optical-based cantilever detection, using a silicon or silicon nitride cantilever and passive (e.g., resistor) components, a laser beam and optical detector, has been shown to be a very sensitive by researchers like Thundat, et al. at Oak Ridge National Lab. Additionally, there have been cantilever approaches utilizing capacitive and piezo-resistive transducers for electrical detection. The problem with these conventional electrical detection methods has been the lack of sensitivity. The other issue with the conventional cantilever-based approaches has been the difficulty putting these transducers in a true 2-dimensional array that can individually address the transducers and provide accurate data.

The present invention transducer has the following advantages:

1) High speed: the detection of the event of interest can be done through the individual addressing of detection sites in the array and the electronic detection of the resulting reaction. This methodology opens the door for clinical applications, such as the use of DNA-type arrays for patient diagnostic testing during a visit to the doctor's office, with results available within minutes, for example.

2) Low cost: the fabrication of this array technology can be done using a typical display manufacturing process that produces microarrays that are lower cost than current technology, by one or two orders of magnitude.

3) Dynamic response: Because the detection sites can be accessed many times per second, the present invention array technology can obtain a dynamic response that represents the reaction kinetics. For example: this array can calculate the rate of DNA hybridization at the detection site, not just provide a final go/no—go result, as provided in the conventional array technology. This additional information is particularly important for protein array applications and is helpful in establishing a more detailed database of the experimental result.

Alternately stated, the MEMS pixel sensor 160 is able to operate in real time. For example, the mechanical device 162 may have a first mechanical state at a first time, and the electronic device 168 is able to supply a first electrical signal, responsive to the first mechanical state, at the first time. Further, the MEMS pixel is able to provide a series of sensor readings, so that a rate of changing environmental conditions can be monitored. To continue the example, the mechanical device 162 may have a second mechanical state at a second time, subsequent to the first time. The electronic device 168 is able to supply a second electrical signal, responsive to the second mechanical state, at the second time. For example, the first time may be a calibration state and the second time may be associated with an unknown environment to be measured.

Alternately expressed, the mechanical device 162 may undergo a sequence of mechanical states at a corresponding plurality of times, and the electronic device 168 supplies a sequence of electrical signals, responsive to the sequence of mechanical states, at the plurality of times. In this manner, an environment may be continuously monitored, or rates of change can be calculated.

4) Broadband response: Fabrication of a variety of transducer types accomplished by making slight modifications to the mechanical characteristics of the individual devices. For example, one can fabricate a set of cantilevers, each with a different mechanical response by varying the thickness, length, etc. In this way, one can get a broadband response from the sensing event, which enables a more detailed fingerprint from the material of interest.

One can also get a broadband response through the fabrication of multiple device types. For example, one can fabricate a cantilever, a bridge device, a simply supported membrane, etc, all in the same process flow by adding additional photolithography masks and using the teachings herein.

Figure 1F:
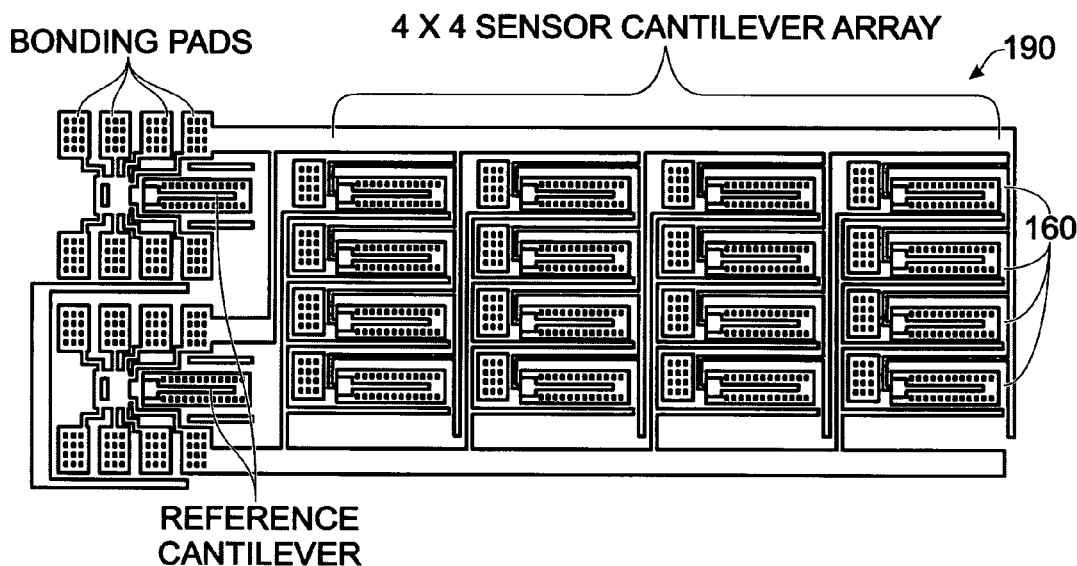
Figure 1G:
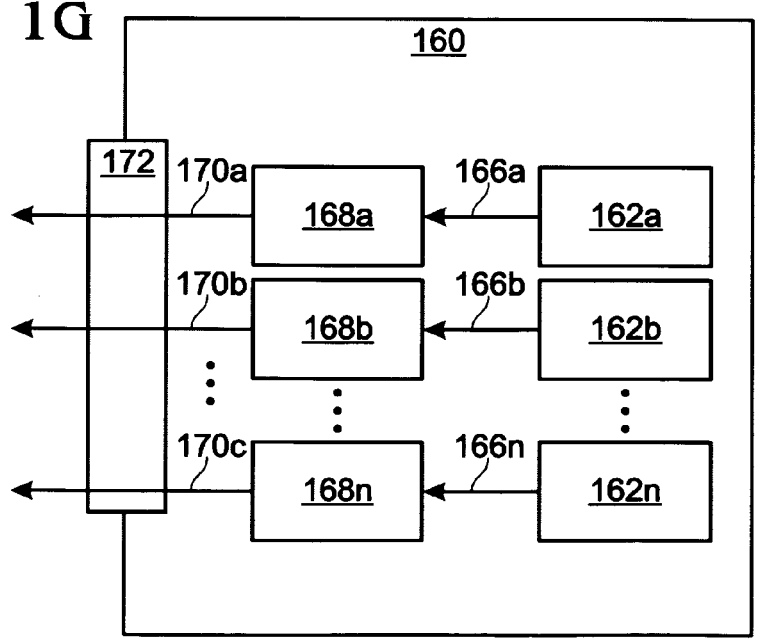

FIG. 1G depicts a MEMS pixel sensor with a plurality of mechanical devices. The plurality of mechanical devices is depicted as 162a through 162n, where n is not limited to any particular number. Each mechanical device 162a-162n has a mechanical state, represented respectively by 166a-166n, responsive to the proximate environment. Likewise, a plurality of electronic devices 168a-168n corresponding to the plurality of mechanical devices 162a-162n, converts each mechanical state 166a-166n into an electrical signal 170a-170n, respectively. The pixel interface supplies the plurality of electrical signals from the plurality of electronic devices. In another aspect not shown, a single electronic device is connected to the plurality of mechanical devices, and multiplexed to monitor the plurality of mechanical devices.

In one aspect, each mechanical device 162a-162n has a unique mechanical state, responsive to a common proximate environment. This may occur if different types of mechanical bodies are used in the same pixel, or the same type of mechanical body is varied. For example, cantilever mechanical bodies may be used with different lever thicknesses, lengths, thin-film materials, or crystallization states. In this aspect, the pixel interface 172 supplies a plurality of unique electrical signals in response to the common proximate environment.

5) Compact detection: the transducer is in a small form factor card. There is no need for complex optical detection equipment. The small form factor enabled by this technology promotes a broad application of array testing, initially to clinical applications, and eventually to the consumer.

6) Calibration: One of the difficulties in conventional sensor array technology is the differential responses received at array sites due to the different characteristics of the transducers at each site. This invention allows for the calibration of the transducer at each site. For example, the calibration routine output of the transducer can be read and a value stored in memory. Then, as the transducer is exposed to the sensing event, the differential signal from the initial calibration value is examined. In some cases, a memory cell is monolithically fabricated with the TFT and transducer at each "pixel" site. The resulting array includes an array of "pixels", each with a TFT, a mechanical transducer, and memory cells.

The calibration can be enabled with an embedded pixel memory. In this aspect, the MEMS pixel sensor 160 further comprises a memory 178 having an interface connected to the electronic device on line 180 for storing electrical signals, and connected to the pixel interface on line 182 for supplying stored electrical signals.

The mechanical device 162 may have a calibration mechanical state response to a controlled proximate environment. For example, the mechanical state may be stress, as measured in a controlled environment of sea level air pressure. The electronic device 168 supplies a calibration electrical signal on line 170 responsive to the calibration mechanical state, and the memory 178 stores the calibration electrical signal. In response to a calibration state signal received on line 182, the memory 178 supplies the calibration electrical signal to the pixel interface 172 on line 182. The memory may be a digital memory, in which case the stored electrical signals may be converted to a digital format prior to storage. Alternately, the memory may be a memory transistor, memory diode, or RC circuit which stores an analog voltage.

The MEMS pixel sensor mechanical and electronic devices are conventionally fabricated on a substrate made from materials such as glass, plastic, quartz, metal foil, thin-film, or dielectric materials. An array of pixels can be formed on glass or plastic for sensing a variety of events or conditions ranging from chemical to molecular interactions. The sensor array is a 2 dimensional grid of "process pixels" (PP) or MEMS pixel sensors (MPSs). Each PP may be comprised of a thin film transistor (TFT) and one "integrated transducer" element. The "integrated transducer" is made up of at least one mechanical and one electrical (active) element fabricated in the same structure. The active electrical element may be a TFT, diode, or a circuit of such simple electrical devices, which distinguished the present invention transducer from conventional passive sensing approaches, like piezo-resistive or capacitive sensing. Low temperature TFT processes permit the present invention transducers to be fabricated on low-cost temperature sensitive substrates such as glass or plastic. Thus, the piezo-TFT is one example of this "integrated transducer". The fabrication of all the electrical and mechanical devices is done in the same process flow, which is typically done in less than 10 mask steps. This low mask-count allows for a low cost fabrication process, especially as compared transducers that integrate electrical and mechanical elements on bulk single-crystal silicon wafers.

FIG. 1E depicts an exemplary chemical reaction, which results in an electrical response. Returning to FIG. 1A, the electrical response of an exemplary piezo-TFT transducer, as measured in voltage, is compared to cantilever displacement.

FIG. 1F is a more detailed plan view of an array made with piezo-TFT transducers (MEMS pixel sensors). Using such a piezo-TFT sensor, a biochemical or bio-sensor array can be formed to measure DNA, protein, or antibodies for example, on a glass or plastic substrate. A piezo-TFT transducer, can be used in combination with a TFT, to switch the transducer output on and off (read). A piezo-TFT can be made up of strain-sensing TFT, and reference TFT fabricated on cantilever mechanical element. An array of such devices can be functionalized for bio-interaction using any of the methods known in the art, such as ink jet, arrayers or other surface chemistry functionalization techniques.

Alternately, the present invention transducer can be a combination of a mechanical device built using TFT processes, in combination with a TFT process electrical device other than a transistor. In some aspects, integrated memory is provided per pixel for calibration and storage of dynamic data. The array is application to the measurements of other events besides biologic, such as environmental contamination (gases or liquids), water, atmosphere, VCO, toxins, pressure, acoustic or other sensing application. Advantageously, the TFT processes permit such transducers to be fabricated on displays, and integrated into larger systems. Besides cantilevers, a variety of mechanical elements can be used to fabricate a transducer. Likewise, a transducer can be made with a variety of TFT types and circuit elements as the electrical element.

Alternately stated, the array 190 of MEMS pixel sensors comprises a plurality of MEMS pixel sensors 160, as described above. It would be well understood by one of skill in the art that an array interface supplies power to the plurality of MEMS pixel sensors, and transceives electrical signals with the plurality of pixel interfaces. Typically, the array interface selectively supplies power to enabled MEMS pixel sensors and accepts electrical signals from the enabled MEMS pixel sensors. For example, the array may enable column and row lines to selectively enable pixels. As a result, electrical signals may be transceived on a bus shared between pixels. This manner of enablement is widely used in arrays of memory cell and pixel displays.

Figure 1H:
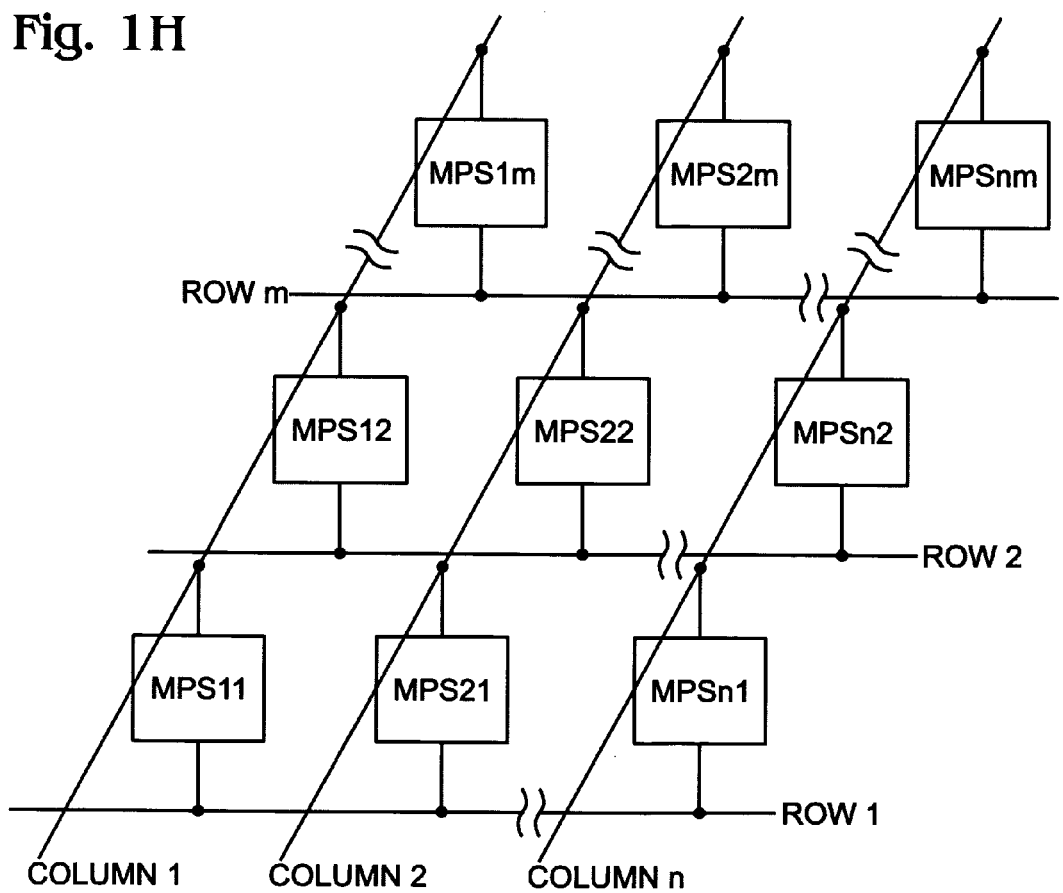

FIG. 1H is a schematic block diagram depicting an array of MEMS pixel sensors. The array includes n×m MEMS pixel sensors (MPSs), where n and m are not limited to any particular number. Pixel $MPS_{11}$ can be enabled, for example, by supplying an "on" voltage to column line 1 and row line 1. In one aspect, the current supplied by $MPS_{11}$ to the column line (column line 1) is measured and represents the electrical signal supplied by the MPS. Thus, a high current may represent a first mechanical state and a low current may represent a second mechanical state of the $MPS_{11}$ mechanical device. In this example, the set of column lines are the array interface described above. Alternately but not shown, the MPSs may be enabled using column and row lines, but the electrical signals output by the MPSs may be carried on independent data lines, or data lines that are shared (multiplexed) between groups of MPSs.

As noted above in the explanation of a single MEMS pixel sensor 160, the array interface is able to accept a first electrical signal at the first time, supplied from an enabled MEMS pixel sensor electronic device, which is responsive to the first mechanical state of the mechanical device. Likewise, the array interface is able to accept a sequence of electrical signals, supplied from an enabled MEMS pixel sensor electronic device, which is responsive to a sequence of mechanical state undergone by the mechanical device.

If the MEMS pixel includes a memory, the array interface accepts stored electrical signals from enabled MEMS pixel sensors. If some or all of the MEMS pixel sensors include a plurality of mechanical devices, where each mechanical device has a mechanical state responsive to the proximate environment, then the array interface accepts a plurality of electrical signals at a pixel interface from a plurality of electronic devices that have converted each mechanical state into an electrical signal. As explained above, each mechanical device in a MEMS pixel sensor may have a unique mechanical state, responsive to a common proximate environment, so that the array interface accepts a plurality of unique electrical signals from a pixel interfaces, in response to the common proximate environment.

Also as noted above, the array 190 may be formed on a substrate made from a materials such as glass, plastic, quartz, metal foil, thin-film, or dielectric materials.

DESCRIPTION OF PIEZO-TFT PROCESS FUNDAMENTALS

Figure 2I:
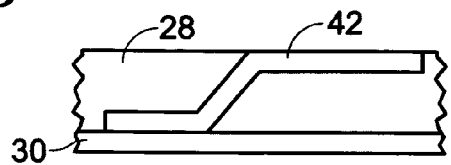
FIGS. 2A through 2O depict aspects of the fabrication processes associated with a MEMS pixel sensor and MEMS pixel sensor array.
Figure 2L:
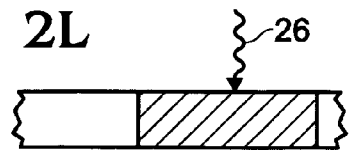
Figure 2J:
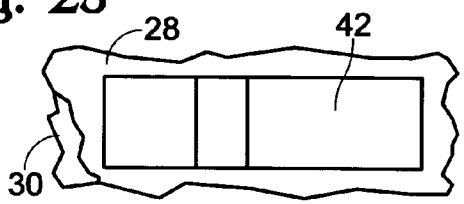
Figure 2M:
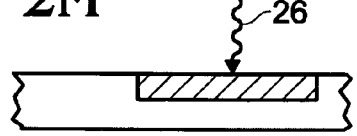
Figure 2K:
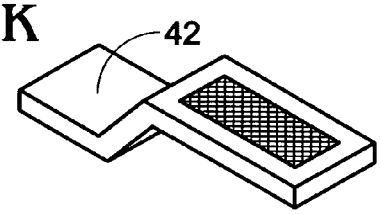
Figure 2N:
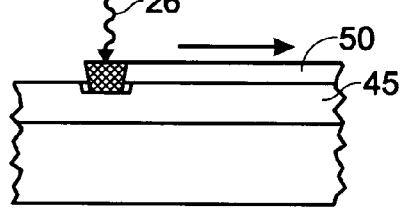
Figure 2O:
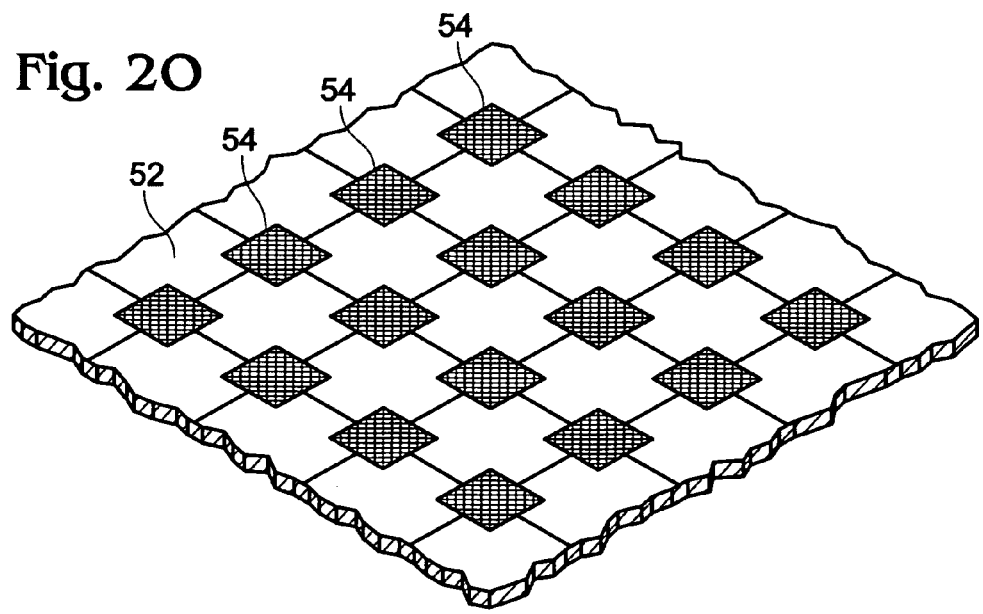

FIGS. 2A through 2O depict aspects of the fabrication processes associated with a MEMS pixel sensor and MEMS pixel sensor array. Turning 2A, illustrated generally at 20 is a system which is employed according to the present invention to implement a methodology for processing the internal crystalline structure of various different semiconductor materials in accordance with the invention, and all for the purpose of creating one or more mechanical devices that are intended to perform respective, predetermined, pre-chosen tasks. Included in system 20 are a block 22 which represents a suitably programmed digital computer, a block 24 which is operatively connected to block 22, and which represents the presence of appropriate laser structure and controls, such as beam-shaping and optics controls using optical or masking methods, fluency controls, angularity controls, and other, for defining the functional characteristics of a appropriate laser beam shown at 26 which is to be employed in accordance with the invention to produce internal crystalline-structure processing of any one of a number of different semiconductor materials, as will be more fully mentioned below. In FIG. 2B, a material for processing is shown generally at 28, with this material having a layer form, and being suitably supported on an appropriate supporting substrate 30 which rests upon, and is anchored to, a three-axis translation table (a driven table) 32.

Table 32 is drivingly connected to a motion drive system, represented by block 34 in FIG. 2A, which drive system is under the control of computer 22. This motion drive system, under the control and influence of computer 22, is capable of translating table 32, and thus material supported on this table, in each of the three usual orthogonal axes known as the X, Y, and Z axes, such axes being pictured at the right side of FIG. 1. Very specifically, control over motion of table 32 is directed by an appropriate algorithm 36 which is resident within computer 22, and which, fundamentally, is equipped to direct a laser beam for processing in accordance with device configuration and device internal mechanical properties that have been chosen and selected, and for which algorithm 36 is especially designed.

The exact nature of the construction of computer 22, of controls 24, of algorithm 36, and of the driven table and the motion drive therefor, form no part of the present invention, and accordingly are not further detailed herein.

Fundamentally, what takes place in the operation of system 20 to produce a given type of mechanical device is that a user selects a particular kind of device to build, selects an appropriate size and configuration for that device, and then determines what are the best and most appropriate internal mechanical properties that should be created in that device in order to enable it to function properly with respect to implementing a selected task. In general terms, the semiconductor materials out of which a particular material can be selected to produce such a device are those whose internal crystalline structures are closely linked to the material's mechanical properties. Specifically, the various useable semiconductor materials are those whose internal crystalline structures can be modified by laser processing to produce desired mechanical properties for a device. Various materials with respect to which the present invention can conveniently and very successfully work will be discussed very shortly, but it might be noted at this point that these materials, with respect to their precursor states, i.e. their states before processing, range from fully amorphous materials through and into a range of various categories of polycrystalline materials.

For example, practice of the invention can begin with precursor material which can fit into any one of the following categories: amorphous, nanocrystalline, micro-crystalline, and polycrystalline. All such materials can be generally described as having an internal crystalline structure which, initially in a precursor state, is less than single crystalline in nature.

Semiconductor materials which can very successfully be processed in accordance with this invention include silicon, germanium and silicon-germanium. For the purpose of further illustration in this description, a manner of practicing the invention, and a device emerging from that practice, will be described in conjunction with full-layer-depth processing of a precursor amorphous silicon material, which will thus be treated as the specific kind of material which is pictured at 28 in FIG. 2A. Also for the purpose of focused illustration herein, this precursor illustrative amorphous silicon material is deployed as an appropriate thin layer on a glass substrate, which is designated by reference numbered 30 in FIG. 2A. Other substrate materials, as will become apparent, may include quartz, various metals, plastics, flex materials, fabrics and others. All of these materials have what are referred herein as relatively low melting (or destruction) temperatures which are well below the melting temperature of the silicon precursor material.

As has already been suggested above, practice of the present invention can produce a wide variety of uniquely configured and constructed semiconductor mechanical devices which can be extremely small in size, ranging down even to a small molecular cluster size. Devices which can be produced include various MEMS devices, micro-mechanical devices that are sensitized to act as sensors for various environmental events, such as chemical and biological events, various motion elements generally, oscillating elements, cantilever beams, actuators, relay switches, and other devices.

With respect to formation of a particular device's three-dimensional configuration, this can be done in any one of a number of conventionally known ways. The exact processes employed to give three-dimensional definition to a finally produced device, as for example to singulate an element from a mass of material in which it has been formed, and/or to individuate (for performance purposes) plural devices in a monolithic array of devices, can take the form of various conventional processes which form no particular parts of the present invention. Thus they are not discussed herein in detail.

For the purpose of illustration herein, processing will be described in the setting, initially, of creating a single micro-mechanical cantilever mechanical device, using single-side, translated laser-beam processing. While various specific types of lasers can be employed such as a excimer laser, a solid-state laser, a continuous-wave laser, and a femto laser, to name several, description will proceed in the context of using an excimer laser.

Describing now a typical practice implemented by the present invention, an amorphous silicon layer having an appropriate precursor thickness is suitably formed on the surface in a glass substrate, such as substrate 30. This assembly is placed on table 32 with appropriate initial alignment, and is then translated relatively with respect to a laser beam, such as excimer laser beam 26, which beam is pulsed during translation of the material relative to the source of the laser beam, to produce full-depth, small-area quick melting and re-crystallizing of the silicon material. An appropriate excimer laser, driven and pulsed at an appropriate pulse rate, and with an appropriate fluency and footprint in the sense of how and with what outlines it strikes the surface of the amorphous silicon material, is directed toward this surface under the control of computer 22, algorithm 36, and controls 24.

In accordance with the desired end-result internal crystalline structure, and in a relative motion sense, the impingement point of this beam from a laser is moved in a defined way over the surface of the amorphous silicon material to produce rapid, full-depth melting and re-crystallizing in a manner designed to achieve the pre-determined desired internal crystalline structure. Employing an excimer laser in this fashion allows one to process material in such a fashion that the high-temperature events are essentially confined very locally to the regions specifically where material melt is occurring. Very little, and no dangerous, temperature rise occurs in the surrounding area, such as within substrate 30, and the whole process can take place in a normal atmospheric environment and completely at room temperature.

FIGS. 2B, 2C, and 2D show several different approaches to implement such laser processing. In FIG. 2B the laser beam strikes the surface of the amorphous silicon material on the upper side which is spaced away from supporting substrate 30. Processed material is shown cross-hatched. In FIG. 2C dual-sided processing takes place with two laser beams cooperating on opposite sides of the material, with the lower beam effectively processing the underside of the silicon material through the transparency afforded by glass substrate 30. Such dual-sided laser processing effectively allows melting and re-crystallizing to take place simultaneously on opposite sides of the supported silicon material, and with each laser, therefore, requiring only a portion of the power required for similar processing to take place under the influence of a single laser beam. Where a mask is employed for beam shaping, this dual-laser approach promotes longer-term durability of such a mask—a typically expensive device, and which is subject to significant degradation at high laser power levels. Two-sided dual-beam processing can also be effective to allow processing to be performed in otherwise difficult to reach areas with just a single processing beam.

In FIG. 2D single-side processing is demonstrated where, in this case, the processing laser beam is directed toward the silicon material from the bottom side (i.e. the substrate supported side) of this material.

FIG. 2E illustrates single-side, less than full-depth processing of the silicon material, here employed to create ultimately a mechanical device which effectively becomes a device that is composited with unprocessed material lying beneath it, as illustrated in FIG. 2E.

FIG. 2F, 2G, 2H show different manners of modifying the kinds of laser processing illustrated in FIGS. 2B-2D inclusive, and specifically a modified processing approach which employs an additional broad area wash of illumination 38 from another illumination source which could be, but is not necessarily, a laser source. In FIG. 2F this wash of illumination strikes the upper side of the silicon material in companionship with laser beam 26, and is effective essentially to create an overall temperature rise in the silicon material which permits a lower energy laser beam to perform appropriate full-depth processing. In FIGS. 2G and 2H this wash 38 of illumination is directed toward the underside of the silicon material and the supporting substrate, with FIG. 2G illustrating a condition where the substrate support material shown at 40 is not transparent to illumination. In this implementation of the invention, the silicon material which is being processed is heated in a conduction manner through heating of substrate 40. In FIG. 2H, glass substrate 30 is again pictured, and here, the wash 38 of illumination passes through this substrate to heat the silicon material above the substrate directly.

According to practice of the invention, once a particular semiconductor mechanical device to build has been decided upon, the desired three dimensional configuration of this device is chosen, and algorithm 36 is designed to direct laser processing in such a fashion as to create a regional volume of material within the processed material on the substrate adequate for the ultimate individuation and singulation, if that is what is desired, of an end-result mechanical device. With such a chosen device configuration in mind, the most desired internal mechanical properties are predetermined, and algorithm 36 is also constructed so that it will control the operation of a laser beam, such as beam 26, to produce internal melting and re-crystallization in order to achieve an internal crystalline structure that will yield the desired mechanical properties. In some instances, it may be more appropriate to create differentiated regions of crystalline structure within a device being built in order to produce different specific mechanical properties in different within that material. Such is entirely possible utilizing the processing approach which has just been outlined above.

FIGS. 2I and 2J show a side cross section and an idealized top plan view of a stylized cantilever-beam mechanical device 42 which has been so defined by processing within the body of silicon material 28.

FIG. 2K, in an idealized fashion, isolates an illustration of cantilever beam 42, and shows by way of suggestion, produced by the darkened patch which appears in FIG. 2K, how an appropriate event sensor, such as a chemical sensor, a biological sensor, and other kinds of sensors could be applied, in any suitable manner, to the beam so as to respond to selected environmental events in a manner which causes deflection in the beam. The present invention is not concerned with the specific kinds of sensitivity for which a device, such as beam 42, is to be prepared, and thus details of how sensitizing can take place are not presented herein.

FIG. 2K can also be read to illustrate yet another interesting component offering of the present invention which is that it is possible to create within the mechanical body of the device, such as cantilever beam 42, an electronic device, such as a semiconductor transistor which can be thought of as being represented by the darkened patch appearing in FIG. 2K.

FIGS. 2L and 2M illustrate use of the invention to modify internal crystalline structure inside a bulk material 43, either with a full-depth approach (FIG. 2L) or with a partial-depth approach (FIG. 2M) in accordance with the invention. These two figures are included here to help establish a part of the underlying background of this invention.

FIG. 2N illustrates still another processing approach which utilizes a single-crystalline material seed 44 which rests in a tiny indentation formed in an appropriate layer 45 of a supporting material, such as silicon dioxide. See 44 lies adjacent an amorphous layer 50 of silicon. Laser processing takes place with initial illumination of the seed, followed by the laser-beam progression from the seed in a defined pattern over the amorphous silicon material. This action causes the single crystalline character of the seed 44 to become telegraphed into the internal structure of silicon layer 50, thus to characterize the internal crystalline structure in this layer to make it more nearly single crystalline in structure at the conclusion of processing.

FIG. 2O illustrates, in simplified fragmentary form, a monolithic layer structure 52 of processed, initially amorphous material which as been processed in an array fashion, and at discrete locations, to create a monolithic array of mechanical devices such as the devices shown at 54. While it is certainly possible that each and every one of devices 54 is essentially the same in construction, and intended to perform the same kind of function, it is entirely possible, according to practice of the invention, to differentiate the functionalities and thus the structures of these arrayed elements.

It should thus be apparent that a unique process capable of creating a wide range of unique mechanical devices, down to small molecular cluster devices, with a high degree of precise control over internal mechanical properties, is made possible by the present invention. Also made possible is the opportunity to do this insofar as laser processing is involved, in a completely atmospheric environment and at room temperature, and also in a manner which is one that does not attack and destroy supporting structure, such as substrate structure.

Accordingly, while several embodiments and manners of practicing the invention, and a system for doing all of this, have been illustrated and described herein, it is appreciated that variations and modifications may be made without departing from the spirit of the invention.

DETAILED DESCRIPTION OF MEMS DEVICE PACKAGING

Figure 3A:
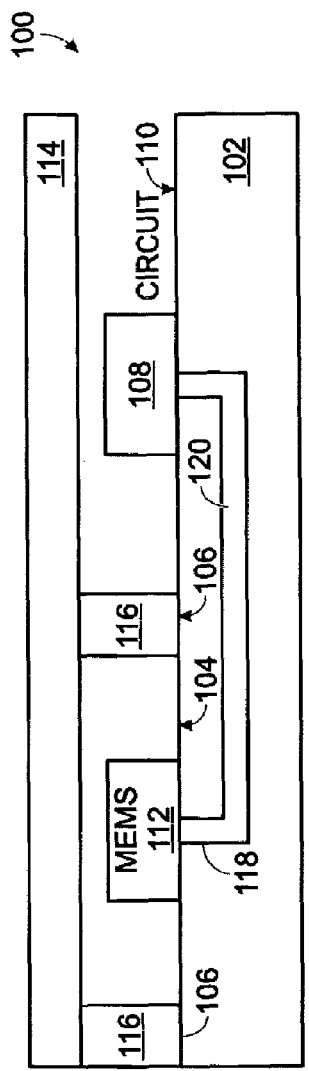
FIGS. 3A through 3N are views depicting an integrated circuit (IC) system with an integrated MEMS pixel sensor.
Figure 3B:
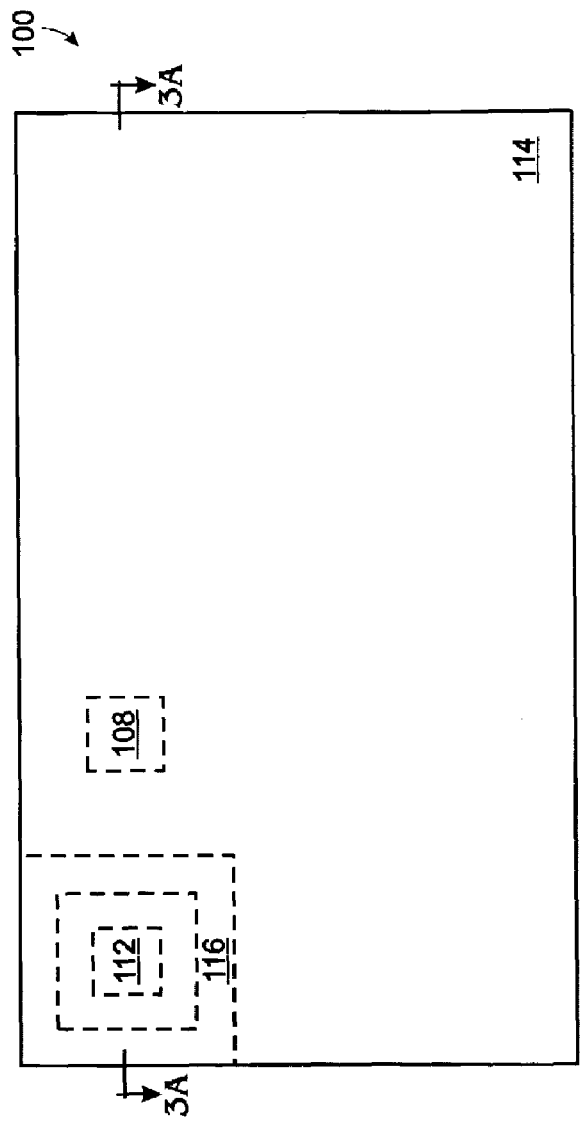
Figure 3C:
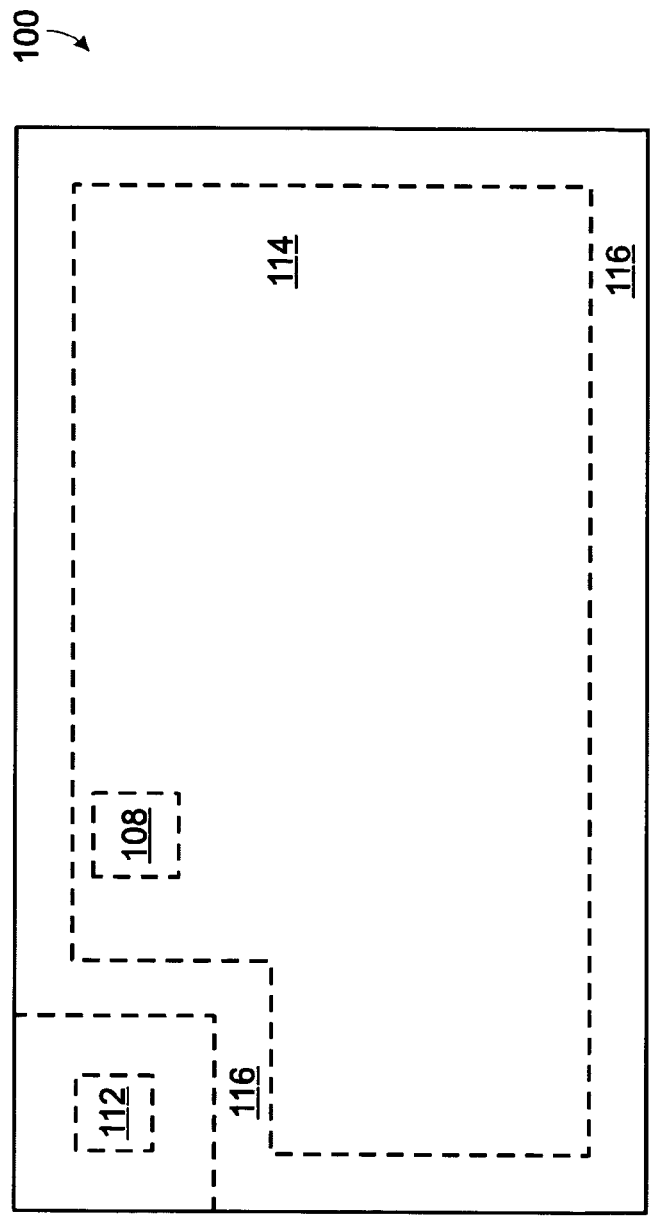
Figure 3D:
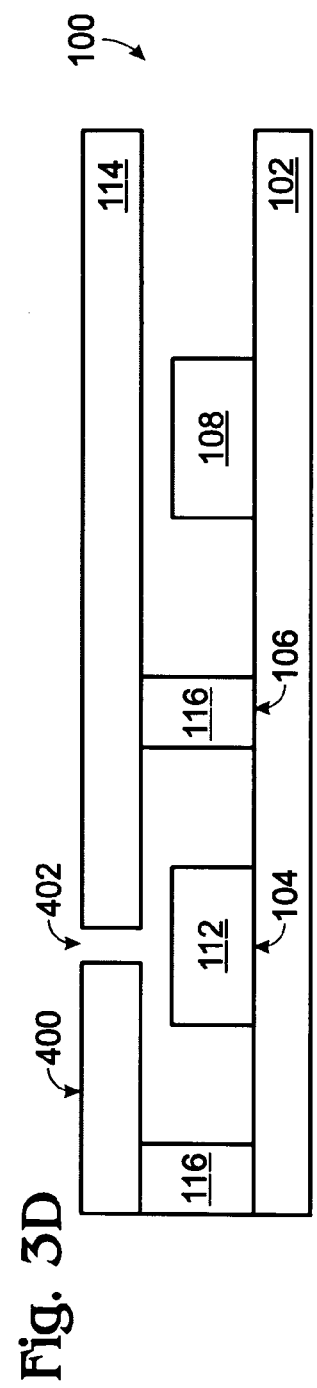
Figure 3G:
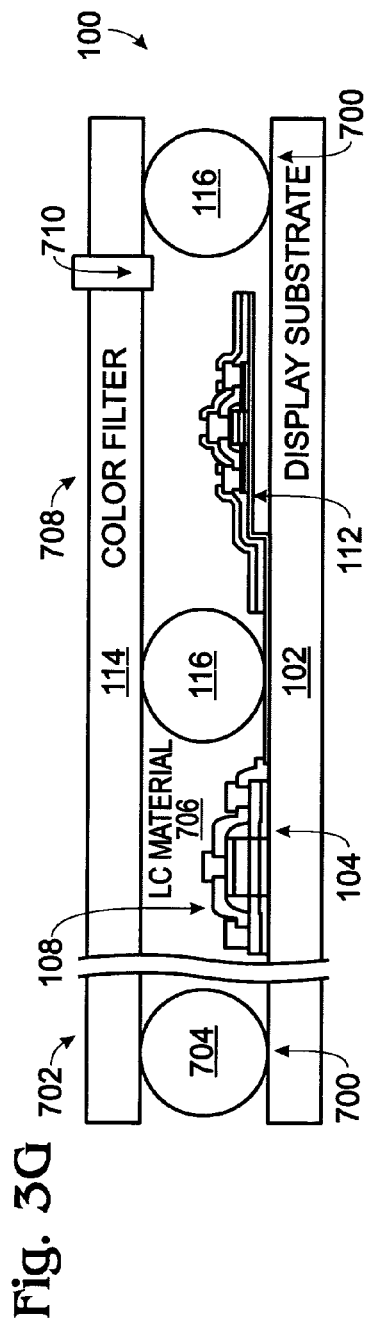
Figure 3H:
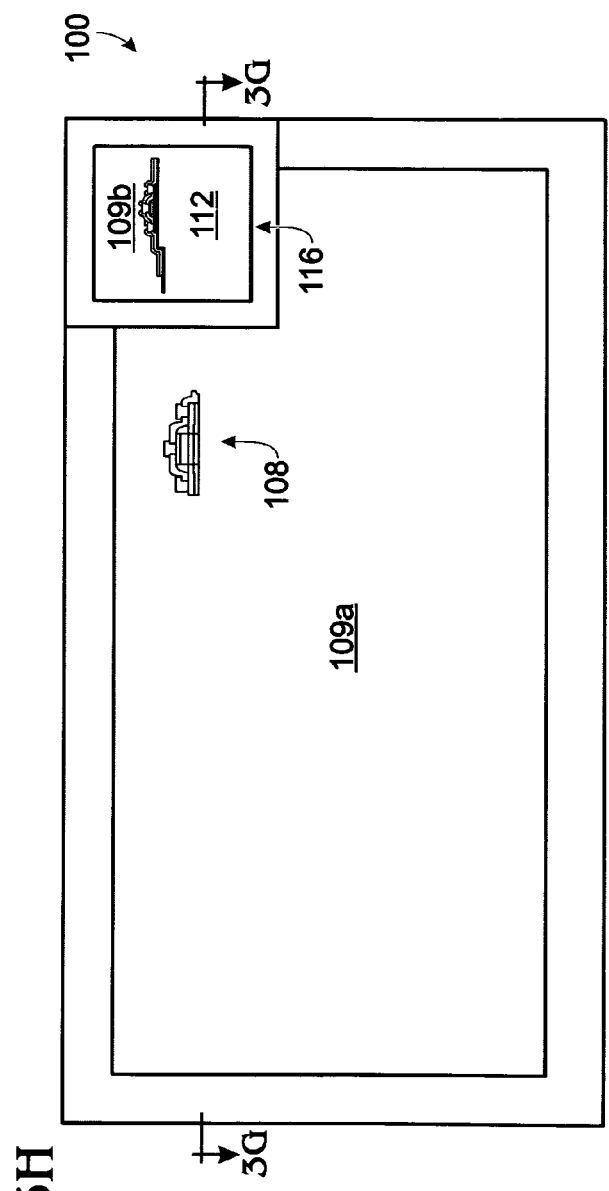
Figure 3M:
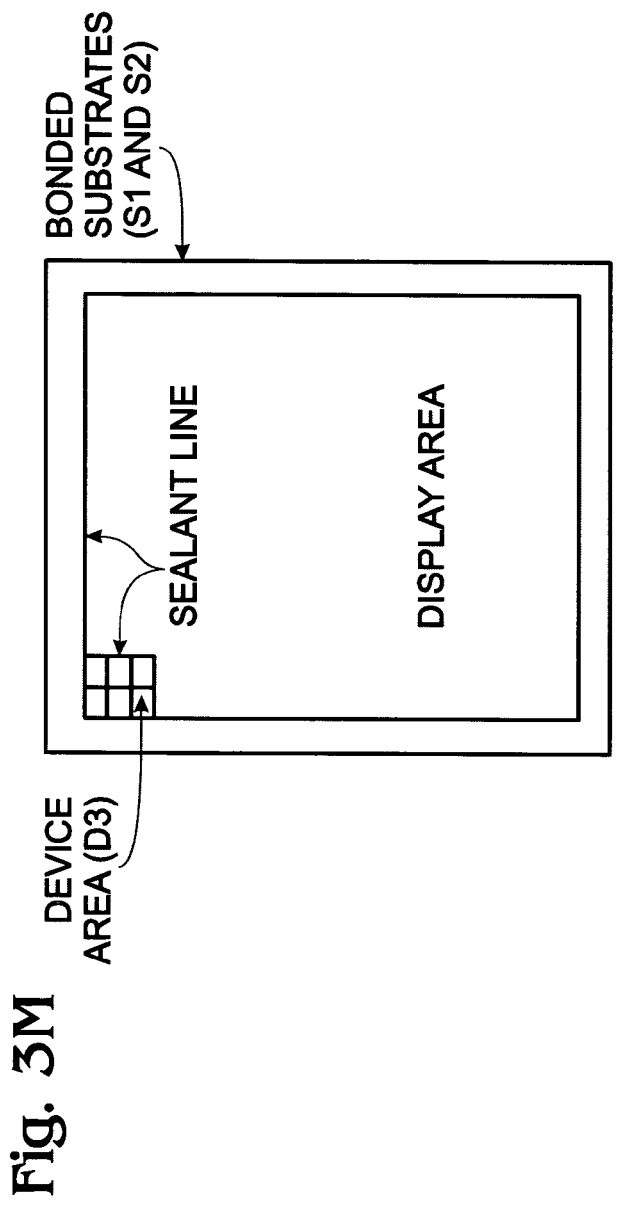
Figure 3N:
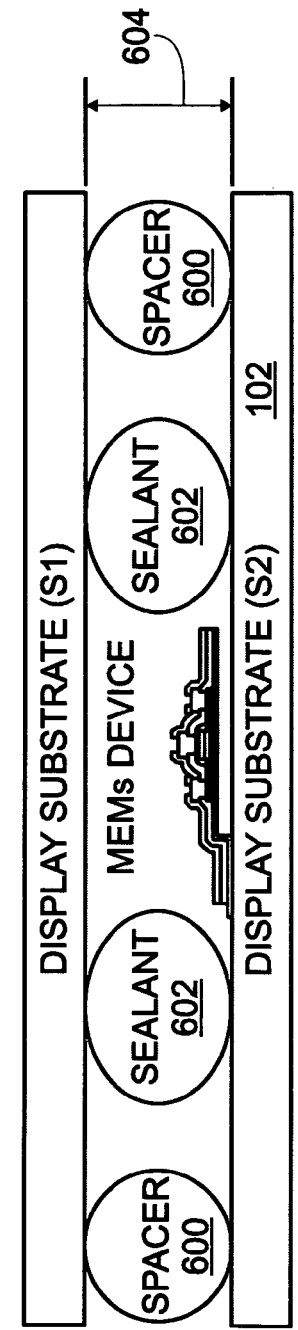

FIGS. 3A through 3N are views depicting an integrated circuit (IC) system with an integrated MEMS pixel sensor. For example, the IC system may be a display backplane, such as the active electronic devices fabricated on a substrate and used as the backplane of a liquid crystal display (LCD). FIGS. 3A and 3B are partial cross-sectional and plan views, respectively, of an integrated microelectromechanical system (MEMS) device package. The MEMS integrated package 100 comprises a first substrate 102 having a first region 104 with boundaries 106. An electrical circuit 108 is formed on a second region 110 of the first substrate 102. The electrical circuit 108 is electrically connected to the first substrate 102. For example, traces in the first substrate may conduct dc power, ground, and electrical signals to the electrical circuit 108. A MEMS device 112 is shown on the first region 104, electrically connected to the first substrate 102. The boundaries 105 may, or may not completely form a perimeter that surrounds the MEMS device 112. A second substrate 114 overlies the first substrate 102. A wall 116 is formed along the first region boundaries 106, between the first substrate 102 and second substrate 114.

In its simplest form, the first substrate 102 is a one-sided board with electrical traces on one of the surfaces. In this case, the electrical circuit 108 and the MEMS 112 may be dice that are attached using ball grid array (BGA) connections, or electrically connected using thin-film processes such as metal deposition and selective etching. Typically however, the first substrate is made from multiple electrical layers separated by interlevel dielectrics, as is common in CMOS and thin-film processes. Low-temperature thin-film processes are often used if the first substrate is glass, plastic, or quartz, as would be the case if a liquid crystal display (LCD) is being fabricated. As shown, the MEMS 112 is connected through via 118 and interlevel trace 120 to the electrical circuit 108.

In some aspects, the electrical interconnection between the MEMS 112 and the electrical circuit 108 may carry an electrical signal. For example, the MEMS 112 may trigger the gate of a TFT electrical circuit. In other aspects, the MEMS 112 and the electrical circuit 108 merely share common dc voltages and grounds (the MEMS does not electrically communicate with the electrical circuit). In another aspect, the MEMS 112 may be electrically connected to other circuit boards via a connector to the first substrate 102 (not shown). For example, the MEMS device 112 may be a microphone mounted on the LCD screen of a cell phone, in communication with the cell phone transmission circuitry.

FIG. 3C is a plan view showing an alternate configuration of the wall separating the MEMS from the electrical circuit. The wall 116 may completely enclose the MEMS 112, with the first substrate 102, the second substrate 114, along the first region boundaries 106, as shown. That is, the combination of substrates and wall form a cavity in which the MEMS 112 is seated. In one aspect, the wall hermetically seals the MEMS device 112 between the first substrate 102 and second substrate 114 along the first region boundaries 106. Alternately as shown in FIG. 3C, the MEMS 112 is separated from the electrical circuit because the electrical circuit 108 is completely enclosed by wall 116. Such an integrated package acts to generally protect the MEMS 112 while exposing it to the ambient environment. The wall 116 may hermetically seal the electrical circuit 108.

FIG. 3D is a cross-sectional view depicting a first alternate aspect of the integrated package of FIG. 3B. The second substrate 114 has a third region 400 with an opening 402, overlying the first substrate first region 104. The opening 402 exposes the MEMS device 112 to an environment. For example, the MEMS 112 may be an environmental sensor. The wall 116 isolates the MEMS device 112 from the electrical circuit 108 along the first region boundaries 106. It may be undesirable that the electrical circuit is exposed to the environment seen by the MEMS. For example, the MEMS 112 may be microphone exposed to the ambient environment via opening 402.

FIG. 3E is a cross-sectional view depicting a second alternate aspect of the integrated package of FIG. 3B. Here, the MEMS 112 is a micro-fluidic MEMS, depicted as a piezo-TFT cantilever. The second substrate opening 402 exposes the micro-fluidic MEMS to a fluid environment. The integrated package 100 may be immersed in a fluid, or as shown, the fluid is introduced to the opening 402 through a tube 500.

As shown, the electrical circuit 108 on the second region 110 of the first substrate 102 is an active circuit including a TFT, electrically connected to the MEMS 112 via a trace 504. The wall 116 along the first region boundaries 106 separates the TFT 108, exposed to a first environment, from the MEMS 112, exposed to a second environment. For example, the first environment can be ambient atmosphere and the second environment can be a fluid. As shown, in some aspects the wall 116 is a cured sealant.

FIG. 3F is a partial cross-sectional view of a variation in the integrated package of FIG. 3B. In some aspects, the wall 116 includes uniformly-sized spacers 600 embedded in a cured sealant 602, to maintain a uniform distance 604 between the first substrate 102 and the second substrate 114. Alternately, as shown in FIG. 3N, a plurality of uniform-shaped spacers applied to the first (or second) substrate 102. The wall is a cured sealant 602, with a uniform height 604 between the first and second substrates, response to the spacers 600.

FIGS. 3G and 3H are partial cross-sectional and plan views, respectively, of a liquid crystal display (LCD) integrated package. FIG. 3G is not exactly drawn to the scale of FIG. 3H. The first substrate 102 is an LCD display substrate (i.e., glass) with a perimeter 700. As in FIG. 3B, the MEMS 112 is enclosed by wall 116. The second substrate 114 is a color filter substrate with a perimeter 702. Perimeter 700 cannot be seen in FIG. 3H, but is approximately underlies perimeter 702 (substrate 102 cannot be seen in the plan view). A seal 704 is formed along the perimeters 700/702 of the display substrate 102 and color filter substrate 114. A cavity 706 is formed between the display substrate 102 and the color filter substrate 114, bounded by the seal 704. In one aspect, the cavity 706 is filled with liquid crystal material. In this case, the wall prevents the liquid crystal material from coming in contact with the MEMS 112.

In one aspect as shown, the color filter substrate 114 has a third region 708 with an opening 710 through the substrate, overlying the first substrate first region 104. For example, the MEMS device 112 can be a MEMS microphone. However, other types of MEMS devices can be package integrated into an LCD.

Alternately stated, the MEMS device 112 can be MEMS pixel sensor (see FIG. 1A), which has been formed on a substrate 100, along with a display backplane 102 that includes electronic devices 108. In one aspect, an integrated package, presented by the combination of elements 102, 114, 704, and 116 hermetically seal the display backplane 102 (more particularly, the elements 108) from the proximate environment.

Expressed in another manner, FIGS. 3G and 3H depict one variation of a display backplane 102 with an integrated MEMS pixel sensor 112. The display backplane 102 comprises a substrate 100 and electronic devices 108 associated with the display backplane 102, such as driver and pixel gating transistors, are fabricated on a first region 109a of the substrate 100. A MEMS pixel sensor 112 is fabricated on a second region 109b of the substrate 100. The MEMS pixel sensor 112 includes a mechanical device having a mechanical state responsive to a proximate environment (see FIG. 1A), an electronic device for transceiving between mechanical states and electrical signals, and a pixel interface to supply power to the electronic device and to transceive electrical signals. For example, the MPS 112 may be a microphone, a device that measures temperature, or a device that measures light intensity, to adjust the display backlighting.

An integrated package fabricated from elements 102, 114, 704, and 116 hermetically seals the electronic devices 108 in the first region 109a of the substrate 100 from the proximate environment. Several other examples of other mechanical packages are presented in FIGS. 3A through 3N. The MEMS pixel sensor mechanical device can be a microphone, fluidic sensor, acoustic speaker, radio frequency (RF) filter, RF antenna, accelerometer, gyroscope, chemical sensor, temperature sensor, humidity sensor, pressure sensor, light sensor, actuator, DNA sensor, biological sensor, or gyroscope.

FIGS. 3I and 3J are partial cross-sectional and plan views, respectively, of an alternate aspect of the integrated package of FIGS. 3A and 3B. The first substrate 102 includes a plurality of regions with boundaries. Shown are regions 800, 802, and 804, with respective boundaries 806, 808, and 810. The MEMS integrated package 100 further comprises a plurality of MEMS devices 812, 814, and 816 on the first substrate 102, each in a corresponding region. A plurality of walls 818, 820, and 822 are formed around the boundaries of a corresponding region of the first substrate.

FIG. 3K is a partial cross-sectional view showing an alternative wall design. The first substrate 102 includes a groove 900 formed along the first region boundaries 106. Likewise, the second substrate 114 includes a groove 902 formed in a region opposite the groove 900 in the first substrate 102. In this case the wall 116 is an O-ring seated in the first and second substrate grooves 900/902. This arrangement permits a seal to be formed by merely clamping the substrates 102/114 together. Although only sealant and O-ring walls have been specifically depicted, the integrated package is not limited to any particular wall design. In some aspects not shown, the wall is formed by the deposition and selective etching of field oxide. Alternately, the wall can be formed in conventional LC display substrate fabrication processes.

FIG. 3L is a perspective drawing showing a wall formed as part of a prefabricated separating assembly. A boundary assembly 300 is shown having the shape matching the first regions boundaries 106, and having a height 302. Note, the assembly can be made from separate pieces that may, or may not interlock. The assembly pieces can be a conventional rigid, semi-rigid, or even flexible plastic material. In this aspect, the wall 116 comprises the boundary assembly 300 attached to the first substrate 102 along the first region boundaries 106, separating the first substrate 102 from the second substrate (not shown for clarity) by the boundary assembly height 302. The boundary assembly can be fixed in place by an adhesive or held in place by substrate friction.

Although only microphone and fluidic MEMS devices have been specifically depicted, the present invention integrated package is not particularly limited to any type of MEMS or MEMS function. For example, other MEMS that can be packaged include an acoustic speaker, a radio frequency (RF) filter, an RF antenna, an accelerometer, a gyroscope, a chemical sensor, a temperature sensor, a humidity sensor, a pressure sensor, a light sensor, an infrared sensor, or an actuator.

Conventionally, MEMS on display are packaged as discreet components in IC-like packages and then attached to the system using standard IC packaging assembly techniques. This invention teaches a new way to establish the MEMS package on the display itself, by utilizing the existing display assembly process to create the package, resulting in a no-cost package for the MEMS device. Given the high cost of typical MEMS packages, this invention has a clear advantage for display integration and system level cost reduction.

FIGS. 3M and 3N are plan and partial cross-sectional views, respectively, depicting the encapsulation of a MEMS device on a display substrate. Note, the MEMS device area (D3) is not to scale in FIG. 3N. The actual device area is much smaller, so as to not interfere with the display operation. The invention creates a MEMS (or other device) encapsulation/package on a display substrate by using the standard cell processing in the LCD manufacturing process. The MEMS can be either monolithically fabricated on the display substrate during the array process, or transferred after the array process is complete. The MEMS devices are encapsulated during the display cell process, with display substrates on the top and bottom and sealant (bounding the glass substrates together on the sides).

Referencing FIGS. 3M and 3N, an exemplary fabrication process follows.

1) A MEMS device (or other mechanical, electrical or optical device) is attached to a display substrate (S1), either through monolithic fabrication of the MEMS device during array fabrication or transfer of the device to Si after array fabrication.
2) A counter substrate (S2) (color filter substrate in the case of many LCD display processes) is prepared for mating to the first substrate (S1), to form a display device. Prior to bonding S1 and S2, spacers are applied to one of the substrates to maintain even separation between S1 and S2 after bonding. This is a standard LCD cell process.
3) A sealant is applied to either S1 or S2, forming the outline of at least one display area and at least one separate area for devices (D3), such as MEMS.
4) S1 and S2 are bonded together forming a display device and an encapsulated package for the devices area (D3), bounded on the sides by the sealant and the top and bottom by S1 and S2.
5) The display area likely undergoes further processing, such as injection of liquid crystal material (in the case of LCD display). However, D3 can be protected from these additional processes by the encapsulation.
6) D3 can possibly be a vacuum package, depending on the processing steps and environment of the processes that bond S1 and S2.
7) If it is desirable to expose device area D3 to the environment, then one or both S1 and S2 may be pre-drilled in the area of D3 to provide this condition. This is desirable in the case where D3 houses an environmental sensor, for example.
8) Because the device area (D3) and the display area are separately encapsulated, there is no cross contamination.

Another aspect of the invention uses the encapsulation method for the integration of devices (such as MEMS) through some sort of transfer process. For example, in the case of amorphous silicon displays, the MEMS device might be fabricated on another substrate and later transferred to the display substrate. Subsequent to this transfer there are additional process steps to integrate the electrical and mechanical devices, followed by the final encapsulation process. Although LCD displays have been used as an example, in other aspects the present invention packaging technique can also be used OLED, electrophoretic, FED, and other types of displays.

In a different aspect, multiple device areas can be created using the above-mentioned techniques to accomplish one of the following:

1) Packaging areas can be separated by functionality. For example, one packaged device area can be a vacuum package, containing MEMS devices requiring a vacuum environment, and another is exposed to the environment (containing environment sensors), through holes drilled in one of the glass substrates.
2) Packaging areas can be separated by a defined distance, but linked by operation. For example, a first device area might contain a MEMS microphone. A second, separate, device area might contain a second MEMS microphone. Because the exact spatial relationship between the devices is controlled within the stringent limits of a photolithography process, the two devices can be coupled into a system solution. In the case of microphone example, the acoustic input can be coupled and the known microphone spatial relationship used to sense from where a particular sound is coming. The sound source data can be used to accomplish some desired result.

FIG. 4 is a flowchart illustrating a method for packaging a MEMS device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Various steps in the method may be better understood in the context of the explanations of FIGS. 2A through 3N, above. The method starts at Step 1100.

Step 1102 provides a first substrate having a first region with boundaries. Step 1104 forms an electrical circuit on a second region of the first substrate, electrically connected to the first substrate. Step 1106 integrates a MEMS device (MEMS pixel sensor) on the first region, electrically connected to the first substrate. Some examples of MEMS devices include an acoustic speaker, a microphone, a radio frequency (RF) filter, an RF antenna, an accelerometer, a gyroscope, a chemical sensor, a temperature sensor, a humidity sensor, a pressure sensor, a light sensor, an infrared sensor, and an actuator. Step 1108 provides a second substrate overlying the first substrate. Step 1110 forms a wall along the first region boundaries, between the first and second substrate.

In one aspect, forming the electrical circuit in Step 1104 includes forming an electrical device using thin-film processes. Step 1106 integrates the MEMS device on the first region using thin-film processes, simultaneous with the formation of the electrical device. Alternately, integrating the MEMS device on the first region in Step 1106 includes substeps (not shown). Step 1106a forms the MEMS device (i.e., in a process independent of the electrical circuit (Step 1104). Step 1106b attaches the MEMS device to the first substrate first region. Step 1106c forms electrical interconnections between the MEMS device and the first substrate using thin-film processes.

In one aspect, forming a wall along the first region boundaries in Step 1110 includes enclosing the MEMS device between the first substrate, the second substrate, and the wall. For example, the MEMS device can be hermetically enclosed.

In a different aspect, Step 1108 provides a second substrate having an opening overlying the first substrate first region. In this aspect, Step 1106 integrates a MEMS environmental sensor. Step 1110 forms a wall along the first region boundaries using the following substeps (not shown). Step 1110a isolates the MEMS device from the electrical circuit, and Step 1110b exposes the MEMS device to a first environment via the second substrate opening. For example, Step 1106 may integrate a micro-fluidic MEMS, and Step 1110b exposes the micro-fluidic MEMS to a fluid environment.

In another example, Step 1104 forms an active circuit including a TFT, electrically connected to the MEMS. Then, forming a wall between the first and second substrate along the first region boundaries in Step 1110 includes alternate substeps (not shown). Step 1110c exposes the MEMS to a first environment. Step 1110d exposes the TFT to a second environment.

In another aspect, Step 1110 forms a wall along the first region boundaries using the following substeps. Step 1110e applies a sealant along the first region boundaries, and Step 1110f bonds the first substrate to the second substrate. In one variation, Step 1110g applies uniformly shaped spacers to the first substrate and Step 1110h maintains a uniform distance between the first and second substrates in response to the spacers. Alternately, forming a wall in Step 1110 includes other substeps. Step 1110i forms a groove in the first substrate along the first region boundaries, and Step 1110j forms a groove in the second substrate, opposite the groove in the first substrate. Then, Step 1110k seats an O-ring in the first and second substrate grooves. Note, the grooves may also be preformed in the substrates that are provided in Step 1102 and 1108.

In one specific example, Step 1102 provides a liquid crystal display (LCD) display substrate with a perimeter, and Step 1108 provides a color filter substrate with a perimeter. Then, Step 1112 seals the display substrate to the color filter substrate along the perimeters to form a cavity. Step 1114 fills the cavity with a liquid crystal material. In one variation of this example, Step 1108 provides a color filter substrate having an opening through the substrate, overlying the first substrate first region, and Step integrates a MEMS microphone.

In another aspect, Step 1102 provides a first substrate with a plurality of regions with boundaries, and Step 1106 integrates a plurality of MEMS devices on the first substrate, each in a corresponding region. Then, Step 1110 forms a wall around the boundaries of each region of the first substrate.

In another aspect, forming a wall along the first region boundaries in Step 1110 includes: providing a boundary assembly having a shape matching the first region boundaries and a height; and, attaching the boundary assembly to the first substrate, overlying the first region boundaries, separating the first substrate from the second substrate by the boundary assembly height.

An integrated MEMS package and MEMS packaging method have been provided. Examples of particular MEMS devices and electrical circuits have been given to help illustrate the invention. However, the invention is not limited to merely these examples. Other variations and embodiments of the invention will occur to those skilled in the art.

DETAILED DESCRIPTION OF THE PIEZO-TFT MEMS

FIG. 5 is a partial cross-sectional view of a piezo thin-film transistor (piezo-TFT) cantilever microelectromechanical system (MEMS). The piezo-TFT cantilever 100, which is one example of a MEMS pixel sensor, comprises a substrate 102, made from a material such as glass, polymer, quartz, metal foil, Si, sapphire, ceramic, or compound semiconductor materials. A thin-film cantilever beam 104 has a distal end 106, anchored to the substrate 102, and a proximal end 108. Note, in other aspects not shown both the distal end and the proximal end can be anchored to substrate. Also, the shape of the cantilever body can be a simple beam shape, any membrane shape, or combinations of beam shapes and membrane shapes, with one or multiple anchors to the substrate. A TFT 110 is shown within the cantilever beam 104. The cantilever beam 104 and TFT 110 are made from materials such as a-Si, poly-Si, oxides, a-SiGe, poly-SiGe, metals, metal-containing compounds, nitrides, polymers, ceramic films, magnetic films, or compound semiconductor materials. The above-mentioned lists are not intended to be an exhaustive list of every possible material, but rather some examples of conventional thin-film materials that can be used.

The cantilever beam 104 has a top surface 112 and a bottom surface 114. As used herein, the phrase "a TFT within the cantilever beam" means that the cantilever TFT 110 has a location at least partially on the cantilever beam top surface 112, at least partially on the cantilever beam bottom surface 114, or embedded within the cantilever beam 104.

FIG. 7 is a partial cross-sectional view of the piezo-TFT cantilever 100 of FIG. 5, with the cantilever TFT 110 located on the cantilever top surface. In one aspect, the cantilever beam 104 includes a first thin-film layer 200 with a first stress level and a second thin-film layer 202 with a second stress level overlying the first layer. As shown in FIG. 2, the first and second layers 200/202 are a Si oxide material. Other likely materials include Si and Si nitride.

In some aspects, a temporary sacrificial layer 208 overlies the substrate 102. A cavity 204 is formed between the first layer 200 and the substrate 102 in response to removing the temporary sacrificial layer. The temporary sacrificial layer can be a material such as AlN, Si, SiGe, polymers, dielectrics, Al, or ceramics.

The differences in stress between the first layer 200 and the second layer 202 are managed to ensure that the cantilever bends "up", so that it does not bend down and stick to the substrate. These built-in stresses act upon the cantilever TFT active Si regions and result in electron mobility enhancement. This mobility enhancement is reflected in the TFT static characteristics, making the TFT more sensitive to any longitudinal strain change caused by external forces, temperatures, chemical reactions and the like, acting upon the cantilever beam 104. In other words, the built-in stress of the cantilever helps to enhance the static characteristics of cantilever TFT via straining the active Si region to enhance the electron mobility. Any longitudinal strain change caused by external forces, temperatures, chemical reactions and the like, acting upon the cantilever beam 104 results in additional electron mobility changes, on top of the static electron mobility induced by the built-in stress. In this manner, the stress change acting upon the active Si region can be determined as a result of measuring changes in TFT characteristics. The cantilever with TFT converts external physical variables such as forces, velocities, accelerations, rotations, temperature changes, surface tension changes, photon input, and the like, to electrical signals.

Thus, the cantilever TFT 110 may be considered a cantilever strain-sensing TFT. More specifically, the cantilever TFT 110 senses changes in strain. In one aspect, the piezo-TFT cantilever 100 may further comprise a strain-reference TFT 210 overlying the substrate 102 and adjacent the cantilever beam 104. For example, the electrical characteristics of the reference TFT 210 may be compared to the strain-sensing TFT 110 in order to determine the degree of stress change present on the cantilever beam 104. For example, the strain-sensing TFT 110 and strain-reference TFT 210 may be a CMOS transistor pair, or part of a MOS circuit.

In a different aspect, the sacrificial layer that overlies the substrate 102 comprises a temporary region 208a that is etched away, and a permanent region 208b (that is not etched). A strain-reference TFT 212 overlies the permanent region of sacrificial layer 208b. This method of fabrication may permit the strain-reference TFT 212 to act as a better reference, as the underlying layers of the two TFTs are more similar.

The cantilever TFT 110 includes a channel region 220 and source/drain regions 222 formed in an active Si region 224. In some aspects, the TFT active Si region 224 and the cantilever beam 104 may both include laser annealed materials. Thus, the Si active region 224 may be annealed to alter electrical characteristics by controlling the grain sizes. In some aspects, the first active Si region can be merged to either the first layer or the second layer by partially annealing selected regions when either the first layer or the second layer is a Si film. By selectively annealing the active regions and non-active cantilever regions, desired electrical and mechanical characteristics on different regions can be managed in the same process step by programming the laser anneal system. Even if the cantilever is made from Si oxide, as in the present example, the oxide layers 200 and 202 may be laser annealed, in the same or different process steps than the annealing of the Si active layer 224, to alter mechanical characteristics of the beam 104. The second layer 202 is selectively etched away over the source, drain, and gate regions of TFT 110, as might be done if interlevel interconnects were to be formed to overlying circuitry. Details of laser annealing processes have been provided in the incorporated related applications. It should be understood that the piezo-TFT cantilever fabrication may be enabled using an convention annealing or laser annealing procedure.

FIG. 6 is a partial cross-sectional view of a variation of the piezo-TFT cantilever 100 of FIG. 7. As shown, the cantilever TFT 110 includes a channel region 300 and source/drain regions 302 formed in an active Si region 304 (defined with layer 202 with dotted lines). The TFT active Si region 304 is part of a cantilever beam Si layer. As shown, active Si region 304 is a portion of the second layer 202. Thus, in this example, the second layer 202 is Si. The active Si region 304 and second layer may both undergo laser annealing processes. The annealing may occur is the same or separate annealing processes. Even if annealed in the same process step, the two regions may be subject to different fluences, time durations, or number of laser shots. In this manner, the grain size in the active region 304 can selectively be made larger than in the Si second layer 202. Also, this laser annealing process permits the mechanical characteristics of the second layer 202 (or first layer 200) to be altered independent of the rest of the materials on the substrate. Additional details and variations of the piezo-TFT cantilever of FIGS. 5-7 are presented below.

As part of an on-going MEMS effort, it has been necessary to develop new fabrication processes and to set up new measurement and metrology tools. While the MEMS processes use the same types of films as TFT fabrication, these films and the methods of etching and analyzing them require additional considerations. In particular, the mechanical properties of thin-films are often ignored by engineers who conventionally only work with transistors. New film processes must be developed to support mechanical applications.

Just as solid-state device designers first focus on the electrical properties of any new film before attempting to build active devices using that material (such as low-K dielectrics or copper interconnects) MEMS designers must first focus on the mechanical properties of the films before constructing devices. The most important properties are the film stress, stress gradient (e.g. how much the stress varies from the top of the film to the bottom of the film), stiffness, and behavior in various etchants since at least one material is sacrificed to form a cavity, while other films survive.

Film Stress and Stress Gradient

Two aspects of film quality that must be considered are the stress and stress gradient. These film properties are often ignored by those familiar with bulk and thin-film transistor development, yet they are vitally important to any surface micromachined structure. Typically, when thin-films adhere to each other, no more thought is given to their mechanical properties. When these thin-films are freed of their constraints and are used as structural elements, stress and stress gradient must be taken into account. The thickness of sacrificial film, usually a couple of microns, defines the travel displacement of a MEMS structure. This is typically at least an order of magnitude smaller than the lateral dimensions of the MEMS structure. If the structure is not stress free or gradient free, then it may simply bend down and touch the substrate or other structures. The structure will therefore not function as designed.

Highest yields occur when structures, such as cantilevers, are flat after release, or slightly bent upwards (away from the substrate). The effects of high tensile stress can be catastrophic—the film cracks at the weakest point (typically the anchors), or buckles into an undesirable shape. Most SiO2 deposition recipes, if not optimized, typically have a moderate amount of compressive stress. Amorphous silicon also tends to be compressive, but most sputtered metals are tensile. A film with no average stress may still have a gradient. That is, the top of the film may be compressive and the bottom may be tensile yet the sum of the two stresses is still zero. This gradient must also be zeroed out, or it may induce yet another failure mode into the mechanical system.

The stress in a film and stack of films can easily be determined by measuring the radius of curvature of the film and substrate stack. This technique can be applied to measure the stress gradient in a film stack via measuring its curvature.

Adjusting the Stress and Stress Gradient

Figure 8A:
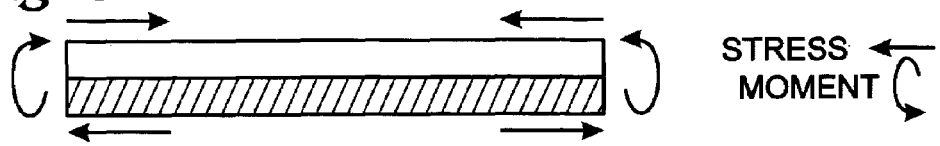
FIGS. 8A through 8C are diagrams depicting an induced stress gradient in a film stack and measurement techniques.
Figure 8B:
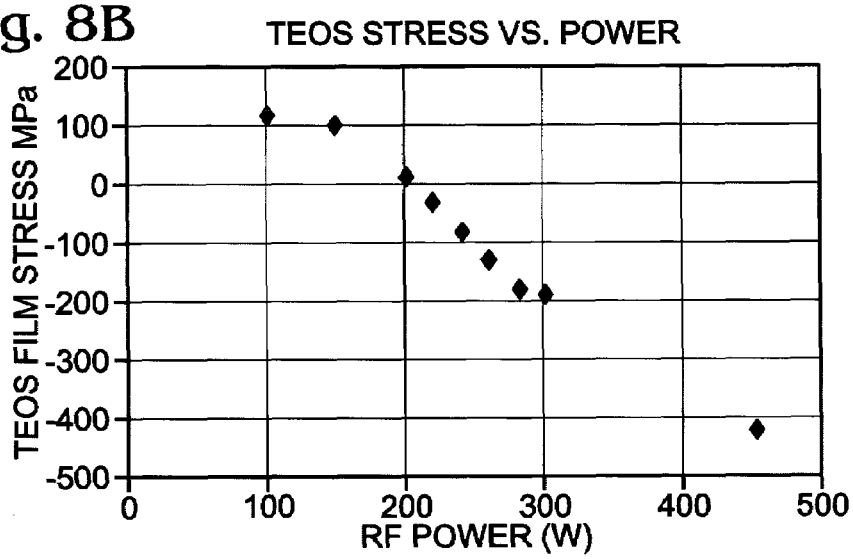
Figure 8C:
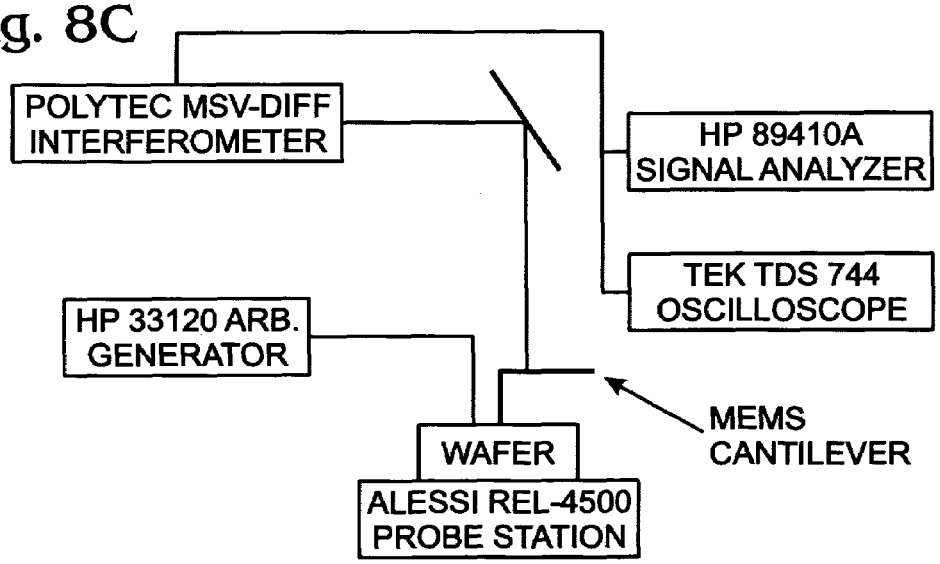

FIGS. 8A through 8C are diagrams depicting an induced stress gradient in a film stack and measurement techniques. In FIG. 8A stress gradient can be induced by depositing a composite structure, where half of the film has one stress and the other half another stress. This structure provides an additional variable to counteract the effects of the inherent stress gradient. If a single film has a downward (positive) stress gradient, a compressive film is deposited below a tensile film, with the same inherent stress gradient, but only half thickness. The stress level difference between these two half thickness films tends to cause the composite to bend upwards (negative gradient), as in the figure. By balancing the induced negative gradient with the inherent positive gradient, a flat stress-free, stress gradient-free film can be formed.

FIG. 8B depicts a graph of film stress vs. RF power. One variable that can be used to adjust the film stress of a TEOS-based oxide film is the RF power during deposition. In the case of the TEOS-based SiO2, reducing the power of the RF source when depositing the film provides a dramatic change in film stress. One recipe with good electrical properties runs at 450 W, producing a film with about −420 Mega Pascal (MPa). By modifying the RF power, the stress can be varied from compressive to tensile. The convention is that negative stress is compressive and positive stress is tensile. Depositing the TEOS at about 200 W produces a film with no stress.

Sacrificial Film Development

To realize even the simplest MEMS structure, two layers of films are often required. One is the structural layer, which forms the final moving MEMS device, and another is the sacrificial layer. The sacrificial layer defines the air gap between the released MEMS structure and the substrate, providing the space for it to travel the specified displacement. The general requirements for sacrificial film are:

1. Sacrificial films should have small thermal expansion coefficient mismatch relative to the corresponding structural film, so that during the structural film deposition and later thermal treatments, very little thermal stress will be introduced to the structural film.

2. Sacrificial films need to be chemically stable: no melting, gassing, decomposition, or alloying with structural film can happen, especially during thermal treatments.

3. Sacrificial films should not be a contamination source for a CMOS cleanroom. This is extremely important for integration of MEMS devices with MOS or TFTs.

4. Sacrificial films should be patternable using standard dry etch or wet etch methods with photolithography photoresist masks.

5. Sacrificial films should be etched using a chemical process which leaves the structural films unmodified, or with a very high etch rate selectivity.

All these requirements limit the available structural film/sacrificial film/release etchant combinations. Some successfully developed structural-sacrificial-etchant combinations are polysilicon (or amorphous silicon)/SiO2/HF, metal/photoresist/oxygen plasma, SiO2 (or SiN)/photoresist(or polyimide)/oxygen plasma.

Two sets of films/etchant combinations have been developed. One is using amorphous silicon as structural film, SiO2 as sacrificial film, and HF as releasing etchant. Another is using TEOS SiO2 as structural film, AlN as sacrificial film and NH$_4$OH (or TMAH) as an etchant.

In the case of a MEMS microphone, the existing TEOS films in the TFT flow can be used as the MEMS structural film, and AlN as the sacrificial film. The final step of MEMS microphone processing is to etch away the AlN sacrificial film. This occurs after all of the other film deposition, patterning, and etch steps have been completed. Otherwise, the microphone membrane can be damaged by improper handling (e.g. mechanical shock) and the AlN might contaminate the active channel or gate oxide.

Depositing AlN simply involves a reactive sputter step, where nitrogen is injected and reacts with the aluminum target in the reactive sputter system. AlN is then sputtered from the target onto the wafer. Another point worth keeping in mind is the "stiction" effect. When drying the wafer after a wet release step, the surface tension of the drying fluid can cause very strong capillary forces. These capillary forces often pull compliant devices down to the substrate, where they stick (from covalent or hydrogen bonds) dropping the yield. Various techniques can be used to reduce the effects of stiction, including using stiffer structural elements, supercritical drying, or hydrophobic monolayer coatings.

The AlN film is deposited on the substrate at low temperature (200 C) using the reactive sputtering system. AlN films can be deposited from 1000 A to 5000 A thick, at stress lower than 300 MPa, with reasonable uniformity. In one wet etch experiment, ammonium hydroxide solution (28%-30%) was used to strip AlN film at room temperature. A 1000 A thick AlN film was etched away in 50 minutes, thus the etch rate is 20 A/min. To increase the etch rate, the 28%-30% ammonium hydroxide solution is heated, and the etch rate increases dramatically. At 65 C, the etch rate is 3325 A/min, which is about 175 fold as high as the rate at 15 C.

Table 2.3 summarizes the stress measurement results of AlN film on several test wafers with different thicknesses. Generally, the stress level of our AlN film is low, meaning that this kind of AlN film can be deposited up to several microns thick, permitting MEMS structures to be formed with various air gap heights.

TABLE 2.3

| Wafer ID | AlN thickness (A) | AlN stress (MPa) | Stress direction |
| --- | --- | --- | --- |
| LCD-AlN-02 | 1000 | 134.7 | Tensile |
| MC003-03 | 5000 | 76.48 | Tensile |
| MC003-04 | 5000 | 53.62 | Tensile |
| MC003-21 | 5000 | 202.1 | Tensile |
| MC003-22 | 5000 | 298.0 | Tensile |
| MC003-23 | 5000 | 175.4 | Tensile |

AlN films can be patterned using standard lithography and RIE etch. AlN films can be wet etched. AlN film does not change its properties when annealed at 650 C. This permits glass substrate surface micromachining techniques to be compatible with the existing TFT processes. In addition to AlN, aluminum and a-Si can be used as a sacrificial material.

Step Coverage

The step coverage of structural films is of vital importance, since this is what anchors it to the substrate. Mechanical systems tend to break at their weakest point. If the step coverage of a structural film is poor, then the film is thinner, and thus weaker, at this point. In general, TEOS-based SiO2 films tend to have excellent conformality. The width of the step coverage can be made 0.766 um with 1 um thick TEOS SiO2 films. This is sufficient to construct a sturdy mechanical anchor. TiN films also have sufficient step coverage over the TEOS step.

Preliminary MEMS Device Operation & Analysis

FIG. 8C is a diagram depicting a piezo-TFT MEMS test set-up. An HP 33120 is used to supply a sinusoidal or square wave input to the probe on the probe station. This probe is connected to probe pads on a wafer with actuatable MEMS cantilevers. This causes the MEMS to move. The Polytec MSV-DIFF interferometric system measures the displacement of the cantilever and outputs a voltage proportional to that displacement. This voltage is monitored by an HP 89410A signal analyzer and Tektronix TDS 744 oscilloscope. The signal analyzer and oscilloscope capture this data and display the displacement in time (oscilloscope) and frequency (signal analyzer).

The distance between the bottom of the transparent TEOS membrane and the top of the reflective substrate produces optical interference at certain distances. This optical property produces constructive and destructive interference, which appears as light and dark bands of fringes. These optical properties provide another means of evaluating MEMS behavior.

The pattern of fringes indicates how the gap changes along the length of the cantilever. When the fringes are spaced closely together, this shows a rapid change of spacing, and distantly spaced (or nonexistent) fringes show very slow change of spacing. The final image shows that the right half of the cantilever has no fringes—this means that the cantilever is flat relative to the substrate (in this case, it is resting directly on the substrate).

Integration of MEMS with TFT

There are two general categories of MEMS processes—bulk micromachining and surface micromachining. Bulk micromachining uses a subtractive process to carve the MEMS structure out of the bulk substrate (typically a silicon wafer). Surface micromachining fabricates the MEMS device using an additive process wherein successive layers of sacrificial layers and thin-films are deposited on top of an unetched substrate. Surface micromachined devices can be fabricated on any substrate compatible with thin-film processing.

MEMS on Glass

The use of glass substrates offers unique opportunities to produce surface micromachined devices with low temperature processes at a much lower cost.

TABLE 3.1

Comparison of Silicon vs. Glass substrates

| Attribute | Silicon substrate | Glass substrate |
|---|---|---|
| Cost | moderate | Low |
| Max substrate size (m$^2$) | 1 | >2.7 |
| Optical properties | Transparent to IR | Transparent to all wavelengths |
| Electrical insulation | poor | Excellent |
| Dielectric properties | poor | Excellent |
| Biological compatibility | poor | Excellent |
| Thermal insulation | poor | Excellent |
| Max temperature | 1400 C. | 650 C. |
| Crystallographic bulk etch | yes | No |

The optical transparency of glass (other than its obvious advantage for displays) permits the creation of novel MEMS devices. For example, it is possible to optically sense the motion of a device through the substrate without requiring through-holes or expensive packaging. MEMS devices can be built on the same substrate as LC displays. This provides opportunities to build other novel devices including a compact ultrasound transducer integrated onto the same substrate as an LCD allowing for easy medical examination, a low-cost glucose monitor with integrated LCD readout for diabetics, and a wide variety of other sensor+display elements. One of the stumbling blocks when developing RF and electromagnetic MEMS devices is the effect of the silicon substrate. Typically, large quantities of substrate must be removed to improve the quality of the MEMS device. By using a glass substrate, this process is not necessary and the devices are simpler to manufacture and are more physically robust (since the substrate is intact). Additionally, many MEMS processes need to take special steps to electrically isolate individual moving elements from each other when they're all attached to the same conductive and parasitic substrate. Again, with glass, this isolation is inherently not necessary.

Microfluidic and biological applications often require materials that are bio-compatible, i.e. are biologically inert. Glass is one such material. It is simpler to start with a bio-compatible material (such as a glass substrate) than to use incompatible materials and coat them with appropriate surfaces.

Quite a few MEMS applications require thermal insulation between elements, such as bio-meters (IR sensors), field emission tips, and chemical detectors. With devices on a silicon substrate, much of the substrate must be removed to provide this thermal insulation. By using a glass substrate, each element is inherently isolated.

Integration Choices

When designing the MEMS microphone on glass process flow, integration with current TFT technology is of the utmost importance. This consideration was a prime factor in choosing to develop the piezo-TFT transducer technology. The Piezo-TFT process flow is mostly identical to the TFT process, with the addition of a few steps. A few extra films, etches, and two mask steps are added to define the sacrificial material and the outline of the released structural elements.

Sacrificial Materials

A variety of materials have been considered for use as a sacrificial material. Other than thermal stability, polyimide has the very good properties. Unfortunately, since silicon films may be crystallized above the sacrificial layer, the sacrificial material must survive at higher temperatures. Aluminum nitride, while marginally harder to remove than polyimide, is otherwise an excellent material for use as a sacrificial film.

TABLE 3.2

Comparison of Sacrificial Materials

| Attribute | AlN | Al | Polyimide | Photoresist | SiO2 | Si |
|---|---|---|---|---|---|---|
| Wet etch | weak base | weak base | Piranha | Piranha | HF | TMAH/KOH |
| Wet etch compatibility | Good | Good | Excellent | Excellent | Poor | Poor |
| Dry etch | Poor Cl$_2$ | Cl$_2$ and/or BCl$_3$ | O$_2$ | O$_2$ | CHF$_3$, Cl$_2$, and/or CF$_4$ | SF$_6$ or Cl$_2$ |

TABLE 3.2-continued

Comparison of Sacrificial Materials

| Attribute | AlN | Al | Polyimide | Photoresist | SiO2 | Si |
|---|---|---|---|---|---|---|
| Dry etch compatibility | Fair | Fair | Excellent | Excellent | Fair | Fair |
| Deposition temp. | Low | Low | 25 C. | 25 C. | 400 C. | 400+ C. |
| Cure/Anneal | None | None | 400 C. | 150 C. | None | 500 C. |
| Max temp | >1100 C. | <500 C. | <450 C. | <150 C. | >1100 C. | >1100 C. |
| Stress | Moderate | Moderate | Low | Low | Moderate | Moderate |
| Contamination risk | Moderate | Moderate | Fair | Fair | Low | Low |

AlN can be etched away by weak base, so both crystallized Si and SiO2 can survive the releasing process. AlN can be deposited at low temperature which is compatible with TFT process. AlN can survive high temperature thermal treatment steps. AlN has low stress level, and with proper containment, adds no contamination to the TFT process.

Since AlN can be deposited before any of the transistor layers, it does not contaminate the sensitive regions, since the AlN film is entirely encapsulated in SiO2 until the very last step of processing, when it is removed. This ensures that none of the aluminum will migrate into the silicon channel or gate oxide.

The high temperature stability of AlN is critical since TFT processes may include several anneal steps at 650 C and a laser crystallization step, which heats the surface film to over 1000 C.

Aluminum nitride is easily stripped with a weak base, such as TMAH or ammonium hydroxide. These wet chemicals do not react with the substrate or other sensitive films in TFTs, such as silicon, oxide, titanium, or titanium nitride. These wet etchants strip aluminum at roughly the same rate as aluminum nitride. Therefore, aluminum films must be protected with TiN. This protection step occurs naturally during the bond pad masking step. Further, excellent adhesion can be achieved between the AlSi wires and the TiN/Al stack.

An alternative film to AlN is spin-on polyimide. Polyimide has most of the good properties of AlN except its thermal stability. The maximum temperature it can withstand is about 450 C. An advantage of polyimide is that it can be stripped in an oxygen plasma, which is essentially harmless to all TFT films including aluminum.

Low Stress Oxide

The low stress TEOS may have slightly adverse affects on the electrical properties of TFT devices, but this can be worked around. For example, in the TFT flow, the base-coat SiO2 layer serves a dual purpose—it provides a clean electrical interface to the bottom of the active silicon channel and it acts as a barrier to any contaminants that may be present in the glass substrate. In the Piezo-TFT flow, the base-coat serves an additional function as the structural component of the microphone. If the low-stress base-coat SiO2 proves to have poor interface properties, a thin (500 A) layer of the standard TFT recipe SiO2 can be deposited on top of the low-stress SiO2 structural film.

From a mechanical perspective, 500 A of high stress SiO2 on top of 5000 A of low stress SiO2 has essentially have no effect. Electrically, the combination of two recipes of SiO2 functions well as an interface layer and a barrier layer. Process-wise, there is essentially no added complexity to depositing one recipe after another (without the wafer leaving the chamber).

Microphone Transducer Design

The MEMS device transducer converts energy of one type to another, such as mechanical to electrical. There are a wide variety of well-understood transducer types available, and each has its own advantages and disadvantages.

Theory of Sensing Elements

Among the many electro-mechanical transducers commonly in use, the search for the most appropriate types for a microphone application can be limited. The primary goals are high sensitivity, low noise, wide frequency response, ease of integration into the TFT process flow, and low power consumption. Most conventional macroscopic microphones use capacitive sensors (e.g. condenser). Many MEMS microphone designs use capacitive sensors as well, due to their high sensitivity. Other microphone designs have used a piezo-resistive element or a piezo-electric sensor. Additionally, a novel transducer type, referred to herein as a Piezo-TFT sensor, has been developed.

MEMS Condenser Microphone

Figure 9A:
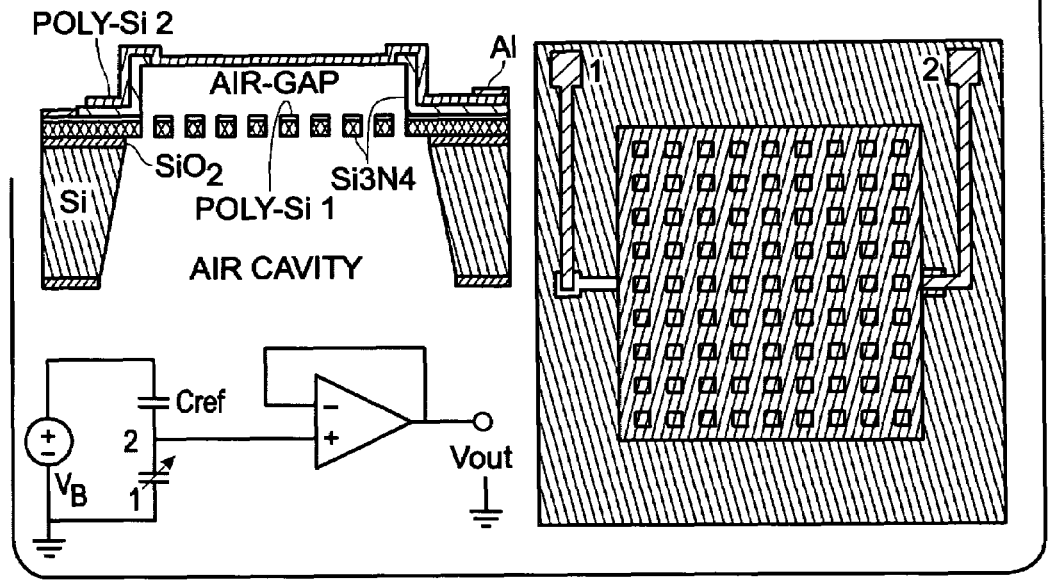
FIGS. 9A and 9B are diagrams depicting a MEMS condenser microphone and its working principle, and a MEMS piezoelectric microphone, respectively.
Figure 9B:
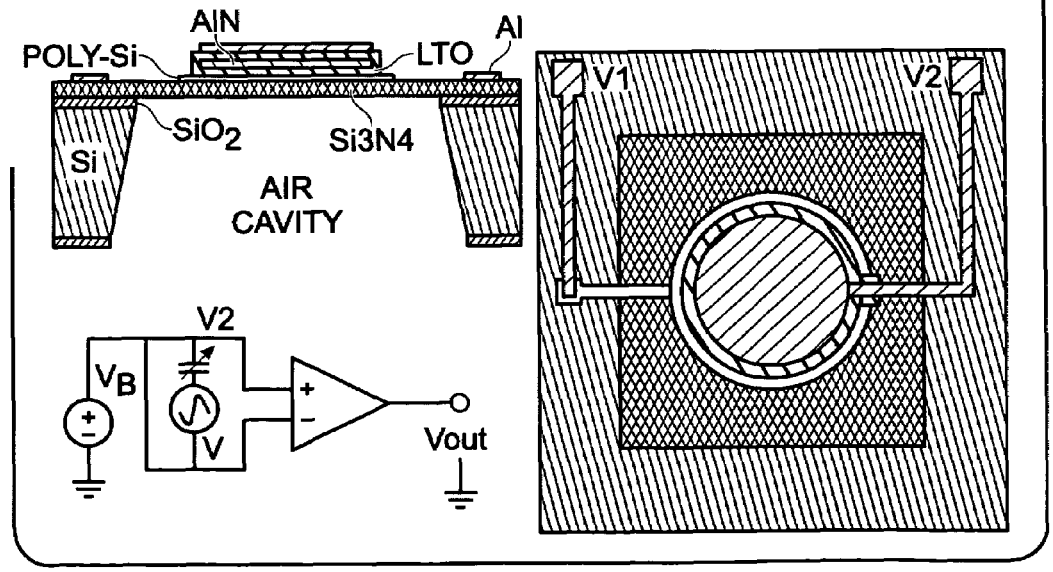

FIGS. 9A and 9B are diagrams depicting a MEMS condenser microphone and its working principle, and a MEMS piezoelectric microphone, respectively. In FIG. 9A, a condenser microphones employ air-gap capacitors to convert acoustic pressure to an electrical signal. FIG. 9A shows the generic design of a MEMS condenser microphone and its working principle. MEMS condenser microphones have excellent performance characteristics, but they suffer from a complex fabrication process due to the large air-gap requirement between plates. Trade offs among sensitivity, frequency response and structure robustness require relatively thick films (several microns). This makes it difficult to integrate a MEMS condenser microphone with CMOS circuitry.

MEMS Piezoelectric Microphone

FIG. 9B is a diagram depicting a MEMS piezoelectric microphone. Piezoelectric microphones, which do not have an air gap, have a more robust fabrication process than condenser microphones. As shown in FIG. 9B, for $\iota >> a$, the electric field at point m is:

$$E_m = E_+ + E_- \approx \frac{3q}{4\pi\varepsilon r^2} - \frac{3q}{4\pi\varepsilon r^2} = 0$$

No potential and electric field appear as if the charges are coincident at their center of gravity (point o).

Apply a force σ on the molecule, the line OD to rotate counter clockwise by a small angle dθ, this strain shifts the center of gravity of the three positive and negative charges to the left and right, respectively. A dipole moment p=qr, is created which has an arm $r=3^{3/2}ad\theta$. Therefore the polarization (or dipole moment per unit volume) for a film contains N such molecules is:

$$P=Nq3^{3/2}ad\theta$$

This polarization P equals the surface charge per unit area, which can be detected by circuitry shown.

Figure 10:
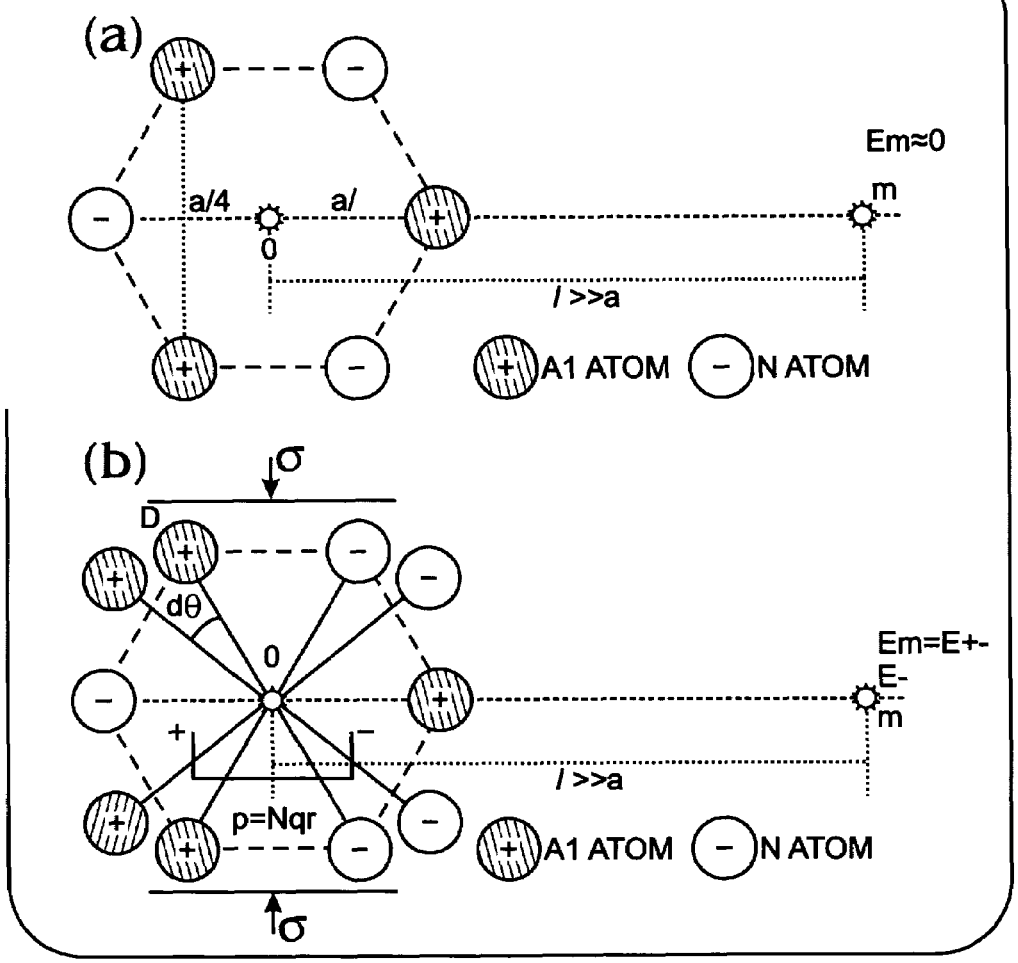
FIG. 10 depicts the origins of the piezoelectric effect.

FIG. 10 depicts the origins of the piezoelectric effect.

MEMS Piezoresistive Microphone

Figure 11:
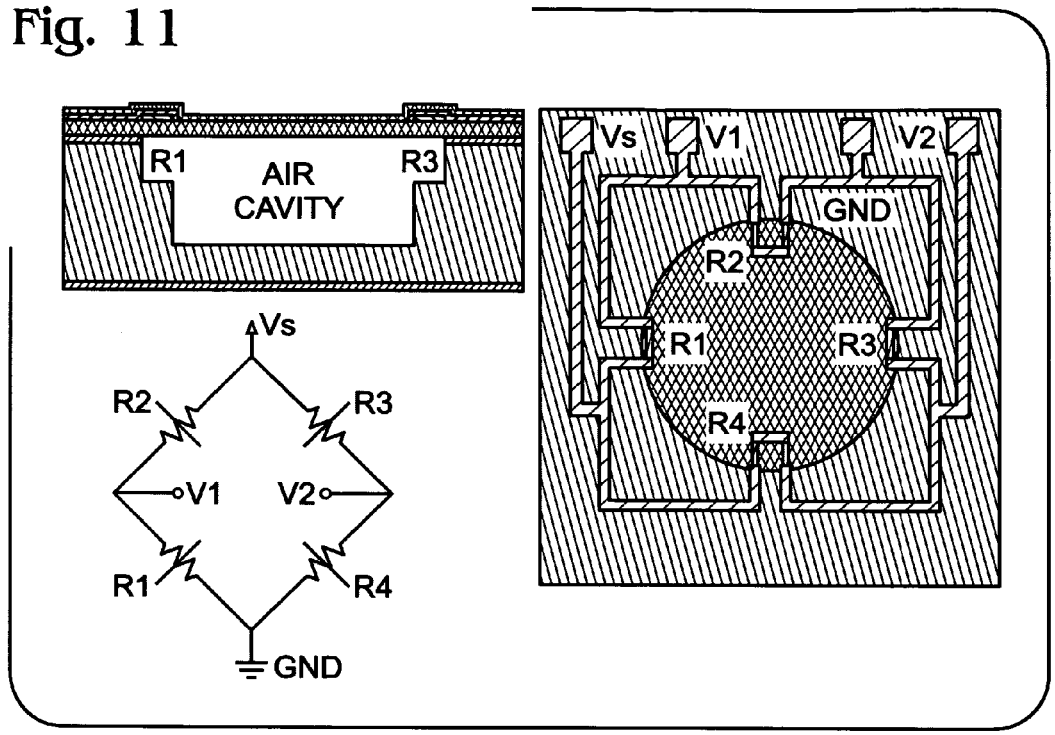
FIG. 11 depicts a piezoresistive microphone.

FIG. 11 depicts a piezoresistive microphone. The microphone is based on a conventional piezoresistive scheme, incorporating three energy domains. First, incident acoustic waves force the bending of the diaphragm, inducing a stress field which translates acoustic energy into mechanical strain energy. Piezoresistors rigidly attached to the diaphragm feel this strain and exhibit a change in resistivity. This change in resistivity causes a change in resistance, translating the mechanical energy into the electrical domain. The resistance modulation is detected through a fully active Wheatstone bridge.

Temperature drift is a common problem for piezoresistive transducers. Crystallized silicon films exhibit inconsistent orientation, this limits the maximum piezoresistive effect, and causes mismatch on the Wheatstone bridge. Doping the crystallized silicon film via implantation causes high density defects, which increases the noise floor of the microphone, dropping its sensitivity.

Relative resistance changes can be expressed using the longitudinal and transverse piezoresistive coefficients $\pi_l$ and $\pi_t$.

$$\Delta R/R = \pi_l \sigma_l + \pi_t \sigma_t$$

Piezoresistors are often aligned to the [110] direction of a (100) silicon wafer to achieve maximum piezoresistive coefficients.

The piezoresistive coefficients of silicon at room temperature are listed in Table 4.1. The longitudinal and transverse piezoresistive coefficients in [110] direction are listed in Table 4.2.

TABLE 4.1

Piezoresistive coefficients, T = 25 C.

| | P (Ω-cm) | $\pi_{11}$ (×10$^{-11}$Pa$^{-1}$) | $\pi_{12}$ (×10$^{-11}$Pa$^{-1}$) | $\pi_{44}$ (×10$^{-11}$Pa$^{-1}$) |
|---|---|---|---|---|
| n-type | 11.7 | −102.2 | 53.4 | −13.6 |
| p-type | 7.8 | 6.6 | −1.1 | 138.1 |

TABLE 4.2

Longitudinal and transverse piezoresistive coefficients in [110] direction

| | | |
|---|---|---|
| n-type | $\pi_l = -31.2 \times 10^{-11}$Pa$^{-1}$ | $\pi_t = -17.6 \times 10^{-11}$Pa$^{-1}$ |
| p-type | $\pi_l = 71.8 \times 10^{-11}$Pa$^{-11}$ | $\pi_t = -66.2 \times 10^{-11}$Pa$^{-1}$ |

The piezoresistive scheme is attractive for MEMS microphones, because of the likelihood of full integration with the TFT process. The design presented above has the disadvantage of a low sensitivity. To achieve a high enough sensitivity, a novel structural design can be used to enhance the piezoresistive effect while keeping an acceptable cutoff frequency. The features of the piezoresistive element can be fabricated concurrently with TFT fabrication, using the same masks and films as the transistors.

Stress Concentrated MEMS Piezoresistive Microphone

Figure 12:
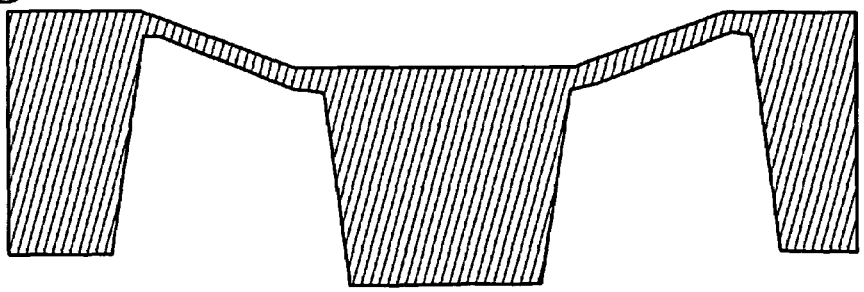
FIG. 12 depicts a stress concentration method adapted for bulk micromachining.

FIG. 12 depicts a stress concentration method adapted for bulk micromachining. Stress concentration methods are frequently adopted in the MEMS world to gain a maximum piezoresistive effect. The figure shows a method for concentrating stress to the thin-film area in bulk micromachining, usually in the form of clamped thin beams/membranes isolated by thick solid islands. Compared with the thin beams/membranes, the islands bend much less under a certain pressure. Major bending happens on thin beam/membrane area. As a result, stresses and strains are concentrated on thin beam/membrane areas To apply this technique to a surface micromachined microphone design, a few additional factors need be considered. One is the residual stress in the membrane, and another is the resonant frequency. This is different from bulk micromachined structures, which essentially have no residual stress, as surface micromachining technology uses CVD/sputtered films as structural films. Inevitably, a certain amount of residual stresses are inherent in the films, resulting in either buckling or stiffness deviation from design.

A cantilever is one of the best structures for releasing stress, and it is adopted widely in a variety MEMS devices. For MEMS microphone applications, a cantilever structure is not very efficient in collecting acoustic pressure. To overcome this drawback, a cantilever with a membrane tip area has been modified to achieve both maximum stress releasing and maximum acoustic pressure collection efficiency. By fabricating the membrane tip area thicker than the cantilever beam part, a higher level stress can be concentrated on the cantilever beam part. Integrating piezoresistors on highly stressed areas provides higher sensitivity.

Figure 13:
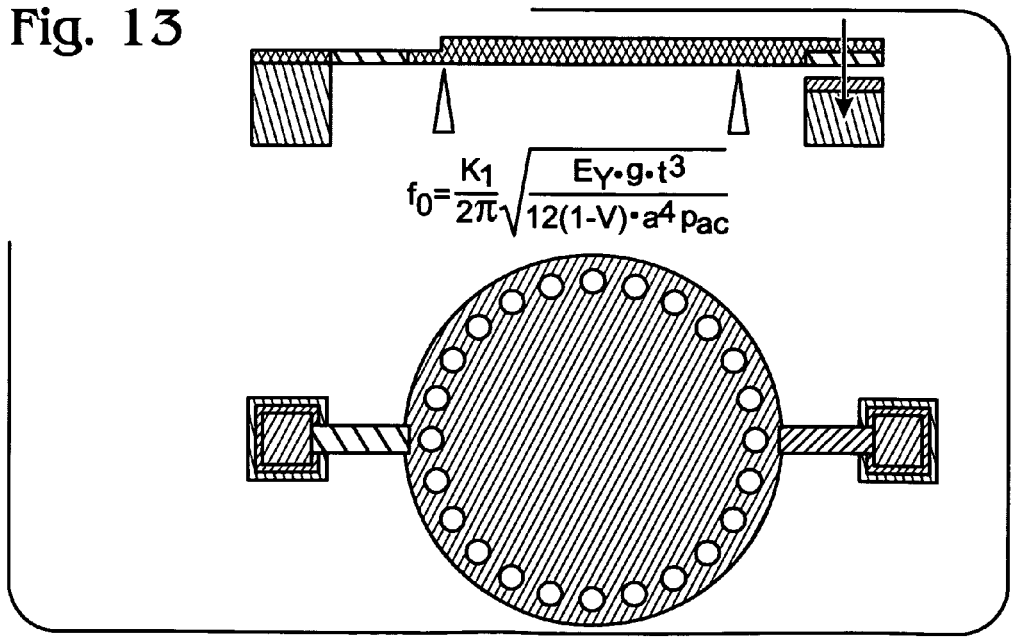
FIG. 13 depicts a design for stress concentration and resonant frequency decoupling.

FIG. 13 depicts a design for stress concentration and resonant frequency decoupling. Conventionally, a thin cantilever beam decreases the system cutoff frequency, for it has low spring constant. By introducing a simply support boundary condition to the pressure collecting membrane, the cutoff frequency is determined by the membrane, not the spring constant of the thin beam, while the stress concentration still works at thin beam part. The whole structure is fabricated as a modified cantilever that releases most of the residual stress. When in use, an electrostatic force is applied to clamp the right hand beam; this results in a double clamped beam structure with membrane central area for pressure collection. Piezoresistors are built on the left hand stress concentrated beam area.

To realize the novel structure with a TFT compatible process, 3 to 4 masks are introduced to the existing TFT process flow. One mask is used to form dimple structures for realizing the simply supported boundary condition. The second mask is used to define the outline of the whole microphone structure. The third one is to prevent nickel deposition on the piezoresistors prior to the silicide step, and the last one is to open the through holes forming the acoustic cavity. The figure illustrates the cross-section of a piezoresistive sensing microphone, which is process compatible with TFT (shown on right side).

Figure 14:
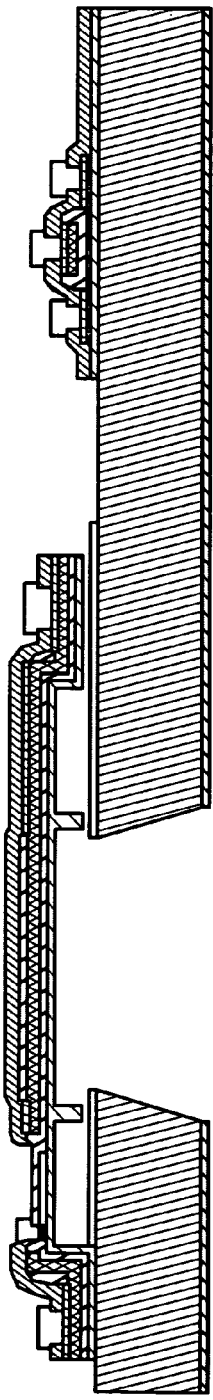
FIG. 14 is a partial cross-sectional view of a piezoresistive sensing microphone.

FIG. 14 is a partial cross-sectional view of a piezoresistive sensing microphone.

MEMS Piezo-TFT Microphone

The operation principle of Piezo-TFT is based on the fact that the mobility of carriers in a MOSFET device change as stress is applied to the channel. If this MOSFET is placed in a high-stress region of a cantilever or membrane, the change in mobility will be detectable and directly related to the motion of the MEMS structure. The fabrication process is inherently compatible with the TFT flow. A theoretical analysis of a Piezo-TFT shows that the carrier's mobility change is not the only effect on a Piezo-TFT measurement. The channel width and length will change as the device is stressed, and also contributes to the piezo effect. Analysis shows that this change in channel dimensions adds slightly to the sensitivity of the Piezo-TFT sensor. Simulation of a Piezo-TFT sensing scheme for a microphone shows a reasonable output voltage under acoustic pressure.

It is well known that a semiconductor carrier's mobility varies when the channel is strained. Changes in a carrier's mobility affects other electrical properties, such as resistivity. In fact, the piezoresistive effect is one of the results of carrier's mobility change under an applied pressure.

The drain current of a MOSFET transistor is proportional to the magnitude of a carrier's mobility.

$$i_D = \frac{1}{2} C_{OX} \mu \frac{W}{L} (V_{GS} - V_t)^2$$

For a solid state MOSFET transistor, a constant carrier mobility is preferred. Any change of the mobility will result in the characteristics of a MOSFET shifting, which is unacceptable for circuit applications. However, for the purpose of sensing stress/strain change, this kind of change is desirable.

Figure 15:
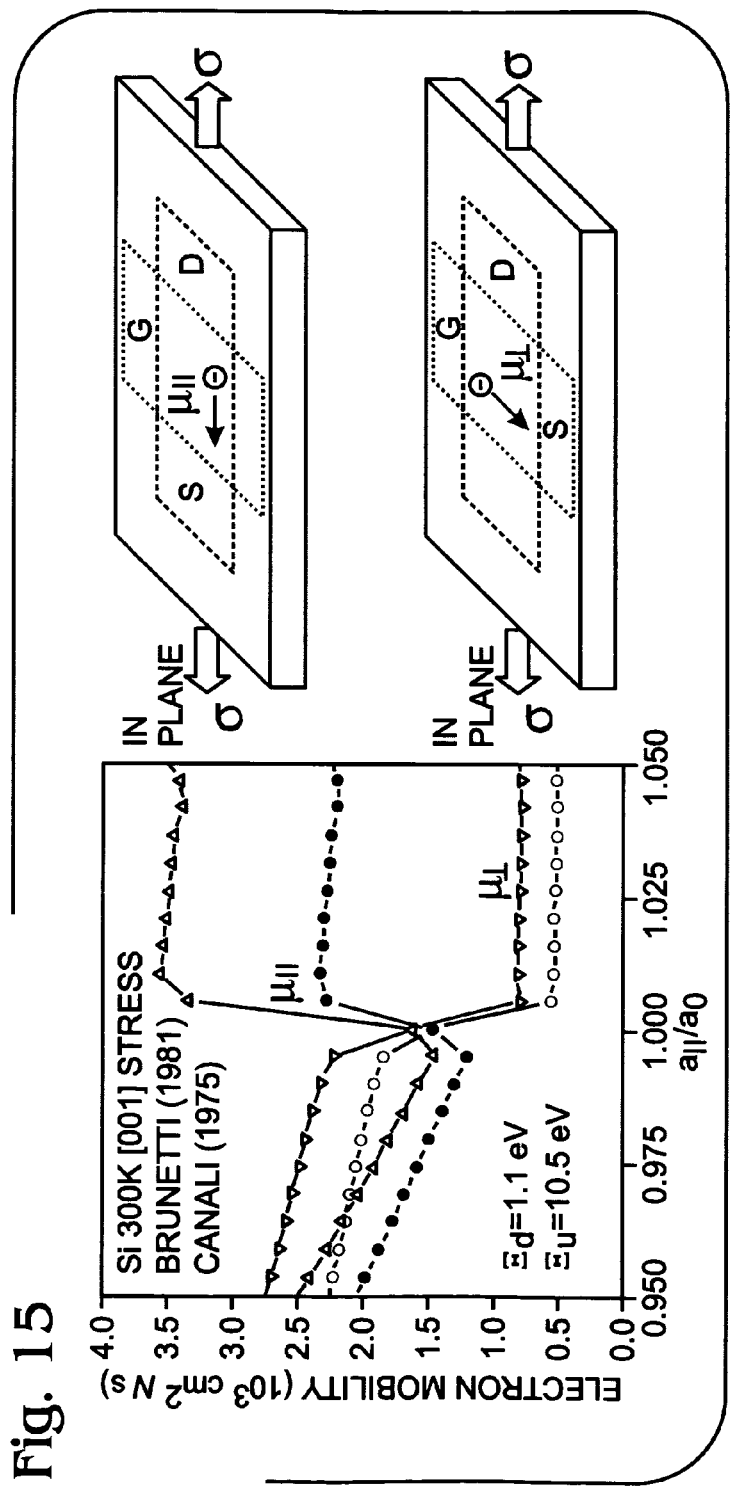
FIG. 15 shows the experimental and theoretical results of electron mobility in Si under strain.

FIG. 15 shows the experimental and theoretical results of electron mobility in Si under strain. Stress/strain change affect carrier mobility. Electron mobility parallel to the stress direction increases linearly when strain increase from 0 to 1%. For convenience of further discussion, we define the rate of mobility change vs. strain change as $$\kappa_\varepsilon = \frac{d\mu}{\mu} \bigg/ d\varepsilon$$

Where $d\varepsilon$ is the strain change, and $$\frac{d\mu}{\mu}$$

is the relative change of mobility.

From the figure we find that for electrons in single-crystal silicon along the direction of the strain, $$\kappa_{\varepsilon \cdot e} = \frac{d\mu_e}{\mu_e} \bigg/ d\varepsilon \approx +200.$$

For holes, the mobility in single-crystal silicon increases under a compressive strain/stress by a factor of about 50%, meaning that $$\kappa_{\varepsilon \cdot h} = \frac{d\mu_e}{\mu_e} \bigg/ d\varepsilon \approx -150.$$

To use the stress changed induced drain current change effect for pressure sensing purposes, MOSFET transistors can be built on a deflectable membrane or cantilever. A lateral pressure load applied to a cantilever or membrane induces a bending stress/strain, causing the mobility change and exhibits a drain current change. Compared with the strain induced by a lattice mismatch in strained silicon thin-film, the bending strain is much smaller. For a cantilever with length l, width W, thickness t, Young's modulus $E_Y$, Poisson's ratio v, the induced strain at the clamped end under pressure P is $$\varepsilon = \frac{6(1-v)Pl^2}{E_Y t^2}.$$

As a practical estimation, a 300 um long, 60 um wide, 0.6 um thick cantilever under 1 Pa pressure induces a strain of $$d\varepsilon = \frac{6(1-v)Pl^2}{E_Y t^2} = \frac{6(1-0.25)\cdot 1 \text{ Pa} \cdot (300 \text{ μm})^2}{(160\times 10^9 \text{ Pa})\cdot (0.6 \text{ μm})^2} = 7.04\times 10^{-6}.$$

So the relative drain current change induced by mobility change is $$\frac{dI_d}{I_d} = \frac{d\mu}{\mu} = \kappa_{\varepsilon e} \cdot d\varepsilon = 200\times 7.04\times 10^{-6} = 1.408\times 10^{-3}$$

for a NMOSFET, and $$\frac{dI_d}{I_d} = \frac{d\mu}{\mu} = \kappa_{\varepsilon h} \cdot d\varepsilon = -150\times 7.04\times 10^{-6} = -1.06\times 10^{-3}$$

for a PMOSFET.

For a big transistor with a micro- to milli-ampere drain current, the absolute drain current change is in the range of nano- to micro-ampere, which is small but still measurable. Also, a big transistor with milli-ampere drain current means a high continuous power consumption, which is not desirable.

Figure 16:
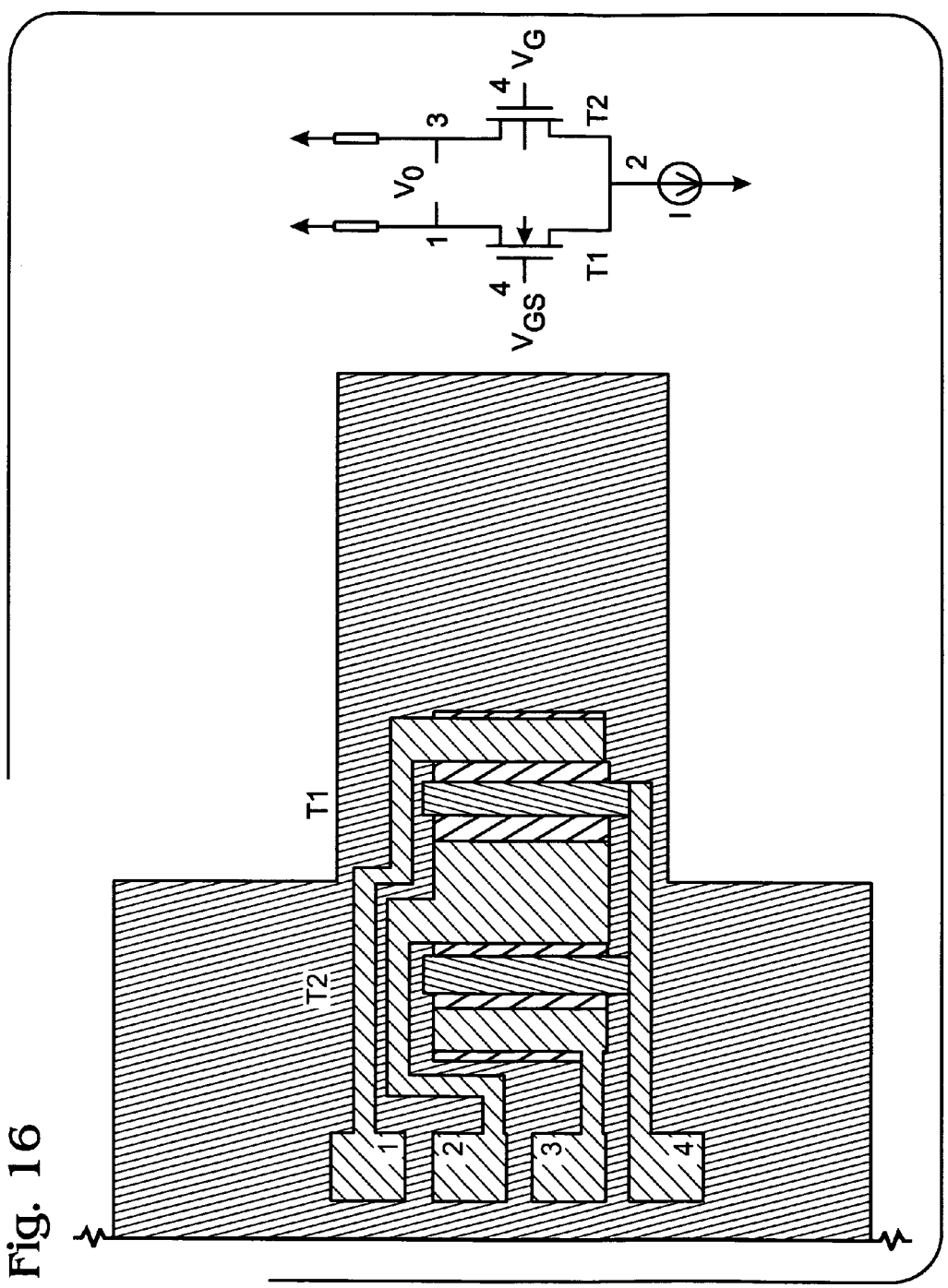
FIG. 16 depicts a Piezo-TFT FET sensing differential pair design that avoids high level drain current, while yielding a reasonable output signal.

FIG. 16 depicts a Piezo-TFT FET sensing differential pair design that avoids high level drain current, while yielding a reasonable output signal. T1 and T2 are a differential MOS pair. For the stress sensing application, T1 is placed at the edge of cantilever and T2 placed on the solid substrate as a reference. Analyzing the offset voltage of a MOSFET differential pair $$V_o = \frac{1}{2}(V_{GS} - V_t)\frac{d\mu}{\mu}.$$

For a typical $V_{GS}$=5V and $V_t$=0.8V, the output voltages are calculated to be 2.96 mV for a NMOSFET device and −2.23 mV for a PMOSFET device, which are quite reasonable for further amplification.

This scheme uses two TFT devices adjacent to each other, taking advantage of their uniformity. The near-identical properties of two neighboring devices in poly-silicon technology permits a differential pair to be created, removing common-mode signals, and leaving behind only the results of the measurement.

For a cantilever with length l, width W, thickness t, Young's modulus $E_Y$, Poisson's ratio v, the induced strain at the clamped end under pressure P is $$\varepsilon = \frac{6(1-v)P\ell^2}{E_Y t^2}$$

As a practical estimation, a 300 um long, 60 um wide, 1 um thick cantilever under 0.1 Pa (74 dB, which is the normal speaking acoustic pressure) will induce a strain of $$d\varepsilon = \frac{6(1-v)P\ell^2}{E_Y t^2} = \frac{6(1-0.25) \cdot 0.1 \text{ Pa} \cdot (300 \text{ }\mu\text{m})^2}{(160 \times 10^9 \text{ Pa}) \cdot (1.0 \text{ }\mu\text{m})^2} = 2.54 \times 10^{-7}.$$

So the relative electron mobility change induced by the strain change is $$\frac{d\mu}{\mu} = \kappa_{\varepsilon e} \cdot d\varepsilon = 200 \times 2.54 \times 10^{-7} = 5.1 \times 10^{-5}$$

Microphone Sensitivity

Open circuit sensitivity of a microphone is defined as the induced electric voltage from one unit of acoustic pressure:

$$S = \frac{dV}{dP}$$

For each type of microphone, the expressions of sensitivity are different from one another, due to the different sensing schemes.

To simplify comparison, assume the deflectable diaphragm of each of the three type of microphones has same dimensions (radius a, thickness t, Young's modulus $E_Y$, Poisson ratio v), and same boundary conditions (simply supported). A DC biasing voltage $V_B$ is applied. Table 4.3 summarizes the sensitivity expressions for all four types of microphones.

TABLE 4.3

Sensitivity equations for MEMS transducers

Condenser microphone $$S_c = V_B \frac{3(5+v)(1-v)}{16} \cdot \frac{1}{E_Y} \cdot \frac{a^4}{g_0 \cdot t^3}$$

$g_0$ is the air gap between the deflectable diaphragm and the fixed electrode

Piezoelectric microphone $$S_{pe} = \frac{4+v}{4} \cdot \frac{d_{31} \cdot t_{pz}}{\varepsilon_r \varepsilon_0} \cdot \frac{a^2}{t^2}$$

$d_{31}$ is the piezoelectric stress constant
$t_{pz}$ is the piezoelectric film thickness
$\varepsilon_r$ is the relative permittivity of the piezoelectric film Piezoresistive microphone $$S_{pr} = V_B \frac{3(1-v)}{8} \cdot \pi_{44} \cdot \frac{a^2}{t^2}$$

$\pi_{44}$ is piezoresistive coefficient of silicon

Piezo-TFT $$S_{pzmos} = \frac{3(1-v)\ell^2}{E_S t^2} \cdot \kappa_\varepsilon \cdot (V_{GS} - V_T)$$

$E_s$ is the Young's modulus of MEMS cantilever
$\ell$ is the cantilever length
t is the cantilever thickness
$V_{GS}$ is the TFT pair gate-source voltage TABLE 4.3-continued Sensitivity equations for MEMS transducers $V_T$ is the threshold voltage of TFT pair
$\kappa_\varepsilon$ is the rate of mobility change vs. strain change From the above sensitivity expressions, it can be concluded that sensitivity is nonlinearly proportional to the ratio of diaphragm radius over thickness a/t. Compared to the piezo type microphones, a condenser microphone is more sensitive to diaphragm dimension deviations; this requires tighter process control for condenser microphones.

Table 4.4 lists numerical results of sensitivities based on the assumption that $V_B$=10V, radius a=300 um, thickness t=1 um, Young's modulus $E_Y$=165 GPa, Poisson ratio v=0.25, and $g_0$=4 um, $d_{31}$=7.1×10$^{-12}$ C/N, $t_{pz}$=2000 A and $\epsilon_r$=8.5 and $\pi_{44}$=138.1×10$^{-11}$Pa$^{-1}$, and $V_{GS}$=5.0 V and $V_T$=0.8 V.

TABLE 4.4

Sensitivity expressions of MEMS microphones

| | |
|---|---|
| Condenser microphone | 90.6 mV/Pa |
| Piezoelectric microphone | 1.8 mV/Pa |
| Piezoresistive microphone | 0.35 mV/Pa |
| Piezo-TFT microphone | 2.96 mV/Pa |

According to the numbers in Table 4.4, one might have the first impression that a piezoresistive scheme is not promising due to its low sensitivity, despite its more robust process and highest probability of full compatibility with the existing TFT materials and process flow. Using creative designs, however, the sensitivity can be improved by at least one order of magnitude. This would make its performance more than acceptable.

By locating the piezoresistors on locally thinned regions of a constant thickness diaphragm, the sensitivity can be represented as $$S_{pr} = V_B \frac{3(1-v)}{8} \cdot \pi_{44} \cdot \frac{a^2}{t \cdot t_{pr}},$$

where $t_{pr}$ is the piezoresistor film thickness.

The typical thickness of crystallized silicon is 500 A in many TFT processes. Using this number and the same dimensions and material in the previous calculations, the new sensitivity is 7.0 mV/Pa, which is acceptable for audio microphone applications.

Cutoff frequency

The cutoff frequency is another important parameter for specifying the dynamic performance of a MEMS microphone. The cutoff frequency of a microphone can be approximated using the first resonance frequency of the diaphragm in the case of air damping. The first resonance frequency of a simply supported circular diaphragm is expressed as, $$f_0 = \frac{K_1}{2\pi} \sqrt{\frac{E_Y \cdot g \cdot t^3}{12(1-v) \cdot a^4 p_{ac}}},$$

where $K_1$=4.99 is a constant, g=9.8m/s$^2$ is gravitational acceleration constant, $P_{ac}$ is the acoustic pressure, a is diaphragm radius, t is the diaphragm thickness, $E_Y$ is Young's Modulus and v is Poisson ratio.

According to this expression, the resonance frequency of this diaphragm is nonlinearly inversely proportional to the ratio of the diaphragm radius over its thickness a/t. Recalling that sensitivity is nonlinearly proportional to the ratio of diaphragm radius over thickness a/t, a trade off must be made between sensitivity and bandwidth.

Given the dimensions of previous calculations, a=300 um, t=1 um, $E_Y$=165 GPa, v=0.25 and $P_{ac}$=0.1 Pa, the first resonance frequency is $f_0$=0.5 KHz, which is high enough for telephone-based applications.

From the expression of $f_0$, it can be concluded that the thickness of the whole diaphragm can't be too thin; otherwise the resonance frequency is too low. Therefore, a thick enough composite structure must be used, and not simply a 500 or 1000 A crystallized silicon film. Another consideration limiting the minimum thickness of the diaphragm is its mechanical robustness. A very thin-film is more likely to fail.

Microphone Summary

A piezo-TFT sensor is determined to be an interesting candidate as a MEMS microphone. Piezo-TFT is the easiest transducer technology to integrate with the TFT process flow—no exotic materials are required, no major modifications to TFT design and films, and the piezo-TFT transistor can be fabricated concurrently with the other TFT components.

In addition to its ease of integration, piezo-TFT transducers can easily be used in other high sensitivity MEMS applications, such as biomaterial sensors, microfluidic applications, and inertial sensors. This permits the re-use the piezo-TFT technology in future applications.

Besides the Piezo-TFT based microphone, it is feasible to integrate a piezoresistive MEMS microphone on TFT display through optimization of the structural design. The processes and films for fabricating the piezoresistive MEMS microphone are fully compatible with the existing SLS TFT technology. One more viable scheme is a piezoelectric MEMS microphone design, based on the piezoelectric effect of an AlN film. The process for fabricating AlN piezoelectric MEMS microphones is also compatible with existing SLS laser annealing TFT technology.

Membrane Design

Due to the advantages of surface micromachining, the shape of the microphone membrane can be defined without restriction. The optimal shape is a circular membrane or cantilever shape, which provide the best sensitivity, stress relief, and is the simplest to analyze.

The performance of a round membrane can be analytically solved to first order, and the choice of a 600 um diameter membrane is a balance between sensitivity, frequency response, and yield. The cutoff frequency is over 15 kHz.

Substrate-based Acoustic Cavity

Most silicon-based microphone systems have a large cavity behind the membrane to achieve high acoustic compliance and to simplify the release process step. Typically this cavity is fabricated using a crystallographic etchant (KOH or TMAH) when using silicon substrates. With a glass substrate ultrasonic machining techniques may also be used.

Methods of Relieving Stress/Anchoring the Membrane

Figure 17:
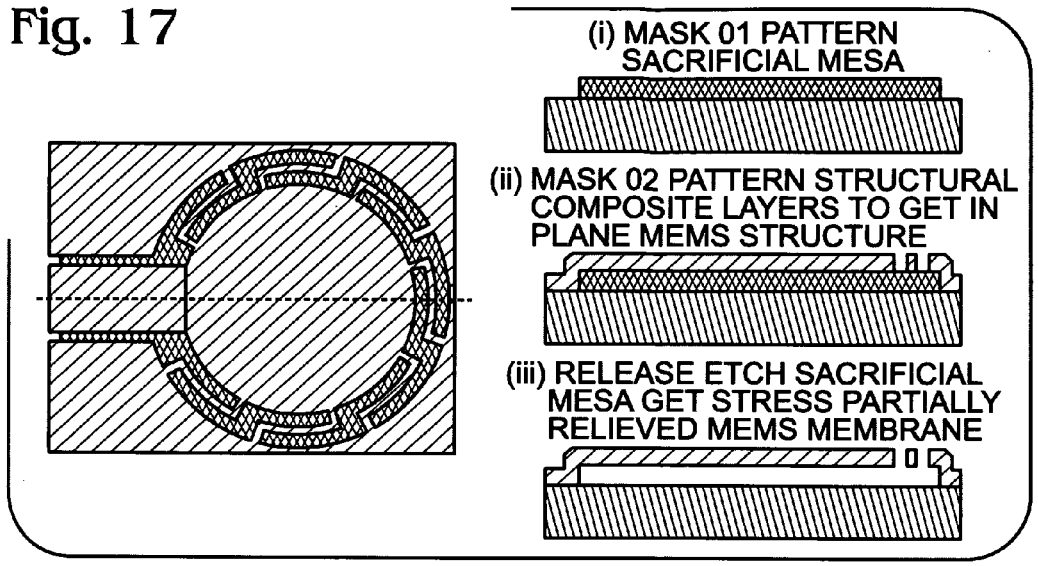
FIGS. 17 and 18 depict a 2-mask and 4-mask method, respectively, for fabricating a membrane.
Figure 18:
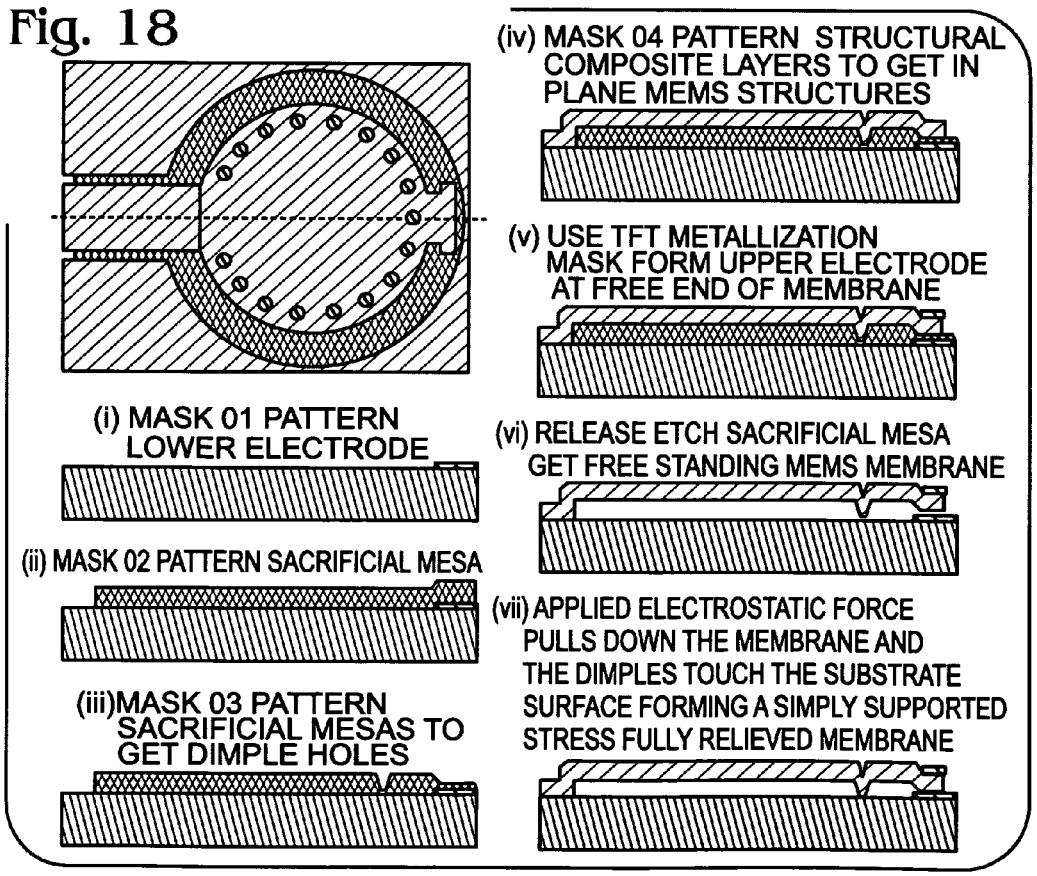

FIG. 17 and 18 depict a 2-mask and 4-mask method, respectively, for fabricating a membrane. When designing large MEMS structures it is necessary to take into account any residual stress in the film and ensure that the device survives packaging, delivery, and mechanical abuse by the user. Therefore, the membrane must be anchored securely to the substrate without affecting the mechanical performance. The simple two-mask method is stiff and somewhat complicated to analyze due to the large number of contact points. The four-mask process creates dimples in the membrane allowing it to be simply supported on the dimples. This allows for simpler analysis and more compliance (and thus more sensitivity).

Exemplary Process Flow

FIGS. 19 through 33 illustrate an exemplary stepwise process flow, resulting in the Piezo-TFT transducer fabrication.

Figure 19:
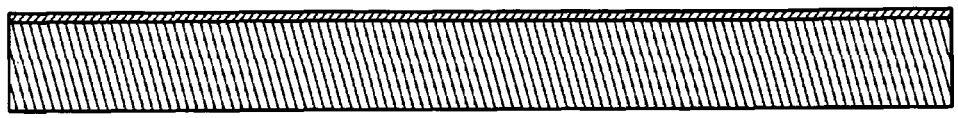
FIGS. 19 through 33 illustrate an exemplary stepwise process flow, resulting in the Piezo-TFT transducer fabrication.
Figure 20:

1, Start with a 6-inch glass or silicon substrate, See FIG. 19.
  PECVD deposit 5000 A a-Si for glass substrate.
  Mask SLA1-LCD-SB to get alignment marks.
  Etch a-Si.
  PECVD deposit 1500 A silicon oxide.
2, Sacrificial layer (FIG. 20)
  DC reactive sputter 1 um AlN. Alternately, use a-Si.
  Mask SLAM2-SA to pattern sacrificial layer.

TABLE 4.5

Comparison of different types of microphones

| | | Condenser microphone | Piezoelectric microphone | Piezoresistive microphone (conventional) | Piezoresistive microphone (modified) | Piezo-TFT microphone |
|---|---|---|---|---|---|---|
| Sensitivity | | high | relatively low | Low | good | high |
| Frequency range | | wide | wide | Wide | wide | wide |
| Power consumption | | low | low | Moderate | moderate | moderate |
| Fabrication complexity | | high | medium | Low | low | low |
| Compatibility with silicon substrate CMOS technology | Film types | fully | foreign film involved | Fully | fully | fully |
| | Film thickness | poor | good | Good | good | good |
| | Process flow | poor | moderate | Good | good | good |
| Compatibility with glass substrate TFT technology | Film types | N/A | foreign film involved | Fully | fully | fully |
| | Film thickness | N/A | good | Good | good | good |
| | Process flow | N/A | moderate | Good | good | good |

RIE or wet etch AlN to define sacrificial mesa on MEMS area and clear out on TFT area.

Figure 21:
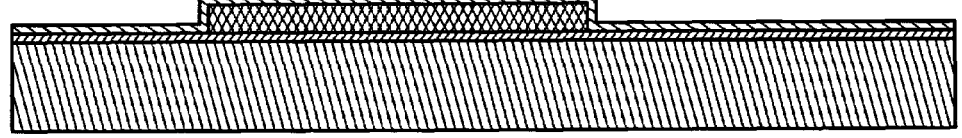

3, SiO2 Structural/Base coat (FIG. 21)

PECVD deposit 2500 A low stress TEOS $SiO_2$ and 500 A standard TEOS $SiO_2$ as "Base coat".

Figure 22:
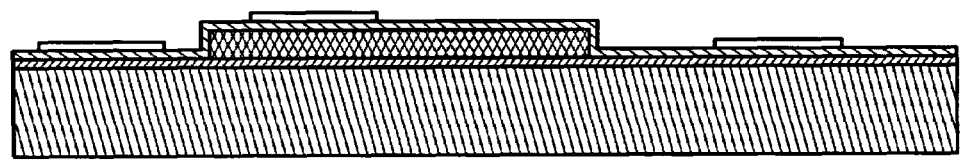

4, a-Si TFT channel (FIG. 22)

PECVD 500 A a-Si.

Laser crystallization.

Mask SLAM2-AA to pattern c-Si.

Figure 23:
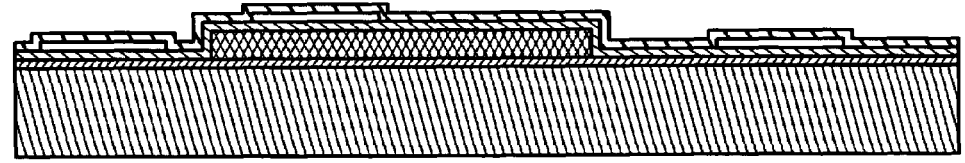

5, PECVD 500 A gate oxide (FIG. 23)

Figure 24:
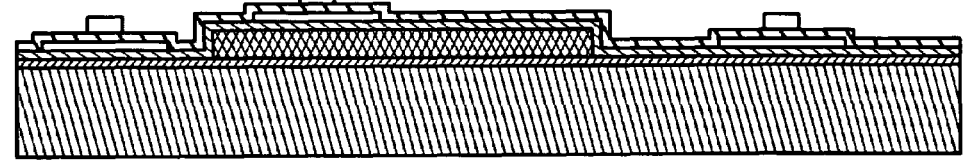

6, Gate Poly (FIG. 24)

PECVD 2000 A gate poly,

Mask SLAM2-GP to pattern gate poly

Figure 25:
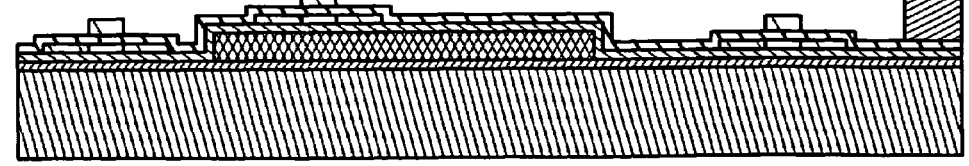

7, Mask 4, (p-type protect), form n-regions by P+ implantation (FIG. 25)

Figure 26:
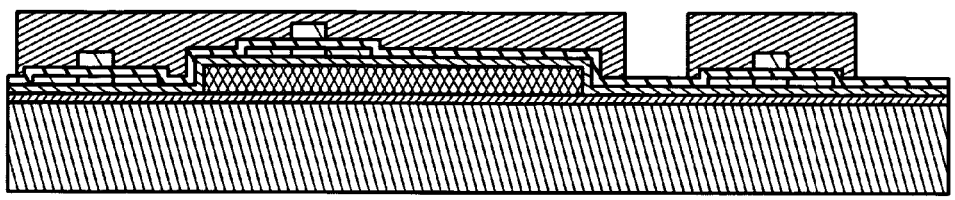

8, Mask 5, (n-type protect), form p-regions by B+ implantation (FIG. 26)

Figure 27:
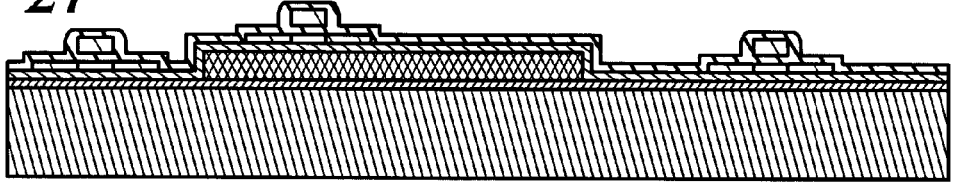

9, Spacer SiO2 (FIG. 27)

Figure 28:
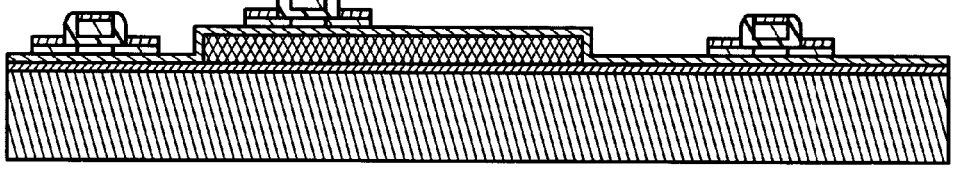

PECVD 6000 A TEOS oxide as spacer, RIE timed etch back, Stop ~200 A from S/D poly 10, Silicide (FIG. 28)

BOE dip to expose Poly-Si surface.

Sputter Ni, RTA to form suicide.

Figure 29:
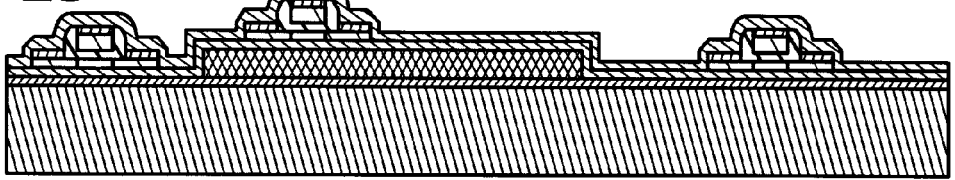

11, Dielectric SiO2 (FIG. 29)

Figure 30:
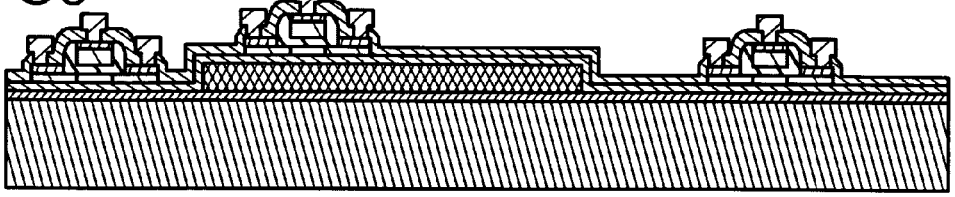

PECVD 3000 A low stress TEOS SiO2 as intermediate dielectric film for TFT and the 2nd layer of MEMS structure 12, Metal (FIG. 30)

Mask SLAM2-CO to pattern contact holes opening.

Sputter Ti(200 A)//AlCu(1 um)/Ti(800 A) stacks,

Mask SLAM2-ME to pattern top electrode and bond pads.

Figure 31:
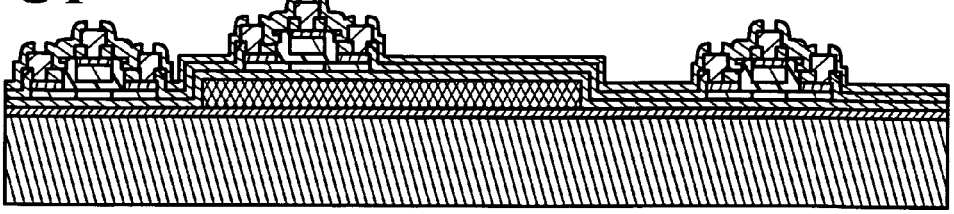

13, Passivation (FIG. 31)

PECVD 4000 A low stress TEOS SiO2 as passivation layer and also the top layer of MEMS structure.

Mask SLAM2-BP to pattern pad openings.

Figure 32:
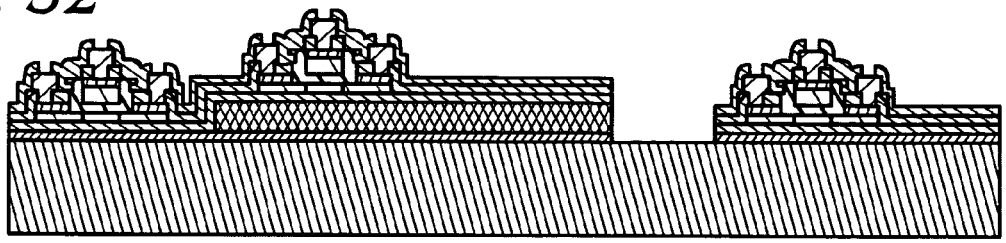

14, Define MEMS outline (FIG. 32)

Mask SLAM2-CA to pattern outline of MEMS structures to be released.

RIE etch through all low stress TEOS layers to form outline of MEMS structures.

Figure 33:
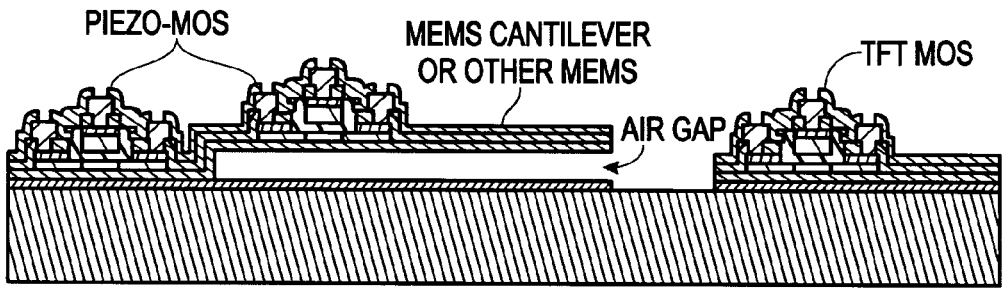

15, Release (FIG. 33)

Wet etch AlN to release MEMS structures integrated with Piezo MOS transducer.

Exemplary Design and Fabrication

The exemplary mask set was designed to use a minimum number of mask levels to fabricate Piezo MOS transducers on deflectable MEMS cantilevers, double clamped beams, and cantilever/membrane combinations. Integration with the TFT process flow is the first consideration, and the goal is to share as many TFT masks as possible, and introduce as few MEMS mask levels as possible.

One essential MEMS mask level is the sacrificial mask, which defines the location of the air gap between the deflectable MEMS structures and the substrate. The other necessary MEMS mask is the outline mask, which defines the perimeter of the MEMS structures after an RIE etch through the structural films. Such a mask is needed because not every layer in TFT process flow is patterned, and all layers are used as the composite structure. Thus, there is a need to separate the MEMS moving part from the fixed parts elsewhere.

In fact, there is no stress free and zero stress gradient film in the real world, though residual stress can be cut to very low level and stress gradients can be tailored. To further relieve any residual stress and weaken the influence of stress gradient, the support and anchor schemes of MEMS structures can be optimized. The price of introducing more mechanical features is more mask levels. The mask design tolerates some imperfections due to non-fully relieved stress in the structural film. As a result, simpler cantilevers were investigated for the relief of residual stress. Some cantilever/membrane combination structures were also investigated for the relief of residual stress. The dimensions of these cantilevers and membranes are from 105 um to 300 um in length, 36 um wide to 80 um, and the thickness can be adjusted by film deposition, ranging from 0.5 um to 1 um. These dimensions are the result of trade-offs between transducer sensitivity and mechanical cutoff frequency. For example, increasing cantilever length can improve transducer sensitivity, for more strain is induced in the Piezo-TFT channel, which increases electron mobility. However, increasing cantilever length makes the cantilever more compliant and cuts its resonant frequency, dropping its bandwidth. So a balance between the sensitivity and frequency response is a major consideration.

The exemplary mask set includes a variety of Piezo-TFT test structures. In all cases, one transistor of a MOS differential pair is placed on the solid substrate and another is placed on a flexible cantilever. To avoid any short channel effects and second order hot electron effects, the Piezo-TFT devices were designed with long channel sizes. The shortest channel length is 1 um, and up to 40 um in the "bending channel" Piezo-TFT designs. This mask set includes a design matrix of:

a) the space between two transistors of a MOS differential pair, b) the distance between the transistor on the cantilever to the anchor, c) transistor width, d) transistor length, e) width over length ratio, f) channel orientation of the transistor on the cantilever, g) cantilever length, h) cantilever width, and i) cantilever tip shape.

Two kinds of Piezo-TFT transducer designs are of special interest. One design puts a MOS transistor in a zone which has highest strain change when a cantilever deflects, and another puts a MOS transistor with very long channel on the region with the most bending, which is referred to herein as a "bending channel" Piezo-TFT. The difference between these two types of Piezo-TFT devices is that the first one has a uniformly strained channel, while the channel surface and bottom of the second one has different strains. The modeling of the "bending channel" Piezo-TFT is more complex than the conventional Piezo-TFT.

To be certain the strain in the MOS channel is being measured, and not any parasitic currents, some "beam" structures were constructed. These are identical to the Piezo-TFT designs in every way, except they are physically clamped at both ends and flex significantly less. Therefore, the Piezo-TFT devices on the clamped structures output very small changes when applying actuation voltage relative to the cantilevered structures.

Another important consideration is the mechanical anchor. Anchors provide MEMS structures mechanical support, e.g. a physical attachment to the substrate, and an electrical connection path to the electronics devices built on top of the MEMS structures. A good design should provide a stiff anchor that can tolerate a certain amount stress and stress gradient deviations, so as to minimize the influence of residual stress on the MEMS structures. In the mask set, two designs of anchors were investigated: straight and corrugated. The straight anchor is simply a flat 90 degree corner. Corrugated anchors distribute the residual stress, minimizing the propagation of the anchor's spring effect relative to the straight anchor design. Additionally, the corrugated anchors provide a more robust physical connection to the substrate due to the larger connection area.

Various designs of piezoresistive sensing elements were also laid on the same mask set, using the crystallized silicon as the piezoresistors film. The piezoresistors are designed to follow the same process flow of the TFT transistors, where the only difference is that the piezoresistors have no source and drain areas.

In addition, to avoid any distortion of MEMS structures mechanical performance, some dummy patterns were introduced to make the MEMS structures surface highly symmetric.

Transducer Optimization

There are several paths that can be taken to improve the performance of the initial Piezo-TFT devices. They include changing membrane characteristics to be thinner and longer. The stiffness of the membrane can be lowered, making it more sensitive to noise. An array of membranes can be used to improve signal-to-noise ratio. An array of several (4 or 9) adjacent membranes connected in series produce an improved output current. This higher current permits simpler amplification schemes.

Further, the sensing TFT design can be optimized. Conventional TFT devices are designed for digital operation. Analog transistors, however, improve the linearity and output range of our Piezo-TFT devices. A low noise amplifier can be integrated with the transducer (on glass). By placing a low noise current amplifier near the membrane on the same substrate, all sorts of parasitic noise can be reduced, improving the signal-to-noise ratio.

FIG. 34 is a flowchart illustrating a method for fabricating a piezo-TFT cantilever MEMS. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 600.

Step 602 provides a substrate, which may be a material such as glass, polymer, quartz, metal foil, Si, sapphire, ceramic, or compound semiconductor materials. Step 604 forms thin-films overlying the substrate. Generally, the thin-films may include a-Si, poly-Si, oxides, a-SiGe, poly-SiGe, metals, metal-containing compounds, nitrides, polymers, ceramic films, magnetic films, or compound semiconductor materials. However, the method is not limited to any particular materials. Step 606 forms a thin-film cantilever beam. Step 608 simultaneously (with Step 606) forms a TFT within the cantilever beam. As noted above, such as device is an example of a MEMS pixel sensor. By "simultaneously" it is meant that the cantilever beam and TFT are both formed by thin-film processes. Further, some processes steps may be performed simultaneously for both the fabrication of the cantilever beam and the TFT.

As noted above in the discussion of FIGS. 5 and 6, simultaneously forming the TFT within the cantilever beam (Step 608) includes forming a TFT in a location such as at least partially overlying a cantilever beam top surface, at least partially overlying a cantilever beam bottom surface, or embedded within the cantilever beam.

In the simplest form, Step 604 selectively forms a Si layer overlying the substrate. Then Steps 606 and Step 608 form the cantilever beam and the cantilever TFT, respectively, from the layer. For example, the cantilever beam is formed from a-Si, with a poly-Si TFT active region being a part of the Si layer. Otherwise, the cantilever beam structure is made from multiple layers.

In one aspect, forming thin-films on the substrate in Step 604 includes substeps. Step 604a selectively forms a first layer with a first stress level. Step 604b selectively forms a first active Si region overlying the first layer. Step 604c selectively forms a second layer with a second stress level overlying the first layer. The first and second layers may be formed from a material such as Si, Si nitride, or Si oxide. Then, Step 606 forms a thin-film cantilever beam from the first and second layers, and Step 608 forms TFT source/drain (S/D) and channel regions from the first active Si region.

Steps 606 and 608 may both include a step of laser annealing, as this a possible thin-film process step. Thus, simultaneously forming the TFT within the cantilever in Step 608 may include creating an electrical characteristic in the active Si region in response to the laser annealing, while forming a thin-film cantilever beam in Step 606 includes creating a mechanical characteristic in the second layer in response to the laser annealing. In some aspects, the laser annealing associated with Steps 606 and 608 may be carried out in the same process step, although the two annealing conditions need not be identical. Alternately, the annealing is performed in different process steps.

In another aspect Step 604 selectively forms a sacrificial layer overlying the substrate. Then, forming the thin-film cantilever beam in Step 606 includes substeps. Step 606a selectively etches the first and second layers, exposing the sacrificial layer. Step 606b undercut etches the sacrificial layer. Step 606c forms a cavity between the first layer and the substrate. Note, in some aspects an insulator or other material layer may separate the substrate from the first layer. These intervening layers may, or may not be etched, depending on design goals and specific materials. The sacrificial layer material can be AlN, Si, SiGe, polymers, dielectrics, or ceramics.

In a different aspect, simultaneously forming the TFT within the cantilever beam (Step 608) includes forming a cantilever strain-sensing TFT. Then, Step 610 simultaneously forms a strain-reference TFT overlying the substrate, adjacent the cantilever. More specifically, forming thin-films overlying the substrate in Step 604 includes forming a second active Si region adjacent the cantilever, simultaneously with forming the first active Si region. Then, simultaneously forming the cantilever TFT and reference TFT (Step 608 and 610) includes laser annealing the first and second active Si regions in the same process step. Alternately, Step 610 may simultaneously form a strain-reference TFT overlying a region of unetched sacrificial layer, adjacent the cantilever.

Figure 35:
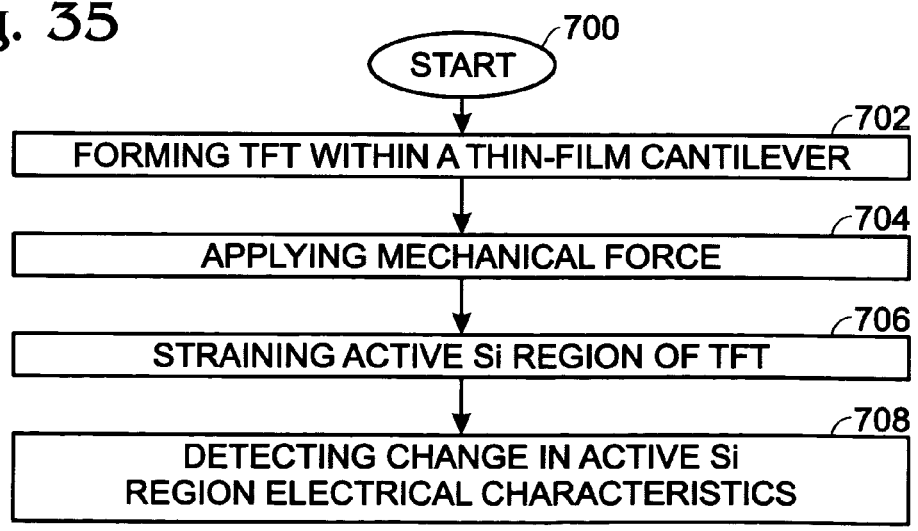
FIG. 35 is a flowchart illustrating a method for detecting strain in a thin-film cantilever.

FIG. 35 is a flowchart illustrating a method for detecting strain in a thin-film cantilever. The method starts at Step 700. Step 702 forms a TFT within a thin-film cantilever beam, which is an example of a MEMS pixel sensor. Step 704 applies a mechanical force to the cantilever beam. The mechanical force can be a temperature, chemical reaction, vibration, or audio frequency to name a few examples. A used herein, a "mechanical force" is any event of circumstance that induces a stress or strain upon the cantilever. Step 706, in response to the mechanical force, changes the strain in an active Si region of the TFT. Step 708 detects a change in active Si region electrical characteristics.

In one aspect, forming a TFT within a thin-film cantilever beam in Step 702 includes forming the TFT and cantilever beam using the same TFT processes. For example, the TFT and cantilever beam may be made from the same materials. In another aspect, the TFT and cantilever beam are formed using laser annealing processes. For example, the TFT and cantilever beam can both be formed as a result of the same laser annealing process step. However, the laser annealing may not be precisely simultaneous, as some laser annealing processes involve laser shot sequences and iterations.

In a different aspect, Step 702 alters the electrical properties of the TFT, and the mechanical properties of the cantilever beam, in response to the laser annealing. Then, the strain change in the active Si region of the TFT that occurs in Step 706 is at least partially responsive to the altered mechanical properties. Likewise, detecting the change in active Si region electrical characteristics in Step 708 is at least partially responsive to the altered electrical properties.

A MEMS pixel sensor, with examples of a piezo-TFT cantilever MEMS and associated fabrication processes have been provided. Examples of various materials, dimensions, designs, and process flows have been given to help illustrate the invention. However, the invention is not limited to merely these examples. Other variations and embodiments of the invention will occur to those skilled in the art.

We claim:

1. A microelectromechanical system (MEMS) pixel sensor, the MEMS pixel sensor comprising:
    a thin-film mechanical device, having a mechanical body with a mechanical state responsive to a proximate environment;
    a thin-film electronic device for converting the mechanical state into electrical signals; and,
    a pixel interface to supply power to the electronic device and to transceive electrical signals; and,
    wherein the electronic device is formed within the mechanical body.

2. The MEMS pixel sensor of claim 1 wherein the mechanical device has a first mechanical state at a first time; and,
    wherein the electronic device supplies a first electrical signal, responsive to the first mechanical state, at the first time.

3. The MEMS pixel sensor of claim 2 wherein the mechanical device has a second mechanical state at a second time, subsequent to the first time; and,
    wherein the electronic device supplies a second electrical signal, responsive to the second mechanical state, at the second time.

4. The MEMS pixel sensor of claim 3 wherein the mechanical device undergoes a sequence of mechanical states at a corresponding plurality of times; and,
    wherein the electronic device supplies a sequence of electrical signals, responsive to the sequence of mechanical states, at the plurality of times.

5. The MEMS pixel sensor of claim 1 further comprising:
    a memory having an interface connected to the electronic device for storing electrical signals, and connected to the pixel interface for supplying stored electrical signals.

6. The MEMS pixel sensor of claim 5 wherein the mechanical device has a calibration mechanical state response to a controlled proximate environment;
    wherein the electronic device supplies a calibration electrical signal responsive to the calibration mechanical state; and,
    wherein the memory stores the calibration electrical signal, and supplies the calibration electrical signal to the pixel interface in response to a calibration state signal received at the pixel interface.

7. The MEMS pixel sensor of claim 1 further comprising:
    a plurality of mechanical devices, each mechanical device having a mechanical state responsive to the proximate environment;
    a plurality of electronic devices corresponding to the plurality of mechanical devices, for converting each mechanical state into an electrical signal; and,
    wherein the pixel interface supplies the plurality of electrical signals from the plurality of electronic devices.

8. The MEMS pixel sensor of claim 7 wherein each mechanical device has a unique mechanical state, responsive to a common proximate environment; and,
    wherein the pixel interface supplies a plurality of unique electrical signals in response to the common proximate environment.

9. The MEMS pixel sensor of claim 1 wherein the mechanical body is a structure selected from a group consisting of a cantilever, bridge, and membrane.

10. The MEMS pixel sensor of claim 1 wherein the electronic device includes a device selected from a group consisting of a thin-film diode and a thin-film transistor (TFT).

11. The MEMS pixel sensor of claim 1 further comprising:
    a substrate made from a material selected from a group consisting of glass, plastic, quartz, metal foil, thin-film, and dielectric materials; and,
    wherein the mechanical and electronic devices are formed on the substrate.

12. The MEMS pixel sensor of claim 11 further comprising:
    a display backplane, including electronic devices, formed on the substrate.

13. The MEMS pixel sensor of claim 12 further comprising:
    an integrated package hermetically sealing the display backplane from the proximate environment.

14. The MEMS pixel sensor of claim 1 wherein the mechanical device is a device selected from a group consisting of a microphone, fluidic sensor, acoustic speaker, radio frequency (RF) filter, RF antenna, accelerometer, gyroscope, chemical sensor, temperature sensor, humidity sensor, pressure sensor, light sensor, actuator, DNA sensor, biological sensor, and gyroscope.

15. An array of microelectromechanical system (MEMS) pixel sensors, the array comprising:
    a plurality of MEMS pixel sensors, each MEMS pixel sensor including:
        a mechanical device having a mechanical state responsive to a proximate environment;
        an electronic device for converting the mechanical state into electrical signals; and,
        a pixel interface to supply power to the electronic device and to transceive electrical signals;
        a memory having an interface connected to the electronic device for storing electrical signals, and connected to the pixel interface for supplying stored electrical signals; and,
    an array interface to supply power to the plurality of MEMS pixel sensors, to accept stored electrical signals from the plurality of MEMS pixel sensors, and to transceive electrical signals with the plurality of pixel interfaces.

16. The array of claim 15 wherein the array interface selectively supplies power to enabled MEMS pixel sensors and accepts electrical signals from the enabled MEMS pixel sensors.

17. The array of claim 15 wherein the mechanical device of a first MEMS pixel sensor has a first mechanical state at a first time, and the electronic device of the first MEMS pixel sensor supplies a first electrical signal, responsive to the first mechanical state, at the first time; and,
    wherein the array interface accepts the first electrical signal at the first time.

18. The array of claim 17 wherein the mechanical device of the first MEMS pixel sensor undergoes a sequence of mechanical states at a corresponding plurality of times, and the electronic device of the first MEMS pixel sensor supplies a sequence of electrical signals, responsive to the sequence of mechanical states, at the plurality of times; and wherein the array interface accepts the sequence of electrical signals at the plurality of times.

19. The array of claim 15 wherein each MEMS pixel sensor includes:

a plurality of mechanical devices, each mechanical device having a mechanical state responsive to the proximate environment;

a plurality of electronic devices corresponding to the plurality of mechanical devices, for converting each mechanical state into an electrical signal;

wherein each pixel interface supplies the plurality of electrical signals; and, wherein the array interface accepts a plurality of electrical signals from each pixel interface.

20. The array of claim 15 wherein each MEMS pixel sensor includes a plurality of mechanical devices, each having a unique mechanical state, responsive to a common proximate environment; and, wherein the array interface accepts a plurality of unique electrical signals from each pixel interface, in response to the common proximate environment.

21. The array of claim 15 further comprising:

a substrate made from a material selected from a group consisting of glass, plastic, quartz, metal foil, thin-film, and dielectric materials; and, wherein the array is formed on the substrate.

22. A display backplane with an integrated microelectromechanical system (MEMS) pixel sensor, the display backplane comprising:

a substrate;

electronic devices associated with a display backplane, fabricated on a first region of the substrate;

an integrated package hermetically sealing the electronic devices in the first region of the substrate from a proximate environment; and, a MEMS pixel sensor fabricated on a second region of the substrate, the MEMS pixel sensor including:

a mechanical device having a mechanical state responsive to the proximate environment;

an electronic device for transceiving between mechanical states and electrical signals; and, a pixel interface to supply power to the electronic device and to transceive electrical signals.

23. The display backplane of claim 22 wherein the MEMS pixel sensor mechanical device is a device selected from a group consisting of a microphone, fluidic sensor, acoustic speaker, radio frequency (RF) filter, RF antenna, accelerometer, gyroscope, chemical sensor, temperature sensor, humidity sensor, pressure sensor, light sensor, actuator, DNA sensor, biological sensor, and gyroscope.

24. A microelectromechanical system (MEMS) pixel sensor, the MEMS pixel sensor comprising:

a thin-film mechanical device, having a mechanical body with a mechanical state responsive to a proximate environment;

a thin-film electronic device for converting the mechanical state into electrical signals;

a pixel interface to supply power to the electronic device and to transceive electrical signals; and, a memory having an interface connected to the electronic device for storing electrical signals, and connected to the pixel interface for supplying stored electrical signals.

25. A microelectromechanical system (MEMS) pixel sensor, the MEMS pixel sensor comprising:

a substrate made from a material selected from a group consisting of glass, plastic, quartz, metal foil, thin-film, and dielectric materials;

a thin-film mechanical device formed on the substrate, having a mechanical body with a mechanical state responsive to a proximate environment;

a thin-film electronic device formed on the substrate, for converting the mechanical state into electrical signals;

a display backplane including electronic devices, formed on the substrate;

a pixel interface to supply power to the electronic device and to transceive electrical signals; and, an integrated package hermetically sealing the display backplane from the proximate environment.

* * * * *